(12) United States Patent
Faur et al.

(10) Patent No.: US 10,526,538 B2
(45) Date of Patent: **\*Jan. 7, 2020**

(54) METHODS, PROCESS AND FABRICATION TECHNOLOGY FOR HIGH-EFFICIENCY LOW-COST CRYSTALLINE SILICON SOLAR CELLS

(71) Applicants: Maria Faur, North Olmsted, OH (US); Horia M. Faur, Medina, OH (US)

(72) Inventors: Maria Faur, North Olmsted, OH (US); Horia M. Faur, Medina, OH (US); Mircea Faur, North Olmsted, OH (US)

(73) Assignee: SPECMAT, Inc., North Olmsted, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/549,261

(22) Filed: Nov. 20, 2014

(65) Prior Publication Data
US 2015/0162460 A1 Jun. 11, 2015

Related U.S. Application Data

(63) Continuation of application No. 13/823,214, filed as application No. PCT/US2011/028190 on Mar. 11, 2011, now Pat. No. 9,068,112.
(Continued)

(51) Int. Cl.
*C23F 1/16* (2006.01)
*C09K 13/08* (2006.01)
(Continued)

(52) U.S. Cl.
CPC ............... *C09K 13/08* (2013.01); *C23F 1/16* (2013.01); *H01L 31/02168* (2013.01);
(Continued)

(58) Field of Classification Search
None
See application file for complete search history.

(56) References Cited

U.S. PATENT DOCUMENTS

| 4,002,512 A | 1/1977 | Lim |
| 4,578,419 A | 3/1986 | Hall |
| (Continued) | | |

FOREIGN PATENT DOCUMENTS

| JP | 8-264640 A | 11/1996 |
| JP | 2001-110801 A | 4/2001 |

OTHER PUBLICATIONS

Chhabra, B. et al., Electrical and Chemical Characterization of Chemically Passivated Silicon Surfaces, Conference Program, 33rd IEEE Photovoltaic Specialists Conference, San Diego, California, May 11, 2008.
(Continued)

*Primary Examiner* — Shamim Ahmed
*Assistant Examiner* — Bradford M Gates
(74) *Attorney, Agent, or Firm* — Joseph J. Crimaldi

(57) ABSTRACT

Disclosed is a method, process, solar cell design, and fabrication technology fir high-efficiency, low-cost, crystalline silicon (Si) solar cells including but not restricted to solar grade single crystal Si (c-Si), multi-crystalline Si (mc-Si), poly-Si, and micro-Si solar cells and solar modules. The RTWCG solar cell fabrication technology creates a RTWCG SiOx thin film antireflection coating (ARC) with a graded index of refraction and a selective emitter (SE). The resulting top surface of the SiOx oxide can be textured (TO) concomitant with the growth process or through an additional mild wet chemical step.

17 Claims, 44 Drawing Sheets

Related U.S. Application Data

(60) Provisional application No. 61/383,435, filed on Sep. 16, 2010.

(51) Int. Cl.
  *H01L 31/0216* (2014.01)
  *H01L 31/0224* (2006.01)
  *H01L 31/0236* (2006.01)
  *H01L 31/068* (2012.01)
  *H01L 31/18* (2006.01)
  *H01L 31/056* (2014.01)

(52) U.S. Cl.
  CPC .............. *H01L 31/02363* (2013.01); *H01L 31/022425* (2013.01); *H01L 31/056* (2014.12); *H01L 31/068* (2013.01); *H01L 31/1804* (2013.01); *H01L 31/1868* (2013.01); *Y02E 10/52* (2013.01); *Y02E 10/547* (2013.01); *Y02P 70/521* (2015.11)

(56) References Cited

U.S. PATENT DOCUMENTS

| | | | |
|---|---|---|---|
| 5,242,525 | A | 9/1993 | Biagiotti |
| 5,409,569 | A | 4/1995 | Seki et al. |
| 5,601,656 | A | 2/1997 | Li |
| 5,714,074 | A | 2/1998 | Maeno et al. |
| 5,714,407 | A | 2/1998 | Maeno et al. |
| 5,726,077 | A | 3/1998 | Kawahata et al. |
| 6,080,683 | A | 6/2000 | Faur et al. |
| 6,593,077 | B2 | 7/2003 | Faur et al. |
| 6,613,697 | B1 | 9/2003 | Faur et al. |
| 6,679,996 | B1 | 1/2004 | Yao |
| 7,442,652 | B2 | 10/2008 | Aoki et al. |
| 7,642,198 | B2 | 1/2010 | Sato |
| 8,043,974 | B2 | 10/2011 | Park et al. |
| 8,318,606 | B2 | 11/2012 | Baiocchi et al. |
| 8,338,692 | B2 | 12/2012 | Imazaki et al. |
| 8,524,851 | B2 | 9/2013 | Kim et al. |
| 2002/0061563 | A1 | 5/2002 | Stephens |
| 2002/0125214 | A1 | 9/2002 | Mirkin et al. |
| 2003/0159362 | A1* | 8/2003 | Singh et al. ................... 51/293 |
| 2003/0172959 | A1* | 9/2003 | Martin .................... C11D 7/08 134/10 |
| 2003/0227663 | A1 | 12/2003 | Agrawal et al. |
| 2004/0000268 | A1 | 1/2004 | Wu et al. |
| 2004/0224866 | A1* | 11/2004 | Matsunaga .......... C11D 3/0073 510/175 |
| 2005/0148187 | A1* | 7/2005 | Wang ...................... C09G 1/02 438/693 |
| 2006/0121695 | A1 | 6/2006 | Ueda et al. |
| 2006/0213868 | A1 | 9/2006 | Siddiqui et al. |
| 2007/0054495 | A1* | 3/2007 | Compton ................ C09G 1/02 438/693 |
| 2007/0163618 | A1 | 7/2007 | Kim et al. |
| 2007/0218668 | A1 | 9/2007 | Wagener |
| 2008/0271780 | A1 | 11/2008 | Narayanan et al. |
| 2010/0112728 | A1 | 5/2010 | Korzenski et al. |
| 2011/0156045 | A1* | 6/2011 | Higashi ................... C01B 33/02 257/66 |
| 2013/0186464 | A1 | 7/2013 | Sheng et al. |
| 2013/0206229 | A1 | 8/2013 | Watabe et al. |
| 2013/0247971 | A1 | 9/2013 | Haas et al. |
| 2014/0264155 | A1* | 9/2014 | Van Duren ....... H01L 21/30604 252/79.3 |
| 2015/0147886 | A1* | 5/2015 | Tung ....................... C23G 1/02 438/696 |

OTHER PUBLICATIONS

Dhar, S. et al., Etching Solutions for the Determination of the Crystallographic Axes of ZnGeP.sub.2, Journal of Crystal Growth 43, 1978, pp. 120-122.

International Search Report and Written Opinion from International Application No. PCT/US11/28190, dated Jul. 5, 2011.

Laades, A. et al., Wet-Chemical Treatment of Solar Grade CZ Silicon Prior to Surface Passivation, 24th European Photovoltaic Solar Energy Conference paper, Sep. 21-25, 2009, pp. 1640-1644.

Li, L. et al., Surface passivation and microroughness of (100) silicon etched in aqueous hydrogen halide (HF, HCl, HBr, HI) solutions, J. Appl. Phys. 77(3), Feb. 1, 1995, pp. 1323-1325.

Mo, R. et al., Atomic-Scale Mechanistic Study of Iodine/Alcohol Passivated Si(100), presented at 196th Meeting of the Electrochemical Society, Oct. 17, 1999-Oct. 22, 1999, 8 pages.

M'Saad, H. et al., Electronic Passivation of Silicon Surfaces by Halogens, Journal of Electronic Materials, vol. 23, No. 5, 1994, pp. 487-491.

Queisser, H.J., Slip Patterns on Boron-Doped Silicon Surfaces, Journal of Applied Physics, vol. 32, No. 9, Sep. 1961, pp. 1776-1780.

Raider, S.I. et al., Oxide Growth on Etched Silicon in air at Room Temperature, J. Electrochem. Soc. 1975, 122(3), http://jes.ecsdl.org/content/122/3/413.full.pdf, pp. 413-418.

Sopori, B. et al., Light-Induced Passivation of Si by Iodine Ethanol Solution, Conference Paper Feb. 2009, presented at the Materials Research Society (MRS) Fall Meeting 2008, Dec. 1-5, 2008, pp. 1-8.

Trupke, T. et al., Progress with Luminescence Imaging for the Characterization of Silicon Wafers and Solar Cells, 22nd European Photovoltaic Solar Energy Conference, Sep. 3-7, 2007, pp. 22-31.

Voloshina, T.V. et al., Influence of Iodine-Containing Solutions on the Condition of a Porous Silicon Surface and its Photoluminescent Properties, Journal of Applied Spectroscopy, vol. 71, No. 1, 2004, pp. 89-93.

V.P. Ulin et al., "Electrochemical Pore Formation Mechanism in III-V Crystals (Part I)," Semiconductors, vol. 41, No. 7, pp. 832 to 844, Jul. 1, 2007.

Klugmann-Radziemska et al., "Chemical Treatment of Crystalline Silicon Solar Cells as a Method of Recovering Pure Silicon from Photovoltaic Modules," Renewable Energy, vol. 35, No. 8, pp. 1751 to 1759, Aug. 2010.

Korean Office Action dated Mar. 15, 2017 for South Korean Application No. 10-2013-7009497.

European Search Report dated May 31, 2017 for EP Application No. 11825579.3.

\* cited by examiner

Source: Figure 1, US patent 6,613,697 B1

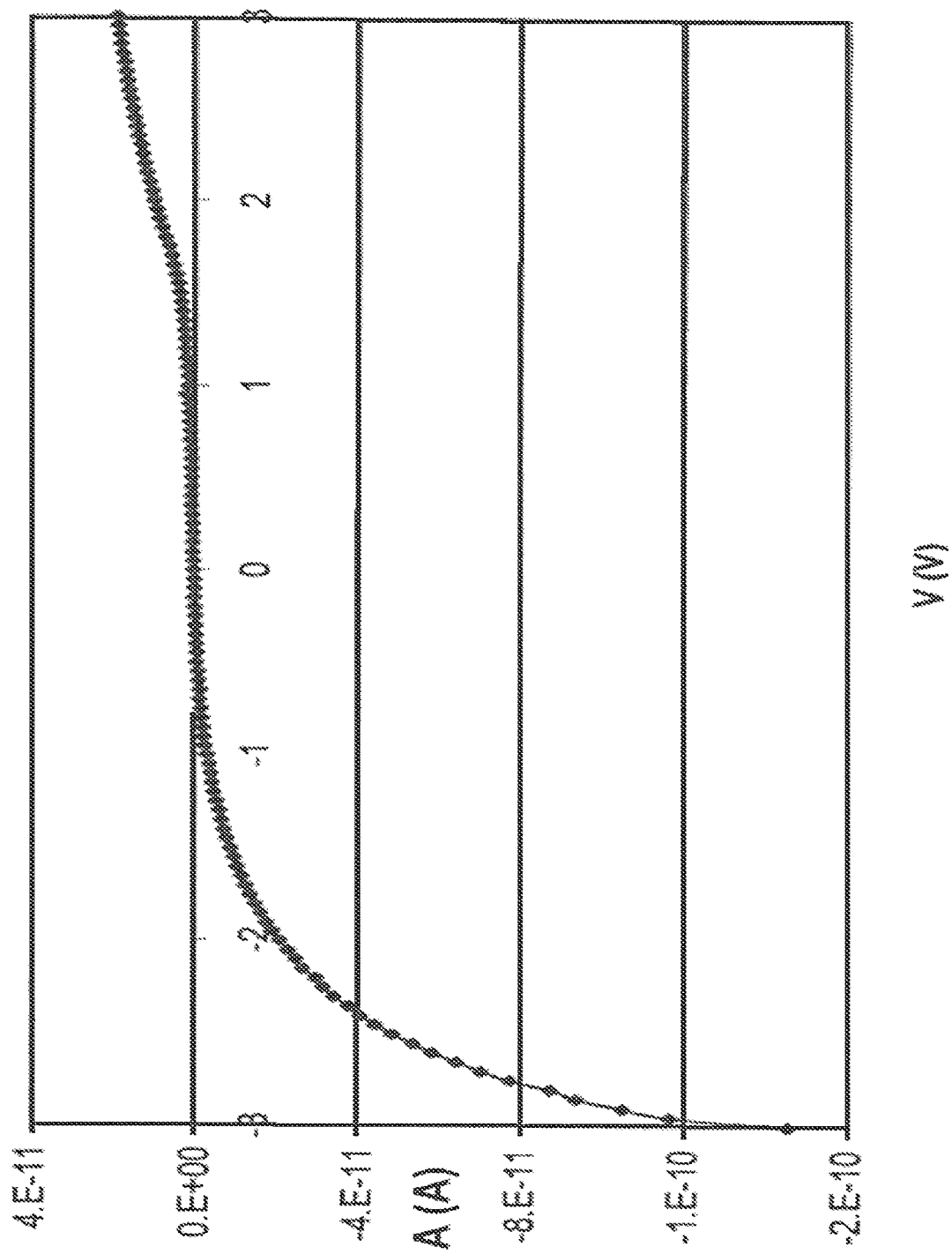
FIGURE 29(a)(ii)

METHODS, PROCESS AND FABRICATION TECHNOLOGY FOR HIGH-EFFICIENCY LOW-COST CRYSTALLINE SILICON SOLAR CELLS

RELATED APPLICATIONS

This patent application claims priority and is a continuation of U.S. patent application Ser. No. 13/823,214 filed Nov. 11, 2013 (which issued on Jun. 30, 2015 as U.S. Pat. No. 9,068,112), which is a national phase application of and claims priority to PCT/US/028190 filed Mar. 3, 2011, which claim priority to U.S. Provisional Patent Application No. 61/383,435 filed Sep. 16, 2010 and entitled "Method, Process And Fabrication Technology For High-Efficiency Low-Cost Crystalline Silicon Solar Cells." The complete texts of these patent applications are hereby incorporated by reference as though fully set forth herein in their entireties.

INCORPORATION BY REFERENCE

All patents, patent applications and publications cited herein are hereby incorporated by reference in their entirety in order to more fully describe the state of the art as known to those skilled therein as of the date of the invention described herein.

RELATED FIELD

This invention relates to a Room Temperature Wet Chemical Growth (RTWCG) method and process of SiOx thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce graded index of refraction SiOx thin film oxide layers for use as low reflectance single layer antireflection coatings (SLARC) and selective emitters (SE).

BACKGROUND

Silicon dioxide ($SiO_2$) forms the basis of the planar technology. In industrial practice the dielectric coatings for electronic and photonic devices are most frequently formed by thermal oxidation of silicon (Si) in dry or wet oxygen ambient at temperatures ranging from 900° C. to 1200° C. $SiO_2$ is also deposited by chemical vapor deposition (CVD) techniques at lower temperatures (200-900° C.) on various substrates.

Thermal and CVD-grown $SiO_2$ based layers are used as diffusion masks, to passivate device junctions, as electric insulation, as dielectric material in Si technology, and as capping layers for implantation-activation annealing in III-V compound semiconductor technology. For high efficiency crystalline silicon solar cell applications, thin film $SiO_2$ layers are used for front and back surface passivation and as the first layer antireflection coating (ARC) in a multi layer ARC structure.

The growth of dielectric films at low temperatures is very attractive for most device applications due to reduced capital cost, high output, as well as the technological constraints associated with the growth of dielectric thin films using conventional high-temperature growth/deposition techniques. Thin dielectric film near room-temperature growth/deposition techniques are known in the art and are chiefly used for microelectronic/photonic (optoelectronic) device applications. An example of these low temperature methods are the physical vapor deposition processes which include: nonreactive (conventional) or reactive resistive, induction or electron beam evaporation, reactive or nonreactive de or RF magnetron and ion-beam sputtering processes.

The room temperature growth of dielectric layers on semiconductor surfaces using anodic oxidation is well known. It can grow $SiO_2$ layers on Si substrates that are up to 200 nm thick, consuming a portion of the underlying silicon layer in the process. Unfortunately, anodic oxidation is not compatible with metallization schemes, limiting its application as a replacement of thermal grown or CVD deposited $SiO_2$.

The use of organo-metallic solutions to deposit $SiO_2$ dielectric layers is known in the art. The dielectric layer is applied either by dipping the substrate into the organo-metallic solution, by spraying the organo-metallic solution on the substrate, or by spinning the substrate after a small amount of the organo-metallic solution is applied to it. After the organo-metallic solution is applied, it is necessary to drive off the solvent part of the solution by heating the substrate to ~400° C.

A large number of patents, patent applications, and published papers describe near room temperature related processes for the deposition of $SiO_2$ and $SiO_{2-x}F_x$ layers on various substrates, including silicon surfaces. The so called liquid-phase deposited (LPD) $SiO_2$ technique was initially developed in 1950 for depositing $SiO_2$ on the surface of soda lime silicate glass. LPD is based on the chemical reaction of $H_2SiF_6$ with water to form hydrofluoric acid and solid $SiO_2$. The $H_2SiF_6$ solution is initially saturated with $SiO_2$ powder (usually in a sol-gel from). Before immersing the glass into the solution a reagent that reacts with the hydrofluorosilicilic acid, such as boric acid, may be added to the solution to supersaturate with silica. The LPD process is a competition between the deposition and etching of $SiO_2$. Regardless of the small variations in formulations, the overall reversible chemical reaction is: $H_2SiF_6 + 2 H_2O \leftrightarrow 6 HF + SiO_2$ One of the major disadvantages of the $SiO_2$ LPD method described above is a very low deposition rate. Using hydrofluorosilicilic acid, $SiO_{2-x}F_x$ (x is ~2%), deposition rates of 110 nm/hr have been reported. These deposition rates are far too low for practical ARC applications; it would require more than one hour to deposit a nearly optimal ARC thickness of 130 nm for solar cell applications.

High Growth Rate RTWCG SiOX Thin Film Dielectrics

U.S. Pat. No. 6,080,683, entitled "Room Temperature Wet Chemical Growth Process of SiO Based Oxides on Silicon" and U.S. Pat. No. 6,593,077 entitled "Method of Making Thin Films Dielectrics Using a Process for Room Temperature Wet Chemical Growth of SiO Based Oxides on a Substrate", describe a RTWCG SiOx method and process on a semiconductor substrate comprising:

i. providing a reaction mixture comprising of a silicon source, a pyridine compound, and an aqueous reduction oxidation solution;

ii. a catalyst to enhance the reaction;

iii. reacting the mixture with the substrate to form said silicon oxide layer.

High growth rate RTWCG SiOX thin films, as revealed in U.S. Pat. Nos. 6,080,683 and 6,593,077 were grown using the RTWCG process on silicon and other semiconductor substrates using commercial-grade 34% $H_2SiF_6$. High growth-rate growth of SiOX oxide on silicon substrates was achieved by using commercial grade organic and inorganic silicon sources, a pyridine compound (i.e. N-(n-Butyl) pyridinium chloride), redox aqueous solutions based on $Fe^{2+}/$ Fe³, an organic or inorganic homogeneous co-catalyst, and non-invasive additives including NaF, KOH, NH₄F, and $HF_{(aq)}$ In U.S. Pat. No. 6,613,697, the organic components of the growth solution were substituted with inorganic components. The RTWCG SiOX thin film layers grew on various semiconductor substrates at a higher growth rate and with lower metallic and non-metallic impurity concentration. Also, there was an improvement in the dielectric properties of the resulting thin films when compared to the RTWCG SiOX thin films grown in solutions with organic components.

By using the above growth solution formulations, the RTWCG SiOX growth rate on Si surfaces ranges from 1 nm/min to over 100 nm/min, depending on the composition of the growth solution.

Antireflection Coatings Prior Art

Antireflection coatings (ARC) are included in a solar cell design to substantially reduce the amount of reflected light. Bare Si loses 42% of light with long wavelengths of 1.1 µm, 37% of light with wavelengths of 1 µm, and about 54% of light with short wavelengths of 0.4 µm. A textured front surface, such as regularly spaced pyramids or porous silicon (PS), can lower the AM 1.5 average weighted reflection to 12-18% over the 0.4 µm-1.2 µm wavelength range.

The optimal thickness of an antireflection coating is calculated by the following formula:

$$d_1 = \frac{\lambda_0}{4n_1}$$

For a quarter wavelength ARC made of a transparent material having a refractive index $n_1$, and a light incident on the coating with a free-space wavelength $\lambda_0$, the thickness which causes minimum reflection is $d_1$. Because the index of refraction is wavelength-dependent, near zero reflection can only occur for a single wavelength. The refractive index and thickness of an ARC must minimize the reflection of light with wavelengths of 0.6 µm since this wavelength is close to the peak power of the solar spectrum. While the equations for multiple antireflection coatings are more complicated than that for a single layer, by properly adjusting the refractive index and thickness of two layers it is theoretically possible to produce two minima and an overall reflectance as low as 3%.

A proper SLAR on smooth surfaces (e.g. $MgF_2$, $SiO_2$, SiO, $SiN_x$, $TiO_2$ and $Ta_2O_5$) can reduce the AM 1.5 average weighted reflection (AWR) to 12-16% over the 0.4-1.1 µm wavelength range. For an optimized CVD-deposited SiNx ARC, which is becoming the norm for silicon solar cell ARC applications, the AM 1.5 AWR is ~12% with a simulated minimum AWR of 10.4% as calculated by Wright et al on flat c-Si having an assumed film index of refraction, n, of 1.95, and thickness, d, of 81 nm.

Whether or not the simulated minimum SiNx SLAR AWR is achievable in a production environment remains to be seen. But even if the simulated reflectance is achieved, the reflective losses are still too high at 10.4% reflectivity. The industry still needs a practical low-cost way of further lowering the reflectance through a double layer ARC, a textured silicon solar cell surface, or both. However, this approach becomes cost prohibitive for most commercial solar cell applications.

For textured surfaces with well designed single or double layer ARCs such as $ITO/SiO_2$, $ZnS/MgF_2$, $TiO_2/MgF_2$, and $TiO_2/Al_2O_3$, the AM 1.5 AWR has been brought down to between 3% and 8%. A large number of studies on double layer ARCs have been reported. The most stable configuration with respect to variations in film thicknesses have been found to be designs with a high refractive index (n) on the substrate and a low refractive index towards the ambient.

Depositing uniform ARCs on textured surfaces is problematic. The nanometer-sized features of a polysilicon structure make it difficult to deposit or grow uniform ARC through conventional techniques. Certain cell manufacturers do not use an ARC due to this issue; the penalty they pay is up to a 10% relative loss in efficiency along with surface stability problems.

Selective Emitter Prior Art

Currently, screen-printed silicon solar cells utilize n+/p emitters that are diffused to have sheet resistances in the 40-60 Ω/sq range, and surface doping concentrations that are greater than $2 \times 10^{20}$ cm⁻³. A high surface doping and low sheet resistance is necessary to achieve an acceptable contact resistance of around 1 µΩ-cm² as well as low junction shunting and recombination in the space charge region. However, emitters of this type have low open-circuit voltages (high surface recombination for emitters with high surface doping and Auger recombination) as well as poor short-circuit currents due to a poor blue response (high-emitter recombination and free-carrier absorption). Good screen-printed contacts with a contact resistance of ~1.0× 10⁻⁴ Ω-cm², emitters with a sheet resistance greater than 100 Ω/sq, and surface doping at around $10^{19}$ cm⁻³ are the main tasks in developing high efficiency industrial solar cells.

To reduce manufacturing costs, industrial techniques used for front-contact fabrication require a deep and highly doped junction for acceptably low contact resistance and to avoid metallic impurity penetration toward the junction, space charge, and bulk emitter regions. The typical emitter sheet resistance used in a conventional screen printing metallization process is 50-80 Ω/sq. Small-scale manufacturing employs $POCl_3$ or solid $P_2O_5$ dopant sources and open tube furnaces to carry out the diffusions. Large scale manufacturing employs screen printing, spray-on, or spin-on of various phosphorus-containing paste and liquid-dopant sources followed by conveyor belt furnace diffusion.

The emitter sheet resistance of cells that do not possess a good quality selective emitter is between 50-80 Ω/sq and their fill factor (FF) is usually less than 76%. The lower FF of cells with higher emitter sheet resistance is due to a high contact resistance, a high lateral emitter resistance, and the associated low metal conductivity of screen-printed contacts. In order to gain the full performance benefit from improved emitter surface passivation, it is necessary to design the emitter doping profile so that it is lightly doped between gridlines, yet heavily doped underneath them. This is especially true for conventional industrial solar cells with screen-printed gridlines which require a heavily doped substrate beneath them for acceptably low contact resistance.

Cells with a selective emitter have a larger short circuit current (Isc) since the dead layer is removed from the active emitter surfaces. Also beneficial is the passivation of the emitter's surface, so that the bulk dark current ($J_{ob}$) is the controlling limiting factor of the open circuit voltage ($V_{oc}$). Improved conductivity under the grid lines lowers the series resistance while the shunt resistance increases due to the extra margin of protection that the deeper junction in the grid area offers against the partial "punch-thru" of the grid metal. Since the silicon underneath the grid lines is more highly conductive, narrower lines can be utilized which can be spread further apart, resulting in a smaller grid shadow area.

In the case of screen-printing, a selective emitter is difficult to achieve especially through a one-step process. There has been a delay-in-implementation of the very important SE efficiency enhancement feature because this selectively-patterned emitter doping profile has historically been obtained using expensive photolithographic or advanced screen-printed alignment techniques along with multiple high-temperature diffusion steps Conventional SE techniques can be divided into three main categories:
  (a) selective emitter cells fabricated via masking and etching with no alignment;
  (b) selective emitter cells fabricated by self-alignment without the need for masking or etching;
  (c) selective emitter cells fabricated by self-aligned self-doping Ag pastes.

Techniques (a) and (b) are generally time consuming and somewhat expensive. Technique (c) is not trivial because the diffusivity of Ag in Si is higher than that of P, which can lead to a high junction leakage current and high junction ideality factor.

High Efficiency Crystalline Silicon Solar Cells

A low-cost and highly-efficient solar cell is the key to large-scale acceptability of photovoltaic (PV) systems. Redesigned small area solar cells with new materials and process step technologies, have produced many laboratory cell schemes resulting in cell efficiencies of over 20%. Two small area laboratory scale approaches, initially used by niche markets such as solar cars, are the passivated emitter with rear locally diffused (PERL) cell, and the interdigitated back contact (IBC) cell. Although these and other laboratory cell designs have been pushing up the efficiency of c-Si solar cells, to date, none of these cell designs use, low-cost, solar-grade silicon substrates, and only few of them use low-cost fabrication technology process steps such as screen printing metallization.

The development of high efficiency silicon solar cells not only targets efficiency increases but also cost savings. Of importance to cost savings is the number and complexity of process steps, material consumption, and energy consumption needed to produce a unit of installed peak power. Other important considerations in choosing the winning technologies include environment aspects as well as standards and manufacturing engineering such as process automation and control.

SUMMARY OF THE INVENTION

A Room Temperature Wet Chemical Growth (RTWCG) SiOx method, and process is described for fabricating high-efficiency, low-cost, crystalline silicon solar cells and solar modules using the low-cost RTWCG for preparation of SiOx layers having antireflection coatings ("ARC"), selective emitters ("SE") and option textured oxide ("TO") surfaces, herein after referred to as an RTCWG SiOx/ARC/SE/(TO) based process, design, and technology.

The term RTWCG process of SiOX or SiOx dielectric layers, as used herein, means a room temperature (e.g. 10-40° C.) wet chemical growth process of $Si_xO_yX_z$ layers where x is from 0.9 to 1.1, y is from 0.9 to 1.1, and z is from 0.01 to 0.2. Si stands for silicon, O stands for oxygen, and X is either fluorine (F), carbon (C), nitrogen (N) or a combination of these with other metals, e.g., iron (Fe), palladium (Pd), Titanium (Ti), or other trace-level metallic and non-metallic contaminants depending on the redox system, catalyst, and non-invasive additives used.

The new RTWCG SiOx growth formulations described herein can: (i) in-situ chemically clean the cell surfaces, including the metalized surfaces making them interconnect ready, (ii) produce a graded index of refraction SiOX ARC that passivates the emitter surface and has the lowest AM 1.5 average weighted reflectance of any known single layer ARC (SLARC), (iii) concomitantly create a very effective selective emitter (SE) by selectively etching back the non-metalized portions of the emitter's surface. The RTWCG SiOx ARC/SE/TO process and solar cell fabrication technology is compatible with existing solar cell and solar module process steps such as solar cell efficiency enhancing diffusion and improved metallization techniques.

The RTWCG method and process provides a simple n+/p or p+/n RTWCG SiOx ARC/SE solar cell design or a n+/p or p+/n RTWCG SiOx ARC/SE/TO solar cell structure design, or a n+/p/p+ or p+/n/n+ RTWCG SiOx ARC/SE/TO efficiency enhanced solar cell structure design.

It is an object according to one or more embodiments to provide a RTWCG method for the fast growth of SiOx thin film dielectric layers with low metallic, and non-metallic, impurity concentration on silicon substrates for high efficiency, low-cost crystalline silicon solar cell applications.

It is a further object according to one or more embodiments to provide a RTWCG SiOx process that uses SiOx growth solutions comprising of all inorganic components with or without the use of a silicon source.

It is a further object according to one or more embodiments to provide a RTWCG SiOx process that uses SiOx growth solutions based on components that are plentiful, low-cost, and compatible with environmental regulations.

It is a further object according to one or more embodiments to provide a RTWCG SiOx process that uses SiOx growth solutions that have a long shelf life.

It is a further object according to one or more embodiments to provide a high growth rate RTWCG SiOx process, with good SiOx thin film uniformity, low stress, good adhesion to silicon surfaces, and good conformity.

It is a further object according to one or more embodiments to provide a RTWCG SiOx process that produces SiOx thin films that are stable after long term exposure to humidity, temperature variation, UV light, visible light, and high intensity plasma.

It is a further object according to one or more embodiments to provide a RTWCG process where the SiOx growth solution provides in-situ cleaning of the bare (no ARC) solar cell's surfaces, including the metalized surfaces, prior to the RTWCG SiOx thin film growth on the non-metalized surfaces.

It is a further object according to one or more embodiments to provide a RTWCG SiOx process where the SiOx growth solution is compatible with screen printed front and back metallization of bare silicon solar cells.

It is a further object according to one or more embodiments to provide a RTWCG SiOx process which grows the SiOx thin film dielectric strictly on the non-metalized solar cell surfaces, and not on the metalized surfaces, making the cells interconnect ready.

It is a further object according to one or more embodiments to provide a RTWCG SiOx thin film growth process that produces a graded index of refraction on the Si cell emitter surface, for use as an antireflection coating (ARC) with low air mass 1.5 (AM 1.5) average weighted reflectance (AWR) and low visible light absorption.

It is a further object according to one or more embodiments to provide a RTWCG SiOx process whereas the SiOx thin film passivates the Si solar cell surfaces not covered by metallization.

It is a further object according to one or more embodiments to provide a RTWCG SiOx process where the SiOx thin film passivates the screen printed front silver-based grid lines and the aluminum back contact.

It is a further object according to one or more embodiments to provide a RTWCG SiOx process where the thin film SiOx grows simultaneously with the formation of a so called selective emitter (SE) efficiency enhancement feature, by etching back the emitter's non-metalized surface deeply enough to completely remove the heavily doped dead layer.

It is a further object according to one or more embodiments to provide a RTWCG SiOx process where the surface of the SiOx thin film grown on smooth silicon surfaces is textured, forming a so called textured oxide (TO) efficiency enhancement feature.

It is a further object according to one or more embodiments to provide all the above requirements and efficiency enhancement cell design features within a single short RTWCG SiOx process step, and to form a simple yet highly efficacious n+/p or p+/n RTWCG SiOx ARC/SE/(TO) solar cell structure, and n+/p/p+ and p+/n/n+ SiOx ARC/SE/TO efficiency enhanced cell structure for high-efficiency, low-cost, crystalline silicon solar cells using solar grade c-Si, mc-Si, and poly-Si substrates.

It is a further object according to one or more embodiments to provide the possibility of including the efficiency enhancement feature of the so-called kink-and-tail net majority carrier concentration diffusion profile in the emitter with a shallow kink, and an abrupt tail into the n+/p or p+/n RTWCG SiOx ARC/SE/(TO) and the n+/p/p+ and p+/n/n+ SiOx ARC/SE/TO solar cell structure design.

It is a further object according to one or more embodiments to provide a RTWCG SiOx/ARC/SE/TO process, cell design, and technology for high efficiency n+/p/p+ and p+/n/n+ crystalline silicon solar cell structures whereas the n+ and p+ diffusions are carried out in a single high diffusion process step using either a diluted liquid or a solid diffusion source that is either screen printed or spun-on the substrate.

It is a further object according to one or more embodiments to provide a RTWCG SiOx process for high efficiency n+/p/p+ and p+/n/n+ crystalline silicon solar cell structures where the n+ and p+ diffusions are carried out in a single high temperature diffusion process step that eliminates the need for a separate edge isolation process step.

It is a further object according to one or more embodiments to provide a n+/p-Si RTWCG SiOx ARC/SE/TO solar cell structure design, method, process, and technology utilized on any flat surface crystalline silicon emitter, and n+/p-Si RTWCG SiOX ARC/SE solar cell structure design, method, process, and fabrication technology utilized on any smooth or textured emitter surface, and which are compatible with all crystalline Si materials including, but not limited to, semiconductor grade and solar grade Czochralski (Cz) or float zone (FZ) single crystal Si (c-Si), multi-crystalline Si (mc-Si), poly-Si, and string ribbon Si.

It is a further object according to one or more embodiments to provide a n+/p-Si RTWCG SiOX ARC/SE/TO solar cell structure and technology that works equally well with p+/n-Si RTWCG SiOX ARC/SE/TO solar cell structure.

It is a further object according to one or more embodiments to provide a method for creating enhanced efficiency n+/p, or p+/n RTWCG SiOX ARC/SE/(TO) cell structures by utilizing RTWCG formulations that are able to remove the diffused layer while creating rear side passivation and edge isolation.

It is a further object according to one or more embodiments to provide a simple and low cost RTWCG SiOx based crystalline silicon solar cell technology, that produce enhanced efficiency n+/p-Si, or p+/n RTWCG SiOX ARC/SE/(TO) cell structures, by using the RTWCG process to remove the diffused layer from, and passivate the solar cell back surface, while at the same time producing a good edge isolation.

It is a further object according to one or more embodiments to provide a RTWCG SiOX method, and n+/p-Si RTWCG SiOX ARC/SE/TO and p+/n-Si RTWCG SiOX ARC/SE/TO process and technology that can be used in connection with other crystalline silicon solar cell designs ranging from conventional mono-facial planar crystalline silicon designs to other less conventional Si solar cells cell structures including but not limited to the Vertical Multi-Junction (VMJ), spherical cells, and bifacial n+pp+ or p+nn+ crystalline silicon solar cell structures.

It is a further object according to one or more embodiments to include the n+/p-Si or p+/n-Si RTWCG SiOX ARC/SE for cells with either flat or textured emitter surface, and n+/p-Si or p+/n-Si and n+pp+ or p+nn+ RTWCG SiOX ARC/SE/TO for cells with flat surfaces, the state of the art materials and efficiency-enhancing solar cell process steps, including but not restricted to new technological solutions for advanced diffusion techniques that provide low front and back surface recombination and assure strong front and back surface fields, better screen printing pastes, and metallization procedures for narrower, higher aspect ratio, more conductive, and a lower contact resistance with a lower annealing temperature than present state of the art metallization.

It is a further object according to one or more embodiments to provide a method, and process for growing on various substrates RTWCG SiOM, where M is a compatible metal, to form good quality so called transparent conductive coatings (TCO) for thin film solar cells and various other potential applications.

It is a further object according to one or more embodiments to provide a process, design, and technology for fabricating high efficiency, low-cost, amorphous silicon solar cells that incorporate the RTWCG SiOM TCO feature.

It is a further object according to one or more embodiments to provide planar silicon-based electronic and photonic (optoelectronic) device applications that can benefit from the n+/p-Si or p+/n-Si RTWCG SiOx ARC/SE(/TO) method, process, and technology from the incorporation of low to medium-high dielectric constant RTWCG SiOx thin film dielectrics, or of high transparency, adequate resistivity, and relatively low reflectance RTWCG SiOM TCO's.

BRIEF DESCRIPTION OF THE DRAWINGS

The foregoing and other objects, features and advantages of the invention will be apparent from the following more particular description of preferred embodiments of the invention, as illustrated in the accompanying drawings.

FIG. 32(a) −100 V to +100 V; FIG. 32(b) +100 V to −100 V.

DETAILED DESCRIPTION OF THE INVENTION

Disclosed is a RTWCG SiOx method and process, a RTWCG SiOx ARC/SE/TO crystalline silicon solar cell design, and fabrication technology for high-efficiency, low-cost, crystalline silicon (Si) solar cells including but not restricted to single crystal Si (c-Si), multi-crystalline Si (mc-Si), micro-crystalline Si (μc-Si), and poly-Si solar cells and solar modules. The RTWCG SiOx method and process makes use of modified versions of previously disclosed Room Temperature Wet Chemical Growth (RTWCG) methods and processes (see U.S. Pat. Nos. 6,080,683 and 6,593,077 and 6,613,697), which are hereby incorporated by reference. The technology provides a catalytic process for the uniform growth of oxide layers over 10,000 Å thick at room temperature, e.g., 10-40° C. The composition can be used to prepare SiOx layers in processes and in applications that were heretofore limited by cost and temperature requirements.

The RTWCG SiOx ARC/SE/TO solar cell design and technology lowers the cost of fabrication by utilizing low cost screen printed metallization schemes, by reducing the number of high temperature fabrication steps, and by reducing the total number of fabrication steps. While lowering the fabrication cost, the technology increases the cell conversion efficiency by using a cell design structure that includes efficiency enhancement features such as the graded index of refraction RTWCG SiOx ARC. Concomitant to the ARC formation, the technology produces an excellent quality SE and RTWCG SiOx texturing. Texturing of the RTWCG SiOx improves ARC's already low reflectance by further increasing light trapping.

Figure 1:
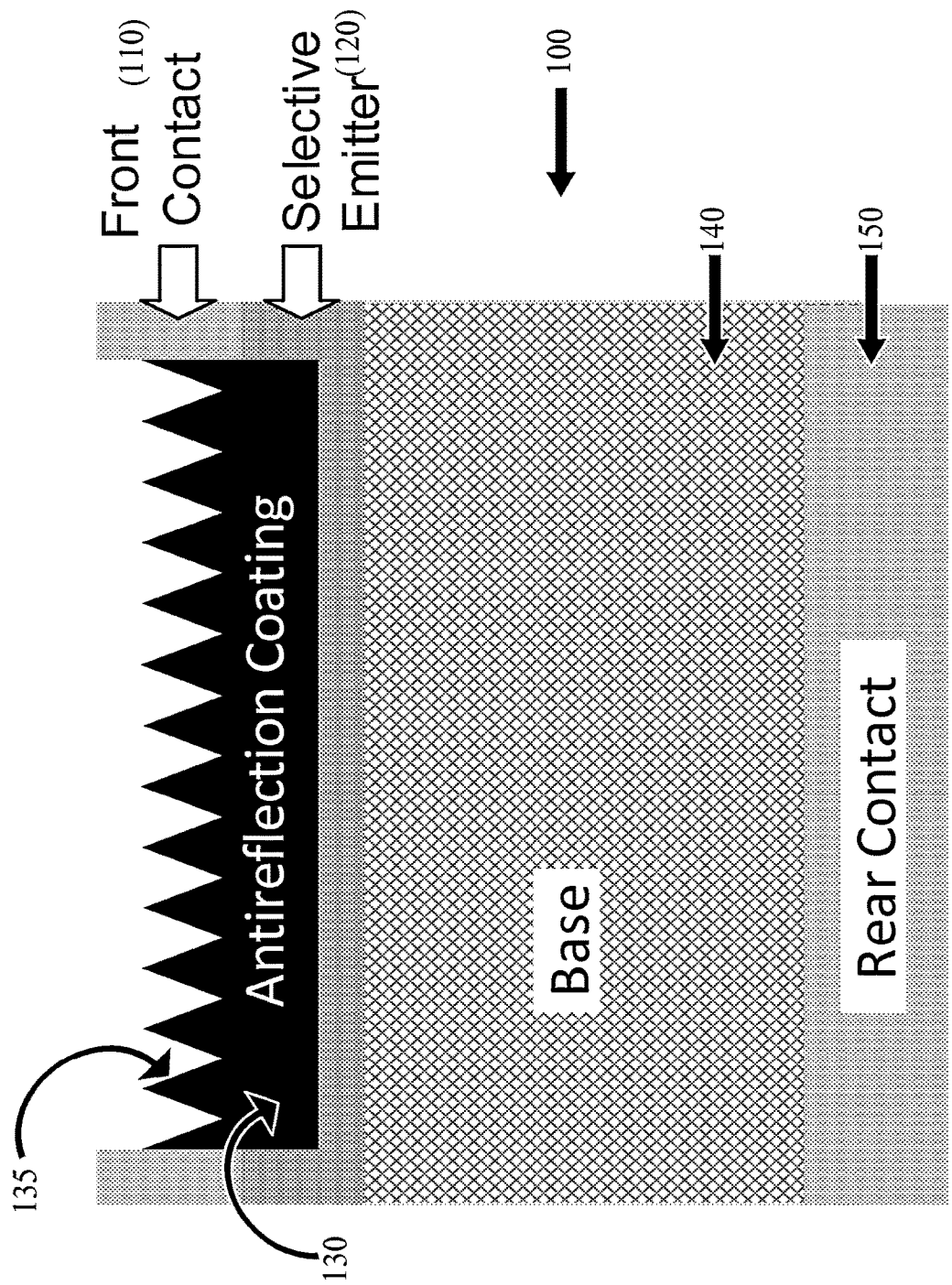
FIG. 1. A cross-sectional view of the RTWCG SiOx ARC/SE/TO crystalline silicon solar cell design developed by Specmat, INC.

FIG. 1 shows a cross sectional view of a high-efficiency, low-cost RTWCG SiOx ARC/SE/TO crystalline solar cell 100 according to one or more embodiments. The method and process described herein refers to a new crystalline solar RTWCG SiOx ARC/SE/TO cell design that contains: (i) a SiOx thin film dielectric that passivates well the cell surfaces and is an excellent ARC, (ii) a good quality SE, and (iii) either a flat or textured SiOx (TO) surface. The wafer or substrate 140 is a semiconductor material, typically silicon. A selective emitter layer 120 is disposed on the base 140. The selective emitter provides low contact resistance due to heavy doping under the front contact 110 and provide front-side passivation of the more lightly doped region between contacts. The device also includes an ARC coating 130 disposed over the lightly doped region (deep emitter) regions of the selective emitter. A rear contact 150 is located on the back face of the cell.

Optionally, the cell can include a textured oxide surface 135. The textured feature can be applied to cells with a starting flat front surface. It can be produced through an additional short mild wet chemical step, or by using high growth rate RTWCG SiOx solution formulation that creates the texturing concurrent with the ARC and SE formation.

The RTWCG SiOx ARC/SE/TO cell design (FIG. 1) has very low reflectance, a good quality selective emitter, and the back surface passivation offered by the more complex PERL technology. In one or more embodiments, the ARC, SE, and TO enhancement features are created in one single step.

The smooth emitter of the RTWCG SiOx ARC/SE/TO cell design minimizes the resistive loses from the lateral flow of current toward the grid fingers. This is in contrast to other high efficiency cell designs, such as the PERL cell, which utilize a textured emitter surface. For these other cell designs, the resistive loss can be a limiting factor that leads to a lower fill factor (FF).

Compared to low to medium efficiency silicon cell designs, the RTWCG SiOx ARC/SE/TO's cell design, which incorporates a smooth emitter surface and textured SiOx ARC, wins out in cell efficiency. This is due to a significant decrease in the emitter sheet resistivity loss, lower contact resistance, higher shunt resistance, and a lower diode ideality factor. Furthermore, compared to most conventional n+/p crystalline silicon solar cells, that either do not include in their designs a SE, or include a poorly functional SE, the highly reproducible very good quality SE of the RTWCG SiOx ARC/SE/TO cell design assures a good blue response. The strong front and back surface fields, and the good edge isolation produced by the RTWCG SiOx ARC/SE/TO cell design further increase the spectral response over the entire AM 1.5 spectra, and reduce electrical losses, respectively.

Figure 2:
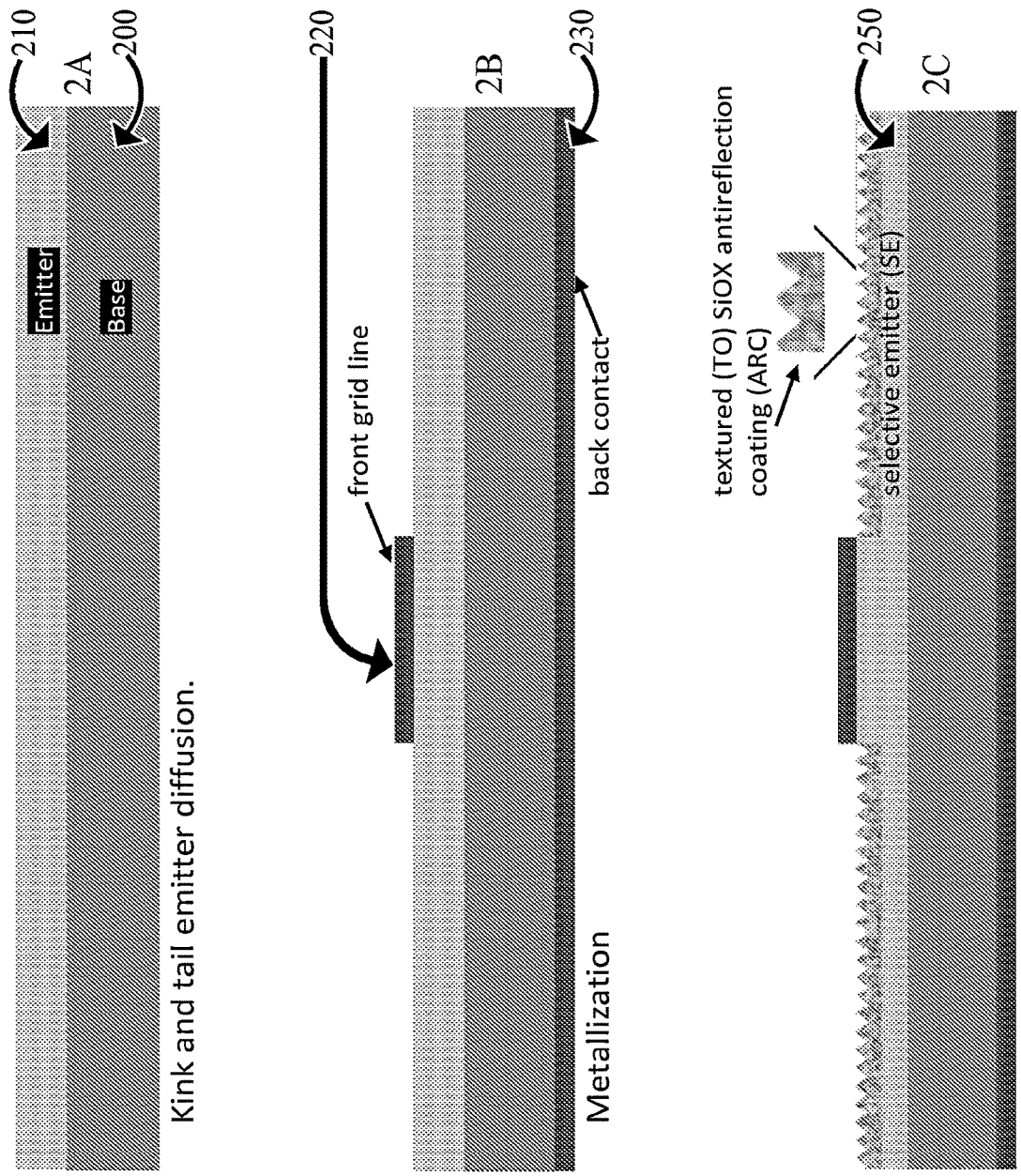
FIG. 2. Depiction of the RTWCG SiOx ARC/SE/TO fabrication steps.

FIG. 2 depicts the low-cost, high efficiency, RTWCG SiOx ARC/SE/TO new solar cell fabrication technology according to one or more embodiments. Depending on the RTWCG solution strength, in 20 seconds to 1 minute, the new RTWCG SiOx process is formulated to concomitantly create the following enhancement features on solar cells with front and back metallization:

i. in-situ chemical cleaning of cell surfaces including the metalized surfaces, making them interconnect ready;
ii. a graded index of refraction SiOx ARC that passivates the emitter's surface and has an AM 1.5 average weighted reflectance (AWR) below 10% when grown on flat emitter surfaces;
iii. a very effective SE created by controllably etching back the non-metalized emitter surface.

The RTWCG SiOx ARC/SE/(TO) crystalline silicon solar cell design and technology according to this invention, reduces and simplifies the number of solar cell processing steps. Moreover, it adopts state-of-the-art solar cell and solar module features such as more highly conductive contacts, and alternatives to EVA encapsulants. It also takes advantage of certain benefits that the RTWCG process itself offers, such as the use of a kink-and-tail type diffusion profile in the emitter. Since the kink-and-tail diffusion profile has a relatively deep junction depth, the possibility of the front grid lines short-circuiting the junction is practically eliminated. This in turn allows for the use of more highly conductive contacts and lower contact resistance screen printed metallization solutions, which lower the already low contact resistance created by the diffusion profile's high net surface concentrations below the grid lines. These benefits coupled with the very effective SE, produce a cell structure that has a strong front surface field, a low ideality factor, and a large blue response gain contributing to a significant increase in cell efficiency.

The RTWCG SiOX ARC/SE/TO crystalline silicon solar cell fabrication technology uses a low-cost process approach that simplifies or eliminates various process steps of other known in the art high efficiency silicon solar cell technologies. The fabrication technology is outlined below for a n+/p (P,B) Si solar cell:

Saw damage removal and cleaning prior to diffusion;
Phosphorous diffusion with a kink-and-tail net majority carrier concentration diffusion profile, and preferably with a mechanical or other type of border masking to prevent heavy diffusion of the cell edges;
Standard screen printing of the front and back contacts and a one step conventional front and back contact annealing.

The environmentally friendly RTWCG SiOx ARC/SE/ (TO) single process step according to one or more embodiments, is a low cost wet chemical process that in one minute or less achieves the following:

i. cleans the silicon and metallization surfaces of the bare solar cell;
ii. can perform edge isolation of n+/p, and p+/n, or enhanced efficiency diffused n+/p/p+ or p+/n/n+ structures;
iii. on non-metalized cell surfaces, it grows a graded index of refraction SiOx ARC with an AM 1.5 AWR between 5%-9%, depending on the type of silicon substrate;
iv. the optional in-situ TO feature can further lower the AM 1.5 AWR to 3%;
v. forms an excellent quality SE that is compatible with large-volume, low-cost production;
vi. SiOx films resulting from relatively high growth rate, >200 nm/min, RTWCG SiOX solutions can create the TO feature concomitant with the ARC/SE features. SiOx films resulting from lower growth rate, <50 nm/min, RTWCG SiOx solutions may require an additional 10-20 sec etch step in 0.5%-2% $HF_{(aq)}$.

Saw Damage Removal and Silicon Wafer Cleaning Prior to Diffusion

Prior to device fabrication according to FIG. 2, the silicon substrate surface 200 is prepared. Surface preparation of silicon (Si) semiconductor wafers prior to the emitter formation through diffusion is well known in the art and is usually simply referred to as wafer cleaning. Surface cleaning techniques used by the semiconductor industry, and which also apply to conventional solar cell fabrication technologies, and in particular to most high efficiency silicon solar cell technologies, are usually divided into four groups: front-end of line (FEOL), diffusion-end of line (DEOL), metallization-end of line (MEOL), and back-end of line (BEOL).

There are two basic types of wafer cleaning in use today: RCA-type wet cleans, predominantly used in FEOL and DEOL processes, and solvent-based cleans used in MEOL and BEOL processes. Of interest for surface cleaning of Si surfaces prior to diffusion are the FEOL processes.

Although several new technologies such as vapor phase cleaning, UV-assisted cleaning, cryogenic aerosol cleaning, and plasma cleaning show promise, the semiconductor industry still relies on wet processes for most FEOL cleaning steps. The best known and most widely used FEOL cleaning process is the RCA cleaning sequence. W. Kern developed the basic RCA procedure in 1965 while working for RCA (Radio Corporation of America)—hence the name. The RCA cleaning of the silicon surface employs two steps called Standard Clean 1 (SC 1) and Standard Clean 2 (SC2). In the SC1 step, wafers are exposed to a hot mixture of diluted aqueous hydrogen peroxide and ammonium hydroxide to remove organic surface films and particles. The traditional SC 1 step is made of 1 volumetric part $H_2O_2$ to 1 volumetric part $NH_4H$ to 5 volumetric parts $H_2O$. The SC2 step is designed to remove ionic and heavy metal atomic contaminants using a solution of 1 volumetric part $H_2O_2$ to 1 volumetric part HCl to 6 volumetric parts $H_2O$. The removal of thin silicon dioxide layers where metallic contaminants may accumulate as a result of SC1, is done using a diluted 1 volumetric part HF to 50 volumetric parts $H_2O$, just prior to diffusion.

Since at the present time most silicon substrates are solar grade substrates and most silicon wafer producers provide pre-cleaned silicon wafers with thicknesses ranging between 180-250 μm, modifications to the traditional RCA FEOL clean have been proposed and implemented. One of these is the "Piranha" (98% $H_2SO_4$ and 30% $H_2O_2$) and HF steps before, after, and between the SC1 and SC2 steps. IMEC, for example, has shown that the standard SC2 can be replaced with dilute 0.1 mole/liter HCl without $H_2O_2$, cutting chemical consumption and cost while maintaining the metal removal properties.

One reason for the modified RCA wet dean's continued success is the availability of ultra-high purity water (UHPW) and chemicals. Beyond increased chemical purity, the most significant trend regarding the RCA clean, is the use of more dilute mixtures in an effort to reduce surface roughening. Today very few leading companies still run the traditional (5:1:1) $NH_4OH:H_2O_2:H_2O$ or $HCl:H_2O_2:H_2O$ for SC1 and SC2, respectively. Many of them are at least 10 times more dilute.

U.S. Pat. No. 6,613,697 describes a FEOL Si wafer cleaning sequence that is a modification of the traditional RCA cleans. By including the generally known in the art use of "Piranha" and HF steps before, after, and between the SC1 and SC2 steps high quality RTWCG SiOX films were grown on p-type and n-type (100) and (111) substrates. According to one or more embodiments, the modified FEOL cleaning formulation and sequence disclosed in U.S. Pat. No. 6,613,697 can be used for thin ~200 μm or thinner, silicon substrates prior to diffusion.

The Modified RCA (MoPiranha) and Modified Piranha (MoRCA) sequence steps for cleaning silicon wafer surfaces prior to emitter formation (i.e. diffusion):

1. 3-5 minute cleaning at 50° C.-60° C. in MoPiranha solution: [2 parts 98% $H_2SO_4$: 1 part 30% $H_2O_2$: 20 parts $H_2O$];
2. Ultra High Purity Water (UHPW) rinsing;
3. cleaning in 0.5% $HF_{(aq)}$ for 1 minute;
4. UHPW rinse;
5. 3-5 minute cleaning at 50° C.-60° C. in MoRCA, SC-1 solution: [3 parts $NH_4OH$: 1 part $H_2O_2$: 25 parts $H_2O$];
6. 2×UHPW rinse;
7. cleaning in 0.5% $HF_{(aq)}$ for 30 seconds;
8. UHPW rinse;
9. 3-5 minute cleaning at 50° C.-60° C. in MoRCA, SC-2 solution: [25 parts 0.05 mole/liter HCl: 1 part $H_2O_2$];
10. UHPW rinsing;
11. cleaning in 0.5% $HF_{(aq)}$ for 30 seconds;
12. UHPW rinse;
13. N2 drying.

Kink-and-Tail Net Majority Carrier Concentration Diffusion Profile

As illustrated in FIG. 2A, an emitter layer 210 is first deposited on the surface-prepared silicon base 200.

Conventional screen-printed n+/p Si, and the potentially more highly efficient p+/n Si solar cells, typically use a simple homogeneous diffusion to form an emitter with the same doping level beneath the metal contacts as is on the non-metalized parts of the emitter's surface. To create a low contact resistance between the emitter and the grid lines, a high surface net majority carrier concentration is required under the screen-printed contacts. However, the high surface concentration of the n+ or p+ dopant produces a "dead layer" that drastically reduces the cell's blue response.

Newer cell designs improve the cell blue response by setting contacts on shallower emitters with lower surface dopant concentration. However, this increases the contact resistance between the grid lines and the emitter's surface. Along with a larger emitter sheet resistance, the higher resistance contributes to an increase in the series resistance. Also problematic is a frequent drop in the value of the shunt resistance due to an increased occurrence of "punch thru" into p-Si substrates.

To the best of our knowledge, cell manufacturers do not currently use the, known in the art, kink-and-tail diffusion profile because the surface donor concentration is too high. The cell efficiency worsens, despite the improved contact resistance between the front grid lines and the n++ emitter surface, due to a low blue response. The highly-doped surface layer would have to be etched back from the non-metalized parts of the emitter's surface. This would form the so called selective emitter (SE), an enhancement feature already provided by the RTWCG SiOx ARC/SE/TO crystalline silicon solar cell design and technology.

The discussion herein will be restricted to the n+p (P,B) Si cell structure described in this disclosure for the fabrication of high efficiency, low-cost, crystalline silicon solar cells. It is, however, understood that by using the same fabrication technology sequence disclosed herein, it is possible to produce high efficiency, low-cost, p+n Si RTWCG SiOx ARC/SE/TO crystalline silicon solar cell structures, as well n+/p/p+Si or p+/n/n+Si RTWCG SiOx ARC/SE/TO crystalline silicon solar cell structures. Other structures will also be apparent to one of skill in the art.

The kink-and-tail phosphorus diffusion profile is due to the dual diffusion mechanism created by high concentrations of the phosphorus source in silicon. In this type of diffusion the total phosphorus incorporated at the surface of the diffused layer is much higher than the corresponding electrically active phosphorus. Below the kink, however, the concentration of atomic phosphorus and the net doping concentration become nearly equal. Doping concentration depends on the solid solubility of the impurity elements in silicon. For instance, the solid solubility of phosphorus in silicon at 950° C. is about 2E21 atoms/cm$^3$.

In order to take advantage of the efficiency gain offered by utilizing the RTWCG SiOX ARC/SE/(TO) process, the amount of phosphorous source, according to one or more embodiments, can be at, or just under, the solid solubility of phosphorus in silicon at a given diffusion temperature. The diffusion temperatures that form a usable kink-and-tail diffusion profile, can be between 875° C. and 950° C. The diffusion time is chosen so as to produce a junction depth between 0.5-0.65 μm, with a near-optimal depth of 0.55 μM for a RTWCG SiOX ARC/SE cell structure, and from 0.60 μm to 0.65 μm for a RTWCG SiOX ARC/SE/TO cell structure.

The sheet resistance of the emitter, when the diffusion profile has a high concentration of the phosphorus source, depends primarily on the magnitude of the high concentration region. Subsequently, a kink-and-tail diffusion profile can produce emitters that have varying sheet resistances even though their junction depths are equal. When the diffusion time is lengthened at the lower end of the 870° C.–950° C. diffusion temperature range, the result is a longer and less abrupt profile of the low-concentration tail relative to the high-concentration region. Emitters of a specified sheet resistance, that are diffused at lower temperatures, can result in screen-printed solar cells with higher fill factors due to diminution of Schottky type shunts. Emitters diffused at lower temperatures for longer durations can yield a higher gettering efficiency, resulting in increased bulk recombination lifetime, and thus a higher internal quantum efficiency at long wavelengths. However, the deeper tail extension of low temperature emitters, produce less abrupt diffusion profiles with a weaker front surface field. This causes increased absorption within the highly recombinant emitter, resulting in current losses due to the lower collection efficiency at short wavelengths.

Figure 3:
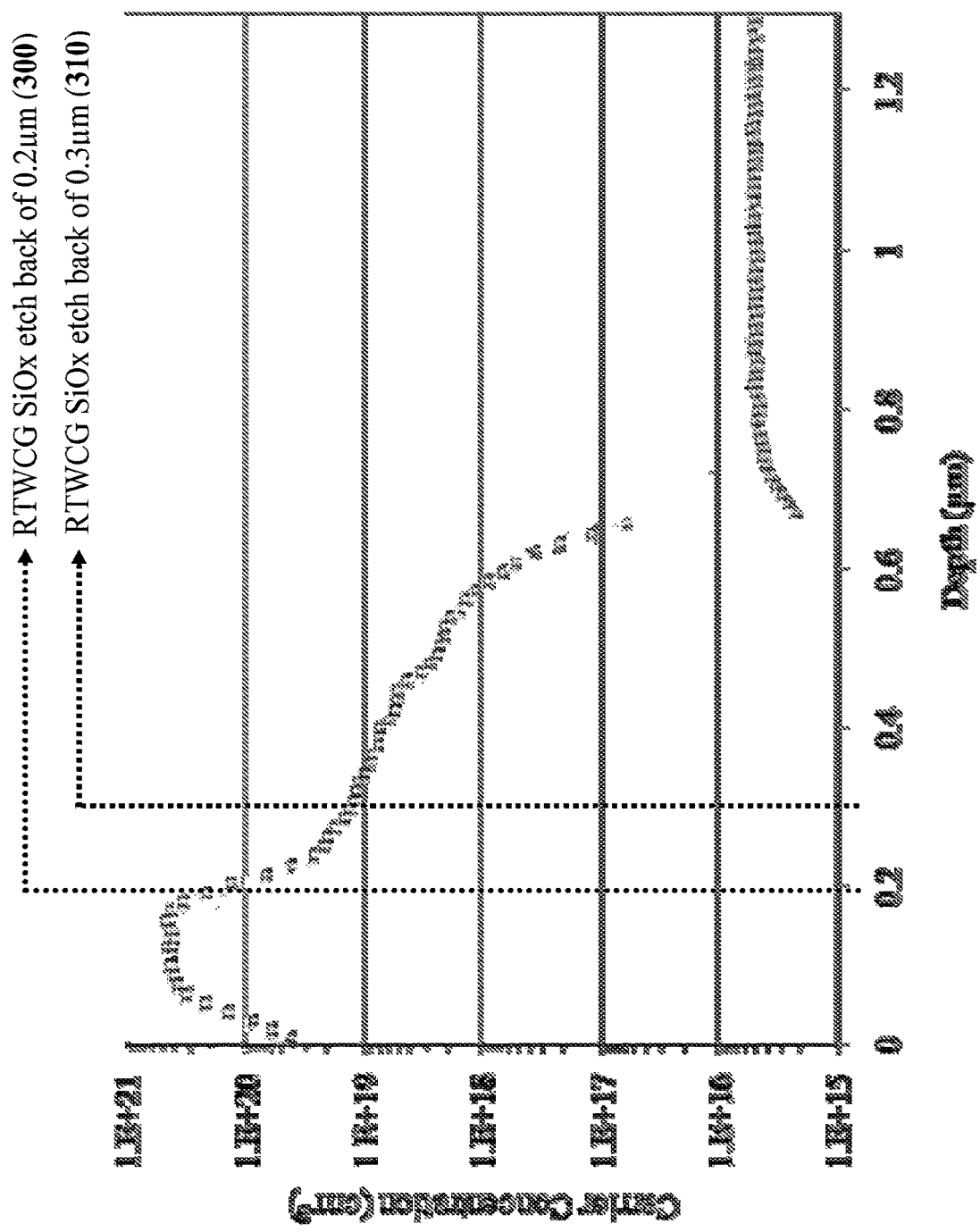
FIG. 3. A kink-and-tail net majority donor concentration depth profile created for a RTWCG SiOX ARC/SE/TO single crystal silicon solar cell design.

FIG. 3 provides an example of a kink-and-tail net majority donor concentration depth profile created for a RTWCG SiOX ARC/SE/TO single crystal silicon solar cell design. The diffusion profile was acquired using the spreading resistance method using the furnace set up shown in FIG. 4 or any other conventional method diffusion/doping technique. The experimental phosphorus diffusion was carried out on a 600 μm-thick (100) p-Si Czochralski (Cz) substrate. An open tube was used with a diffusion temperature of 900° C. The diffusion time was 24 minutes, followed by a 7 minute purge, and a 10 minute drive. The set point was 800° C., with a ramp in at 8° C./min, and a slower ramp out of 3° C./min. As can be seen in FIG. 3, the maximum net donor surface concentration is at around 6E+20 cm$^{-3}$, and the kink is at about 0.2 μm below the emitter's surface. Despite the slow ramp-out temperature drop, the tail is still abrupt, ensuring the formation of a relatively strong front surface field.

From external quantum efficiency plots, the RTWCG SiOX ARC/SE process when used on small area n+/p solar cells that have a kink-and-tail diffusion profile such as in FIG. 3 improves the cell blue response by about 60% compared to bare cells. However the RTWCG SiOx ARC/SE process etches back around 0.2 μm (indicated by line 300) from the emitter's non-metalized surface in order to create an optimal ARC film thickness of 150 nm. This means that the diffusion profile of these small area cells is not optimal; after removing about 0.2 from the active area emitter's surface, as can be seen in FIG. 3, the remaining surface concentration is still above 1E+20 cm$^{-3}$, and hence too high for a high efficiency cell.

The profile represented in FIG. 3 is better suited for the RTWCG SiOx ARC/SE/TO process which utilizes growth solutions that have larger, >200 nm/min, SiOx growth rates. In order to create the initial near optimal SiOx thickness of 220-240 nm, the process etches back 0.25 μm to 0.3 μm (indicated by line 310) from the emitter's non-metalized surface. As can be seen in FIG. 3, the remaining surface concentration on the active area is still slightly above the optimal 1E+19 cm$^{-3}$. For the above diffusion profile, although the cell's blue response significantly improves after the SiOx growth, the high surface concentration after etching back about 0.3 μm from the active area of the emitter creates a sheet resistance on the etched back active areas of only 50-60 Ω/sq. This sheet resistance is too low for a high efficiency cell.

As described in the selective emitter section below, the RTWCG SiOX ARC/SE can have an as-diffused junction depth (xj) of 0.5 μm to 0.55 μm and the kink can be at approximately 0.1 μm from the surface to maximize the Isc, Voc, and FF, and hence the cell efficiency. The initial surface concentration can be around 6E+20 cm$^{-3}$, and the final surface concentration (after etching back about 0.2 μm from the non-metalized surface) should be from 8E+18/cm$^3$ to 1E+19/cm$^3$. After etching back, the diffusion profile of the resulting non-metalize emitter area can have an abrupt slope which produces a strong front surface field. For a high efficiency cell, the sheet resistance of the emitter can be between 20-25 Ω/sq before coating, and between 110-120 Ω/sq after the RTWCG SiOX ARC/SE formation.

Edge Isolation

Wafers used in crystalline silicon solar cell processing are usually boron-doped, but any p-type substrate can be used as is well understood in the art, and the n-type junction is generally diffused into the p-type substrate. Standard n-type doping is normally done using commercially available phosphorus sources. Other conventional n-type dopants can be used as is well understood in the art. Regardless of the source, phosphorus not only diffuses into the desired wafer front surface but also on the edges and the rear surface. This creates a shunting path between the solar cell front and rear. For this reason, various edge isolation techniques have been devised, including plasma etching, and laser cutting. As a standard practice, edge junction isolation, or the removal of the path around the wafer edge, is commonly done by 'coin stacking' the cells. The stacked cells are placed inside a plasma etching chamber to remove the exposed edges.

No attempt is usually made to remove the rear junction. Most manufacturers use either aluminum metal paste or aluminum-doped silver paste at the rear, with the expectation that the aluminum as a p-type dopant will alloy to the silicon, thereby destroying any n-type layer. The firing conditions for the rear aluminum contact are chosen to neutralize its effects, often with limited success. Unfortunately, thermal gradient zone melting for the aluminum/silicon molten region in conjunction with fairly poor phosphorus solubility in the aluminum/silicon often leads to the n-type layer being ineffectively destroyed. This leads to a weak back surface field, and ultimately to a low cell efficiency.

Unless the parasitic emitter diffusion wrapped around the wafer edge is removed, most industrial cells suffer from very low fill factors that can be as low as 60%. There are many different methods known in the art for performing edge isolation on silicon solar cells, including but not restricted to plasma barrel etching, conventional laser grooving, dry etching, inline wet etching, and dispensing of etching pastes. An emerging new laser process, that has the potential to overcome the problems of conventional lasers, is the water jet-guided laser.

Until a few years ago, plasma barrel etching was the standard process for edge isolation of solar cells, but there was a great interest in replacing it by an appropriate inline process. The batch technique led to a strong disruption in process-flow stemming from stacking and un-stacking large numbers of wafers. This problem resulted in some solar cell manufacturers choosing to eliminate the disruptive process step even though the penalty they had to pay was a significant decrease in cell efficiency. One of the most successful new edge isolation processes is laser scribing which is said to be suitable for inline processing and the wafers do not need to be touched.

It is generally agreed that the interruption of the process flow associated with plasma barrel etching is very disadvantageous. The laser and etching processes each have specific advantages and some major, known in the art, disadvantages. Therefore, alternatives to the conventional laser edge isolation have to be assessed, if the commercial performance of the edge isolation step is to be further increased.

A better red response is achieved by enhancing the back surface field. A known way of enhancing the back surface field is to use n+pp+-Si diffused cell structures. After the diffusant is spun on, the diffusion is carried out by tube diffusion where the wafers are arranged so that wafer surfaces of the same dopant type face one another. Although this technique has been proven to produce good efficiency silicon solar cells, it does need the additional double spin-on, and driving out of organics, steps. These extra steps increase the manufacturing cost and also lower the process flow, making them undesirable for large volume solar cell production.

Compared to the traditional n+p Si cell structure, which utilizes a screen-printed aluminum back surface field (Al-BSF), the n+pp+ Si cell structure with boron diffusion produces more highly efficient cells. It does this by improving the silicon solar cell's back surface passivation, by creating a stronger back surface field that reduces back surface recombinations, and increases the near red and red collection efficiency. Replacing the n+pp+ Si cell structure with a p+nn+ Si cell structure increases the effective minority carrier bulk lifetime, which leads to a higher open circuit voltage.

Figure 4:
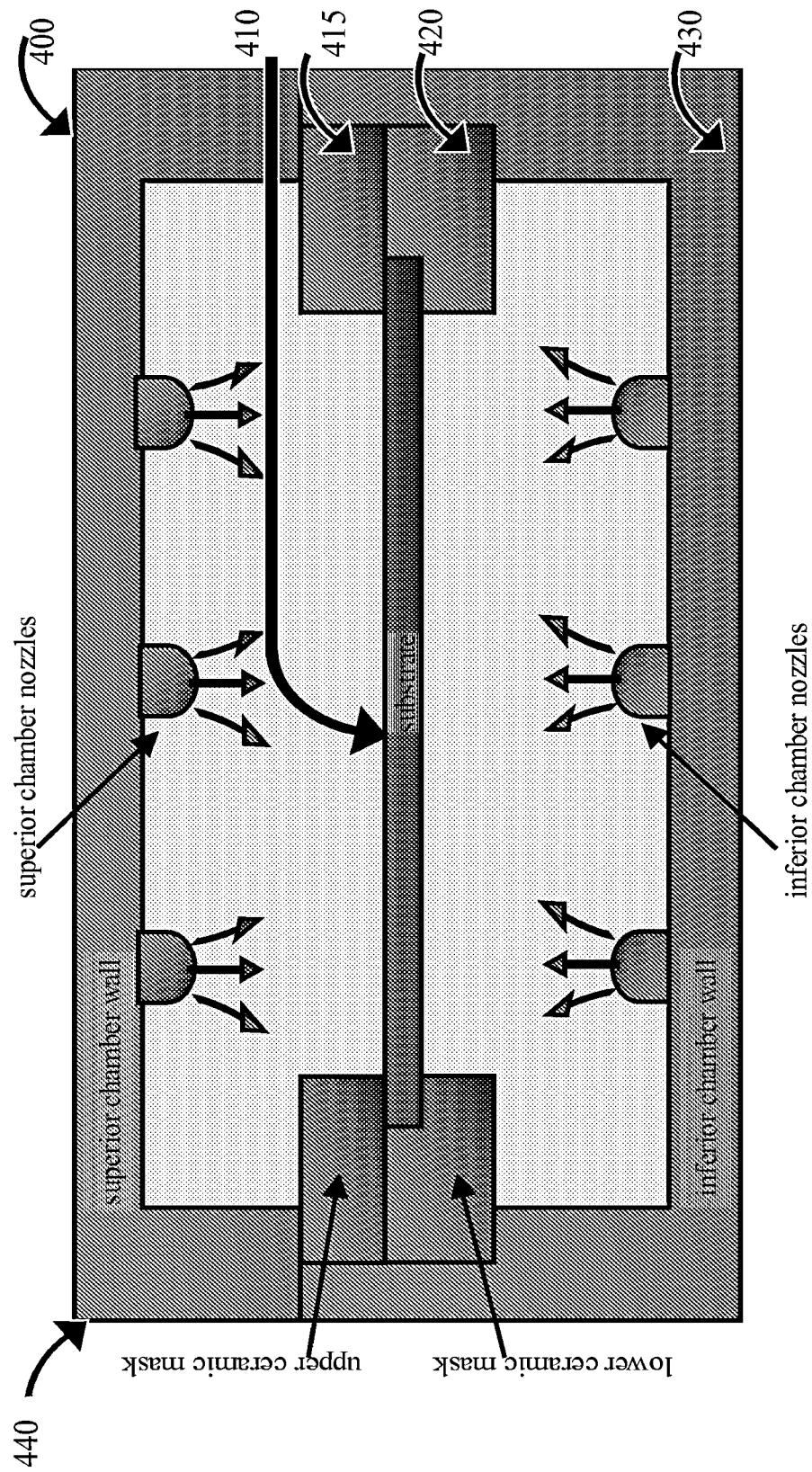
FIG. 4. The envisioned conveyor type diffusion equipment that masks the substrate edges and creates good quality n+ and p+ diffusion layers simultaneously on the opposing faces of the silicon wafer.

In one or more embodiments, an inline process is employed to eliminate the need for an edge isolation process steps as well as the need for stacking and unstacking of cells. By masking the cell border during the diffusion step, the cell's edge is protected from heavy diffusion. FIG. 4 shows the envisioned conveyor type diffusion equipment 400. The silicon wafers 410 are positioned between two semiconductor-grade ceramic plates 415, 420 of low thermal conductivity whose dilation and a contraction constants are similar to the silicon substrate's dilation and contraction constants. The ceramic plates are mounted to the lateral walls of the inferior diffusion chamber 430 and secured in place by an upper stainless steel member 440. The temperature resistant stainless steel utilized in the equipment should be semiconductor-grade with small impurity out-diffusion.

Clean silicon substrates are generally hydrophobic, leading to a well known in the art problem. Non-uniform diffusion source layers can result from spraying, on clean silicon substrates, aqueous diffusion sources such as diluted phosphoric acid and diluted boric acid at, or near to, room temperature. In one or more embodiments, spraying for 1-5 seconds at temperatures between 175° C. and 200° C., with a slight positive pressure of 20-50 Torr above atmospheric pressure, can prevent the aforementioned problem.

The in line temperature ramp up and ramp down can be carried out in a nitrogen ambient. The diffusion sources are applied, as per above, at the beginning of a fast, 50° C./min to 100° C./min, temperature ramp up. Uniform diffusion source layers were obtained, however, after the diffusion was carried out and the diffusion glass was removed, staining was observed, especially on the boron doped surface. The staining problem was overcome by the addition of a small oxygen flow to the continuous nitrogen flow, one to two minutes before the diffusion temperature was reached. The oxygen flow was then stopped after the first 1-2 minutes of the temperature ramp down which should not exceed 50° C./minute.

The mechanical mask in FIG. 4 blocks the diffusion source from covering the cell's edge, thus any cross diffusion from opposing surfaces is likewise stopped. By utilizing this simple inline diffusion technique, where the diffusion source is deposited at the start of a rapid temperature ramp up (50-100° C./min), good quality n+ and p+ diffusion layers can be simultaneously obtained on the two opposing faces of the silicon wafer. Furthermore according to this invention, any undesired cross doping on the edges of cells which may occur despite the mechanical mask, are etched off during the RTWCG SiOX ARC/SE (TO) process. Since this method renders the edge isolation process step unnecessary, it lowers processing cost accordingly while it increases the RTWCG SiOX ARC/SE/(TO) cell efficiency.

By using the aforementioned diffusion procedure, the RTWCG n+/p/p+ Si or p+/n/n+ Si crystalline silicon solar cell efficiency increases due to: a strong back surface field formation, a smaller density of recombination centers on the back surface, and a significantly lower front and back contact resistance.

With some improvements to screen printed front and back metallization, a much lower annealing temperature would be needed. Reduced annealing temperatures lower manufacturing costs by decreasing the processing step's energy consumption. Moreover, the shunt resistance (Rsh) of the good quality RTWCG SE feature would increase, making it less likely that the front grid lines would short-circuit the junction.

The advantages of liquid diffusion sources are known in the art. Hazardous chemical dopants such as phosphorus oxychloride (n+ doping), phosphine (n+ doping), boron trichloride (p+ doping), boron tribromide (p+ doping), and diborane (p+ doping) can be replaced by the safer diluted phosphoric acid (n+ doping), and boric acid (p+ doping).

The use of the liquid diffusion sources was suggested as diffusant examples in the production of the inline simultaneous n+/p/p+ Si or p+/n/n+ Si diffusions. Also suggested was an example of physical masking (FIG. 4). As is understood by anyone skillful in the art, the liquid diffusion sources can be replaced with any other type of diffusion sources, such as solid, gaseous, liquid, screen printed diffusion source, spin-on diffusion source. Similarly, any other edge masking scheme can be employed, followed by the removal of unwanted diffusion impurities from the edges of the n+/p Si, p+/n Si, n+/p/p+ Si or p+/n/n+ Si solar cell structures using any derivative of the RTWCG SiOX ARC/SE/(TO) process does not depart from the teachings of, and are contemplated by this invention.

Screen Printed Front and Back Contacts and One Step Front and Back Contacts Annealing Metalized back contact 230 and front grid lines 220 are then applied to the device, as shown in FIG. 2B.

Spectrolab introduced terrestrial silicon solar cell contacts by screen printed metallization in the late 1970's. Although this process has certainly withstood the test of time, there are nevertheless serious limitations to the contacts produced by this type of metallization. For the contacts to have a low enough contact resistance the emitter's surface must have a high doping concentration. The aspect ratio is relatively poor due to the relatively large width (150 µm) of the front silver based grid lines. They possess relatively low conduction and lastly, spiking occurs along the (111) plane at the annealing temperature of the aluminum metal which usually covers the whole back surface of the cell. Although the contacts obtained by screen printed metallization have drawbacks, it is highly cost competitive and is very scalable for high-throughput production. To date, there are no other viable technologies that can compete in cost or scalability.

Pastes used in screen printed metallization are made up of: small metal particles, low-melting-point glass composites (frit), and organic binders and solvents. For conventional n+/p silicon cell structures, the paste normally contains silver (Ag) powder. To decrease the contact resistance, phosphorus-containing compounds, which increase the doping concentration of the front contact's underlying n-type regions, may be added to the paste. For rear surface pastes, Al is often used to dope the underlying p-type regions. Immediately after screening each side, pastes are dried by heating at temperatures of 350-400° C. Contacts are then usually fired in a belt furnace at up to 900° C., which is above the Ag—Si eutectic temperature of 835° C.

It is well known in the art that the Ag-based front grid's contact resistance to a n+-Si emitter can be highly sensitive to firing conditions. The pastes utilized for the rear contact screening are made up predominantly of silver with some additional small percentage of aluminum. The conditions under which rear contacts are fired are also highly critical to ensuring the rear junction neutralization. Temperature gradient zone melting can be an important issue when alloying the Al paste component to form the 'back surface fields.' Infrared lamps, rather than normal furnace heating elements, are often used for firing.

New metallization techniques are under development with high-throughput potential, as well as improvements to metal coverage, finger resistance, contact resistance, and material cost. The front and back contact metallization process technologies that show potential benefits are: nano-inks, metal aerosol jetting, metal powder laser sintering, contact to hetero-junctions, and plating. Lastly, plasma vapor deposited (PVD) TiN, TiW, and TaN create barrier layers for copper and are potential alternatives to silver and aluminum metallization.

The use of a thicker and more heavily doped region below the front grid lines, provides greater latitude to the metal contact firing step. It permits the utilization of screen printed metal formulations that penetrate deeper and are more conductive.

Etch Back and Growth of SiOx Layers

Following the front and back screen printing metallization, with no additional surface preparation, the RTWCG solution grows a RTWCG SiOx thin film 250 on the non-metalized surfaces of the cell, as illustrated in FIG. 2C. The method can be used to prepare SiOx layers that perform a number of functions.

In one or more embodiments, an SiOx layer is formed using a controlled etch back of a doped silicon surface layer and growth of an SiOx layer. As the silicon is consumed, there is a controlled "etch back" into the silicon wafer. Concurrently, surface reactions generate SiOX at the surface. The overall SiOx growth is a balance of the two competing reactions in the growth solution system. As used herein, SiOx thickness refers to the final SiOx thickness of the layer. SiOx growth rate refers to the total SiOx thickness generated over a unit of time (typically 1 minute). The growth of a given SiOx thickness typically will consume a larger thickness of the initial silicon substrate, so that the total SiOx layer grown is less than the Si etch back. By way of example, in the formation of a 100 nm SiOx layer, 150 nm of Si can be consumed.

In one or more embodiments, the layer can be grown rapidly, precisely and uniformly to form an antireflection coating. The layer provides superior antireflection due to the compositional gradient of the layer. The RTWCG ARC can have the same or lower reflectance on polished wafers than SiNxARC has on textured multi-crystal wafers. In one or more embodiments, the refractive index of the layer is graded so that the outermost surface has an index of refraction close to that of $SiO_2$ (which has an index of about 1.2) and the index increases towards the interior of the layer and approaches the index of refraction of silicon (which is about 3.4) at the SiOx/substrate interface.

In one or more embodiments, the SiOx growth process produces a passivating layer that reduces the reactivity of the silicon surface. In other embodiments, the SiOx process getters the silicon layer and reduces the impurities. In particular, the dopant impurities in the SiOx layer can be less than the dopant levels in the starting silicon layer. The purity of the oxide grown is directly related to the purity of the chemicals used. When high purity chemicals are used, the oxide is very clean and provides a high level of passivation and gettering.

In one or more embodiments, the etch back is used to precisely thin the emitter layer, e.g., only a portion of the emitter layer is etched back. For example, the etch back and SiOx growth can remove the phosphorous (P) dead layer left after the diffusion process. The solution only reacts with the silicon, therefore the fired front grid can be used as a mask and the process creates a self-aligned selective emitter.

In other embodiments, the SiOx layer is grown thick enough to remove the entire emitter. This process creates a passivated surface.

In other embodiments, the RTWCG process is capable of texturing the SiOxARC by etching the surface of the SiOx layer to produce a texture oxide (TO) layer. Texturing the SiOx layer instead of texturing the silicon has certain advantages. The TO SiOx layer shows reduced front surface recombination velocity and a higher level of front surface passivation due to a less damaged silicon surface and reduced silicon surface area. A textured oxide surface can be formed during the growth step under high growth rate conditions, e.g., >200 nm/minute. The texture process can also be carried out using additional (10-15 seconds) mild acid wet process step after the growth of the SiOx. The SiOx thickness used to texture is about to 0.22 microns (rather than the 0.13 microns for the standard SiOx ARC/SE), which can require a slightly longer growth time (approx 30-60 seconds longer) and which increases the etch back depth from approximately 0.2 microns to approximately 0.3 microns (result in a lower net surface P concentration, approaching that of a "blue cell").

In one or more embodiments, the SiOx layer is grown on doped semiconductor surfaces. In one or more embodiments, the SiOx layer is grown on n+ or n++ Si surfaces. In one or more embodiments, the SiOx layers are grown on p+ or p++ Si layers.

In one or more embodiments, the substrate is dipped into the RTWCG SiOx liquid solution. The dip-in technique not only grows SiOx films on the non-metalized portions of the emitter but also on the edges and non-metalized back surfaces of the cell. This method was used to conduct the bulk of the experimental work undertaken for the development of the RTWCG SiOx ARC/SE/(TO).

Other RTWCG techniques have been successfully employed to deliver the RTWCG solution onto the substrate. The spray-on technique utilized a specially designed atomizer to deliver a thin RTWCG solution film on the silicon cell surface. In the floating technique, the front-side of the solar cell was placed on the surface of the RTWCG solution; the surface tension of the liquid solution kept the cell from sinking. The dispensing technique deploys the RTWCG solution from above in a direction parallel to the grid-lines. Due to the solution's aqueous makeup, a meniscus forms that is strong enough to prevent the solution from flowing off of the cell. The mechanical device technique was used with devices such as a brushes or rollers to deliver the RTWCG solution. Certain mechanical devices required that the solution's viscosity be increased through the addition of cellulose or any other silicon non-contaminating gel.

Following the RTWCG SiOx formation, the cells are rinsed in water then blow-dried by nitrogen or dry air. Although the purity of water is of concern to other cell processing steps, it is not of critical concern to the RTWCG film rinse. Experimentally, there was no noticeable difference in the performance of RTWCG cells that were rinsed in ultra-high purity water (near-18 MΩ-cm) versus the RTWCG cells rinsed in simple, lower purity, reverse osmosis water.

In one or more embodiments, an improved RTWCG solution is employed to grow the SiOx thin film. Certain components, such as the silicon source can be eliminated to form simplified solutions that can be used to manufacture high-efficiency, low cost, silicon solar cells. These RTWCG SiOx solutions have a high growth rate and produce good quality SiOx films used as antireflection coatings (ARC) that have a very low AM 1.5 average weighted reflection. Concomitant with the ARC formation, the new RTWCG SiOx solutions produce a number of other important features that are known to increase the efficiency of photovoltaic cells. Multiple expensive manufacturing steps are thus simplified by the new RTWCG SiOx solutions which create all the enhancement features simultaneously, in a single process step.

The RTWCG SiOx method and process described herein is a room temperature wet chemical process which, by catalytic action, rapidly grows silicon oxide-based (SiOx) thin dielectric films on silicon substrates. The RTWCG SiOx solutions for solar cell applications have a growth rate of 500 nm/min. The growth solution can be formulated to grow an ARC film thickness of about 150 nm in approximately 18 seconds. In order to integrate into existing production timelines, the SiOx growth time can be adjusted to be between 25 seconds to 1 minute, which translates into a growth rate ranging from 140 nm/min to 150 nm/min for the RTWCG SiOx ARC/SE cell design. For the RTWCG SiOx ARC/SE/TO cell design the growth rate is between 220 nm/min and 240 nm/min. Growth rate values were determined experimentally by measuring the time required to grow oxides of desired thicknesses. While for ultra-fast SiOx growth rate solutions the thickness of the SiOx film grown on heavily doped n+ or p+ silicon substrates can be as high as 500 nm in the first minute, for longer growth times the normalized SiOx growth rates steadily decrease.

As the SiOx film grows deeper, the oxygen required to continue the reaction must migrate through an increasing SiOx thickness toward the SiOx/Si interface. As the reaction progresses, the growth rate becomes smaller. Therefore, the growth rate of the RTWCG SiOx film is not constant as a function of SiOx growth time. This actually turns out to be an advantage, both in terms of the very good uniformity of the films, as well as greater control over the SiOx thickness.

Figure 5:
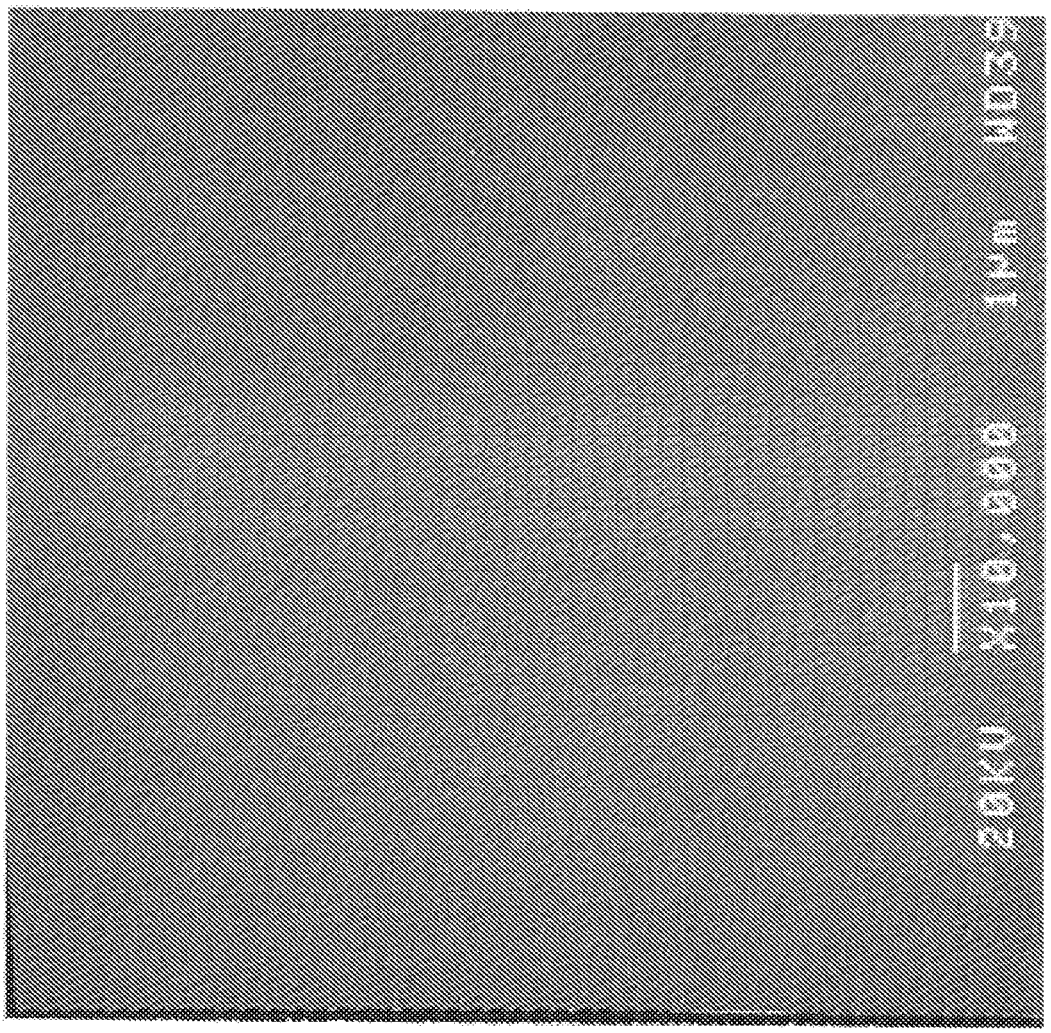
FIG. 5. SEM view of a uniform 400 nm-thick RTWCG SiOx film grown on a semiconductor-grade c-Si substrate.

If starting with clean silicon substrates, the SiOx film is very uniform. FIG. 5 shows a SEM view of a 400 nm-thick RTWCG SiOx film grown on an eight inch semiconductor-grade c-Si substrate that had a mirror like surface. The SiOx film's thickness deviation of the above RTWCG SiOx film, is of about 0.5% as determined by ellipsometry. The average surface roughness (ASR) revealed by AFM is as low as 0.1 nm. For clean solar grade flat silicon substrates, the film's thickness deviates by less than 1%.

For example, using ellipsometry, thickness measurements were performed at an independent testing facility on each of six solar grade 5-inch Cz Si substrates. The SiOx thicknesses on the substrates ranged from 68-110 nm. The 5 point thickness measurements across each substrate showed a deviation from average from as low as 0.75% on the best SiOx film, to a high deviation of 1.03%.

Figure 6A:
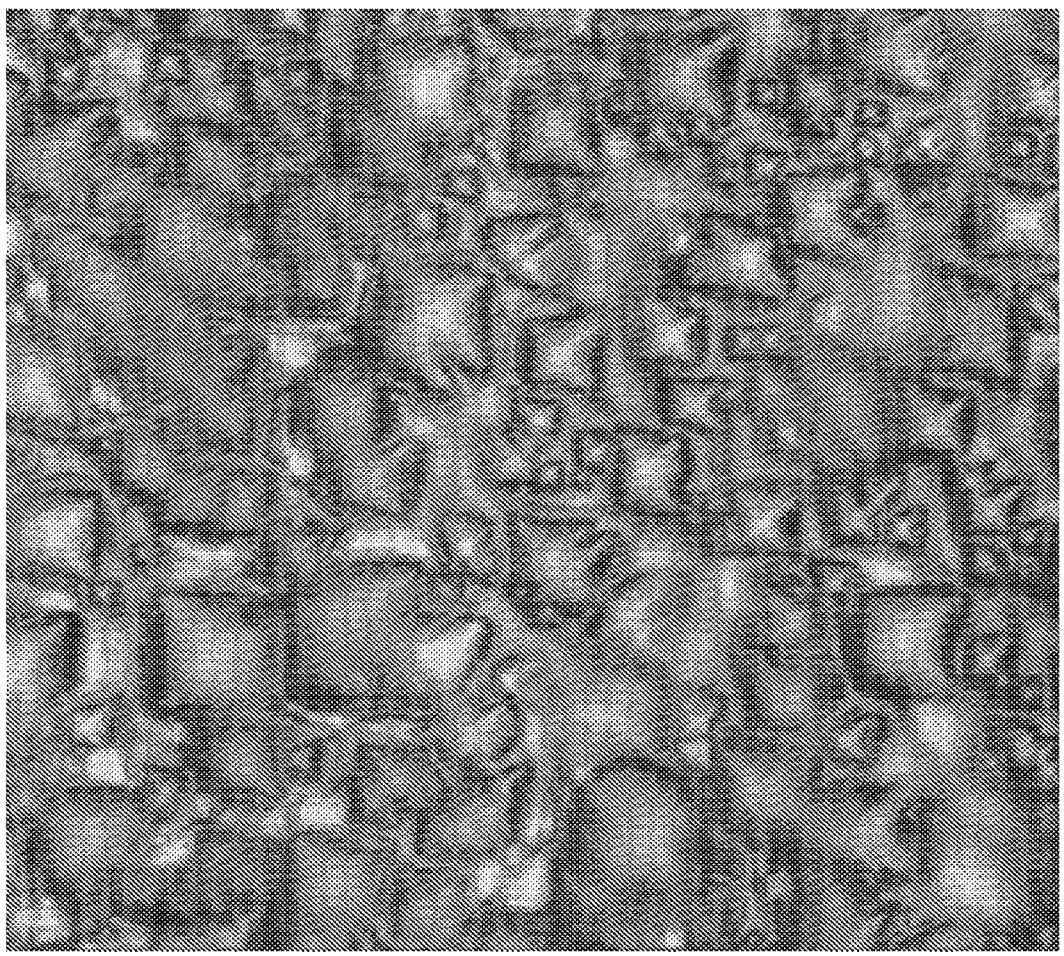
FIG. 6(a). Nomarski microscopy view (×1,100) of a SiOx film grown on a pyramid-covered n+c-Si surface.
Figure 6B:
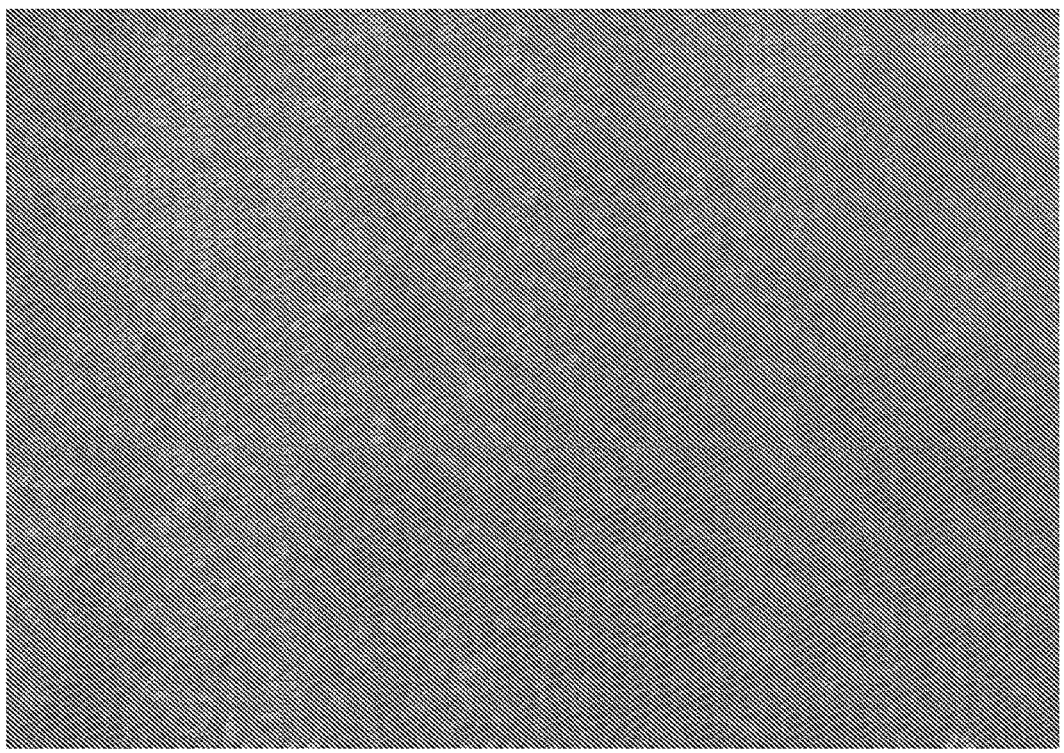
FIG. 6(b). Nomarski microscopy view (×1,100) of a SiOx film grown on porous silicon substrates.

The SiOx films grown on clean silicon substrates have good conformity as seen in FIG. 6(a) which shows a Nomarski microscopy view (×1,100) of a SiOx film grown on a pyramid-covered n+ c-Si surface. The picture taken by Nomarski microscopy shows no contrast differences between the faces of the pyramidal structures. From this it can be inferred that the RTWCG SiOx film growth occurs without any significant preferential growth on (100) and (111) crystallographic orientation. In fact, even when grown on the various crystallographic orientations present on porous silicon substrates (FIG. 6(b)), the SiOx film is quite uniform and conformal. The good conformity of the RTWCG SiOx films makes them ideal for use on textured solar cell surfaces.

Device-quality RTWCG SiOx films are grown by using the growth solution formulation disclosed herein. The SiOx films can be grown on:
  i. various crystalline silicon substrates such as c-Si and mc-Si;
  ii. amorphous silicon substrates;
  iii. semiconductor substrates including, but not restricted to, III-V compound semiconductors such as GaAs and semiconductors.

Unless otherwise specified, RTWCG SiOx films that are grown in relatively low growth rate solution formulations of less than 100 nm/min are uniform and conformal.

Preferred RTWCG SiOx growth solutions were selected through a screening process that included the following:
  I. Selecting the components of the SiOx growth solutions;
  II. Choosing the SiOx growth control;
  III. Composition and chemical SiOx composition and contamination control;
  IV. Testing the RTWCG SiOx solutions on large numbers of crystalline silicon solar cells of various sizes;
  V. Testing the RTWCG SiOx solutions on various metallization schemes;
  VI. Testing the RTWCG SiOx solutions' compatibility with photoresist;
  VII. Testing the uniformity and conformity of the RTWCG SiOx using:
    i. high resolution Nomarski microscopy;
    ii. Scanning Electron Microscopy (SEM);
    iii. Transmission Electron Microscopy (TEM);
    iv. Atomic Force Microscopy (AFM);
  VIII. Testing the RTWCG SiOx chemical composition and atomic concentration of various components of the SiOx films using:
    i. Energy-Dispersive X-ray analysis (EDAX);
    ii. X-ray Photoelectron Spectroscopy (XPS) surveys and depth profiles;
    iii. Auger Electron Spectroscopy (AES) depth profile;
    iv. Secondary Ion Mass Spectroscopy (SIMS) depth profile;
    v. Total reflection X-Ray Fluorescence (TXRF) depth profiles;
    vi. Fourier Transform Infrared (FTTR) depth profiles;
  IX. Vapor Phase Decomposition (VPD) of the SiOx film surface;
  X. The SiOx thickness was measured by using:
    i. ellipsometry;
    ii. Dektak profilometer;
    iii. SEM views of the SiOx films lateral side;
  XI. Testing the RTWCG SiOx film's optical properties, including the index of refraction and the extinction coefficient as a function of wavelength using:
    i. high resolution ellipsometry;
    ii. reflectance plots as a function of wavelength UV/Vis spectrophotometry;
    iii. SEM cross section views of the SiOx films;
  XII. I-V and C-V plots using a state-of-the-art I-V/C-V Keithley plotter, as a function of applied voltage from −100 V to +100 V, and extracting electrical data of interest, including:
    i. leakage current;
    ii. breakdown voltage;
    iii. the static dielectric constant;
    iv. the density of mobile charges on Al (Au)/as grown RTWCG SiOx/Si/Au—Ti—Ag small gate area MOS capacitors fabricated on various SiOx coated silicon substrates, prior to and after exposing the MOS capacitors to various environments, including but not restricted to dry heat, high intensity near UV radiation, and high intensity plasma;
    v. dark and illuminated I-V characteristics and Isc, Voc, FF, Pmax, Rs, and Rsh on:
      i. small and large area single crystalline (c-Si) RTWCG SiOx ARC/SE solar cells;
      ii. small and large area multi-crystalline (mc-Si) RTWCG SiOx ARC/SE/(TO) solar cells;
      iii. conventional n+/p Si homo-junction silicon solar cells with screen printed contacts;
      iv. specialized cell designs, including but not limited to:
        a) the all rear contacts cells;
        b) spherical solar cells;
        c) vertical multi-junction (VMJ) cells;
  XIII. Performance data on bare cells versus same cells after the RTWCG SiOx ARC/SE/(TO) process;
  XIV. Performance data after exposure of the RTWCG SiOx ARC/SE/(TO) solar cells to various environments;
  XV. Internal and external quantum efficiency plots.

Most of the solar cells used for testing were conventional n+/p (P,B) Si screen printing metallization cells, with either flat or textured emitter surfaces. The cells were acquired from various cell manufacturers. Other configurations for substrate are contemplated.

Most of the atomic concentrations of the various components of the SiOx thin films were acquired by XPS; other, thicker SiOx films, were acquired by AES. Unless otherwise specified, the depth in the abscise of the XPS and AES depth profiles of SiOx thin films was calculated in reference to the $Ta_2O_5$ sputtering rate. Ellipsometry data on selected samples, as well as Dektak profiles of etched features, have shown that the real thickness of SiOX films is up to 2 times larger than those corresponding to the abscise of the XPS or AES depth profiles.

Due to the necessity of a large volume of experimental data from which the preferred RTWCG SiOx solution formulations were established, most of the testing was done on small area solar cells or Si substrates. Simple ways were devised to correlate solar cell performance results with the RTWCG SiOx ARC/SE/TO features, such as SiOx thickness, reflectance, and the degree of etch back from the emitter's non-metalized surface.

For example, in a series of SiOx thickness experiments, n+ and p+ c-Si test substrates with mirror-like surfaces were used. A photolithographical mask opened into positive photoresist both narrow, micron-sized, lines as well as larger, mm-sized, uncovered areas. The larger photoresist-free areas served as a visible guide for growing the appropriate thickness of SiOx film in the narrower lines that can be used for Dektak profilometry. There is a well known in the art relationship between a thin-film's color and its thickness. After the correct SiOx film thickness was seen on the larger areas of photoresist-free substrate, the sample was extracted from the growth solution, rinsed with water, dried, and the photoresist removed. The SiOx film thickness, as well as the level of emitter etch back was then calculated from the difference between the Dektak profile steps prior to and after SiOx film removal.

In one or more embodiment, the room temperature wet chemical growth solution includes fluoride-containing acidic solution and a reduction-oxidation system that contains one or more elements capable of promoting an oxidation reaction at the silicon surface. The solution provides a balance of etching (to remove the silicon layer) and oxide growth (to deposit an SiOx layer).

As a result of a comprehensive experimental investigation, it is now known that the RTWCG SiOx growth solution can contain a large number of combinations of metallic ions $Me^{+n}/Me^{+(n+m)}$ where n is from 0 to 4, and m is from 1 to 4. These metallic ions include but are not restricted to metallic ions such as Ti, Co, V, Cr, Fe, Ni, Cu, Y, Sr, Ce, Ba, Zr, Nb, Ru, Rh, Pb, Ag, La, W and Pd. Other RTWCG SiOx solution formulations yielded good results and included various inorganic metallic oxides of Al, Sb, Be, Bi, Mg, Ce, Hf, Ta, Ti, and Zr and various non-metallic oxides of I and Br. Various metallic chlorides and fluorides including but not restricted to Bi, Ti, Co, V, Ce, Al, La, and Mg were also explored with relatively good results for use as components of the RTWCG SiOx growth solution. Along with other ingredients, various inorganic metallic oxides containing the above ions are dissolved in aqueous fluoride-containing acidic solutions to achieve a reduction-oxidation (redox) reaction between the growth solution and the silicon substrate. In preferred growth solutions there exists a desired ratio between the SiOx thickness and the amount of concomitant etching back of the non-metalized surfaces of the silicon solar cell.

Combinations of one or more of the metallic or non-metallic ions listed in the above paragraphs have resulted in acid-based SiOx growth solutions. The growth rates of the various solutions varied from several nm/min to as high as 500 nm/min. The role of the various classes of the metallic and non-metallic ions is to provide a reduction oxidation (redox) aqueous component and optionally a catalyst such as $H_2TiF_6$, $Pd(O_2C_3F_3)_2$, $TiCl_4$, and $(NH_4)_2TiF_6$ and the like that can be added to the growth solution to enhance the growth of the SiO based thin film.

Improved RTCWG solutions are described herein; however, solutions such as described in U.S. Pat. No. 6,080,683, entitled "Room Temperature Wet Chemical Growth Process of SiO Based Oxides on Silicon" and U.S. Pat. No. 6,593,077 entitled "Method of Making Thin Films Dielectrics Using a Process for Room Temperature Wet Chemical Growth of SiO Based Oxides on a Substrate", may also be used.

The RTWCG dielectric films are composed of Si—O-x where Si is silicon, O is oxygen, and x can be nitrogen, carbon, fluoride, or hydrogen. To a much lesser degree, the films are also composed of trace levels of Si—O-M where M is a metallic ion. XPS depth analysis of preferred SiOx films showed that the bulk of the trace metal is either oxidized, or bonded to Si, N, and other non-metallic trace impurities. The sensitivity factors used to calculate the atomic percentage of SiOx components with binding energy values in deconvoluted peaks, were determined precisely by analyzing ion etched Si, Ti, SiC, BN, $TiO_2$, thermal $SiO_2$, and various other metallic standards.

In one or more embodiments, additives can be included in the RTWCG solution to provide conductive layers. Various RTWCG growth solutions composed of metallic nitride such as Bi, Ti, Co, Cu, Se, and Ce create films with high Si—O-M (e.g. Si—O—Cu, Si—O—Bi, Si—O—Se) concentrations. Metallic chlorides and fluorides selected from the group consisting of Bi, Ti, Co, V, Ce, Al, La, and Mg based chlorides and fluorides can also be included to promote formation of conductive layers. These films are conductive, transparent in the visible portion of the solar spectra, and have a relatively low AWR of roughly 10%. Si—O-M films may be used as a higher quality, lower cost, replacements of known in the art transparent conductive oxides (TCO). RTWCG TCOs have a variety of electronic and optoelectronic (photonics) applications including applications in manufacturing highly efficient low-cost thin film solar cells. Without being bound by any mode or theory of operation, RTCWG solutions containing these compounds appear to be capable of processes similar to electroless plating, which allows the formation of metal in the SiOx layer.

In one or more embodiments, the RTCWG solution includes a fluoride source. Exemplary fluoride sources include $H_2SiF_6$, $NH_4F$, HF, $H_2TiF_6$, BaF, $BF_4$ and other metallic and non-metallic fluorides. The RTCWG solution may also include one or more acids, which can also be a fluoride source. Exemplary acids include $H_2SiF_6$, HCl, HF, $HNO_3$, and $H_2SO_4$. Non-invasive additives may include, but are not limited to, $NH_4F$, HF, HCl, $H_2O$, $HNO_3$, $H_2O_2$, and a silica sources, such as colloidal silica, $SiO_2$ and other soluble metal silicates. These additives can be utilized according to this invention, among other uses, to adjust the chemical composition, to adjust the pH of the growth solution, adjust the film's metallic and non-metallic impurity concentration, to vary the RTCWG SiOx film's growth rate, and to adjust the rate at which the non-metalized emitter's surface is etched back.

Herein is described the RTCWG SiOx solutions specially formulated for high efficiency, low-cost, crystalline solar cell applications. The development of these new RTCWG solutions emphasized not only low-cost and environmentally friendly formulations, but also formulations permitting an increased number of tasks.

Following the kink-and-tail type emitter diffusion, a conventional screen printing metallization creates the front and back contacts. The RTWCG process permits the use of screen printing pastes which offer lower contact resistance and more conductive front grid contacts. Lastly, the single step RTWCG SiOx growth solution concomitantly:

i. in-situ cleans the cell surfaces including metallization;
    ii. can potentially produce a good quality edge isolation;
    iii. produces a low reflectance SiOx ARC;
    iv. passivates the cell surfaces, including the front Ag-based and back Al contact;
    v. produce a good quality selective emitter (SE); and
    vi. creates a textured SiOx (TO) surface.

Along with the inherent formation of strong front surface field, the above RTWCG SiOx ARC/SE/(TO) features contribute to a significant increase in the efficiency of silicon solar cells. As compared to other known in the art high efficiency cell designs, the RTWCG SiOx ARC/SE/(TO) technology drastically reduces fabrication costs by eliminating certain processing steps including some energy-demanding thermal steps.

Special attention was paid to the development of RTWCG SiOx growth solutions' various $Me^{3+}/Me^{5+}$ redox systems, oxidation catalysts, and non-invasive components described herein. Non-invasive components minimize the SiOx's metallic impurity concentration and produce a low reflectance transparent SiOx film that passivates well the silicon surfaces. The solutions were required to etch back a suitable thickness from the emitter's non-metalized surface without damaging the integrity of the cell metallization.

As described herein, preferred RTWCG SiOx growth solutions utilize redox systems, aqueous homogeneous oxidation catalysts, and non-invasive inorganic additives. XPS BE analysis of various peaks shows that the trace amounts of non-oxidized metals exist only at the surface. Nearly 100% of the impurities found in the SiOx bulk region form stable compounds with nitrogen, silicon or oxygen. This observation holds true for RTWCG SiOx films grown on Si as well as all other studied substrates such as GaAs and other semiconductor substrates from groups IV, III-V, I-II-VI.

In order to create preferred RTWCG SiOx growth solution formulations for the silicon solar cell application, the RTWCG SiOx growth solution formulations included various metallic ions $Me^{+n}/Me^{+(n+m)}$ where n is from O to 4, and m is from 1 to 4. Some metallic or non-metallic ions that have been successfully used to enhance the growth rate of the growth solution, and/or lower the level of metallic concentration in the oxide include but are not limited to: Ti, Co, V, Cr, Ni, Sr, Cu, Ce, Y, Zr, Nb, Ru, Rh, Fe, Ba, Pb, Pd, I, Br, Al, Sb, Be, Bi, Hf, Ta, W, La, Ir, Os, As, Sn, Ag and Mg. A function of the various metallic ions is as redox components, for example, $K_3Fe(CN)_6$ forms the $Fe^{2\pm}/Fe^{3+}$ redox system. Other metallic ions act as homogeneous oxidation catalyst components that increase the growth rate of the RTWCG SiOX thin film.

Non-invasive additives include but are not restricted to NaF, KOH, NaF and $NH_4F$ and HF, HCl, $H_2SO_4$, $H_2O$, and $H_2O_2$. These additives can adjust the growth rate, reduce optical and electrical loses such as from metallic and non-metallic impurities, and adjust the rate at which the non-metalized emitter's surface is etched back. The primary improvements of the SiOx quality appeared, however, after all the organic components of the SiOx growth solution were substituted with inorganic components.

In one or more embodiments, RTWCG SiOx growth formulations that produce high quality RTWCG SiOx ARC/SE/(TO) features are substantially free of a silicon source. By "substantially free" of a silicon source, it is meant that there is no significant level of silicon source in the RTCWG solution. In particular, a silicon source is not intentionally added, and the solution does not contain a silicon component. Trace silicon levels do not detract from the silicon free quality of the RTCWG solutions, as it is recognized that trace impurities may be difficult to remove and do not affect the function of the solution. By trace levels, the silicon levels are less than 1%, or less than 0.1% by weight.

In some embodiments, silicon is present at ppm levels.

These preferred formulations are not only lower in cost, but maintain an ideal balance between the SiOx film thickness, the growth rate, and etch back.

Many elements, and in particular transition metal elements, have multiple oxidation states that permit them to commonly take part in redox reaction. The two classes of redox reactions of importance to the RTWCG SiOx growth process and the etch back of the emitter's non-metalized surface, are atom-transfer reactions, such as oxidative addition/reductive elimination, and electron-transfer. A fundamental redox reaction is the "self-exchange" reaction, which involves the degenerate reaction between an oxidizing species and reducing species. There are a relatively large number of organic compounds, such as N-(n-Butyl)pyridinium chloride, and inorganic materials such as $K_3Fe(CN)_6$ that produce an electron exchange, such as the electron exchange between the $Fe^{2+}$ and $Fe^{3+}$ ions.

Many combinations of inorganic metallic or non-metallic oxides, inorganic metallic and non-metallic chlorides, and inorganic metallic and non-metallic fluorides have been found, and utilized, to create RTWCG SiOx growth solutions. The following paragraphs contain a highly condensed body of experimental work which evolved the preferred, simplified, RTWCG growth solutions from the less preferred, more complex solutions, found in prior RTWCG art. The new RTWCG growth solutions introduce less metallic components in the film, have higher growth rates, and are better suited for the large scale production of low-cost, highly efficient, RTWCG SiOx ARC/SE/TO silicon solar cells.

Figure 7:
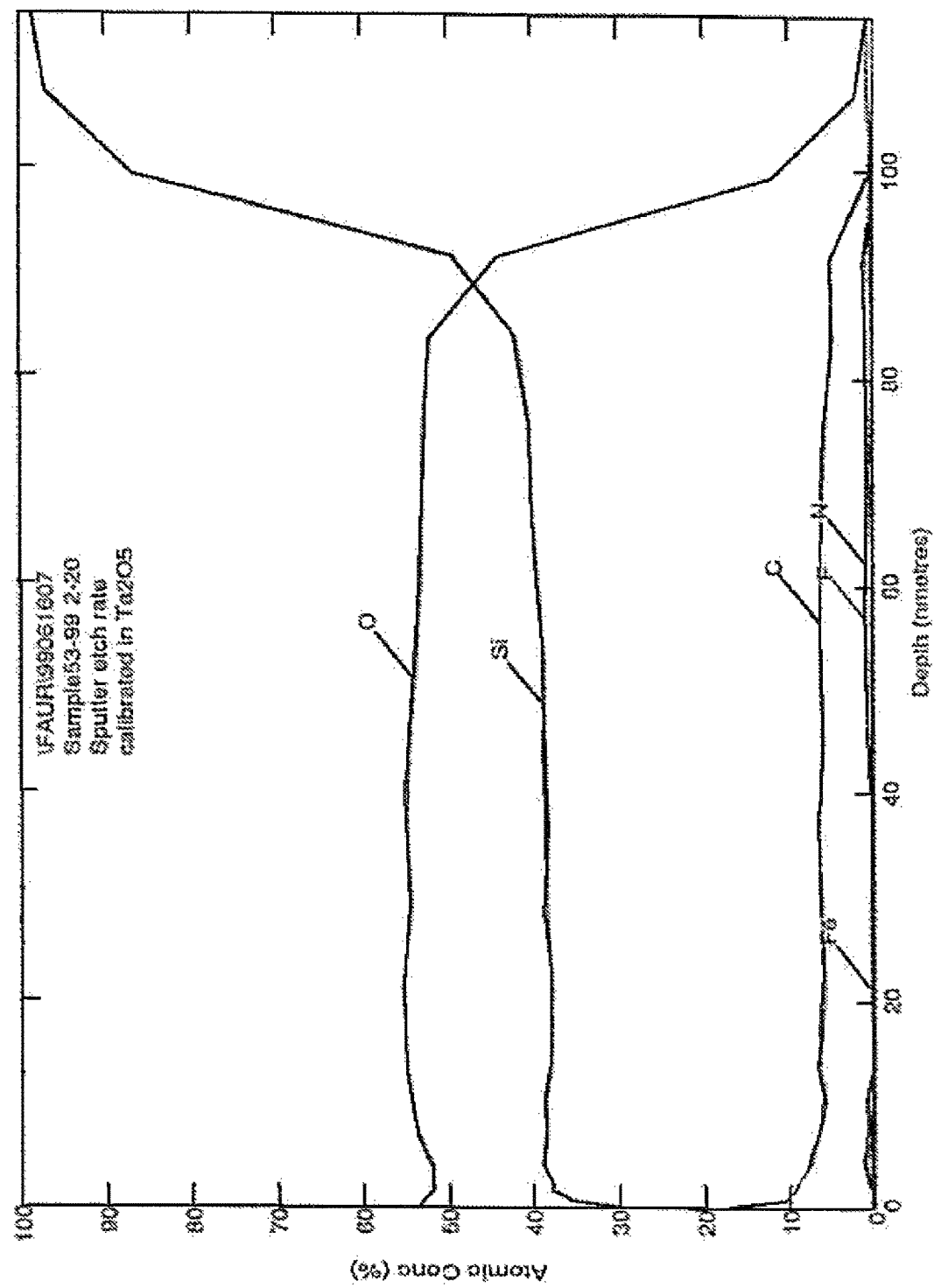
FIG. 7. The XPS depth profile of a prior art RTWCG SiOx thin film.

FIG. 7 shows the XPS depth profile of a prior art RTWCG SiOX thin film grown on a (100) p-Si substrate. The growth solution constituted of: 3 volume parts of 34% $H_2SiF_6$ saturated with silica, 2 volume parts of 60% $H_2TiF_{6(aq)}$, 1 volume part of 5% N-(n-Butyl) pyridinium chloride, and 2 volume parts of 5% $K_3Fe(CN)_6$. The growth solution is not very practical for creating SiOx ARCs in manufacturing environments due to the long growth time of approximately 20 minutes. The Si and O atomic depth profiles were fairly constant making its AM 1.5 AWR value only slightly below that of optimized conventional CVD deposited SiNx ARC films.

Figure 8:
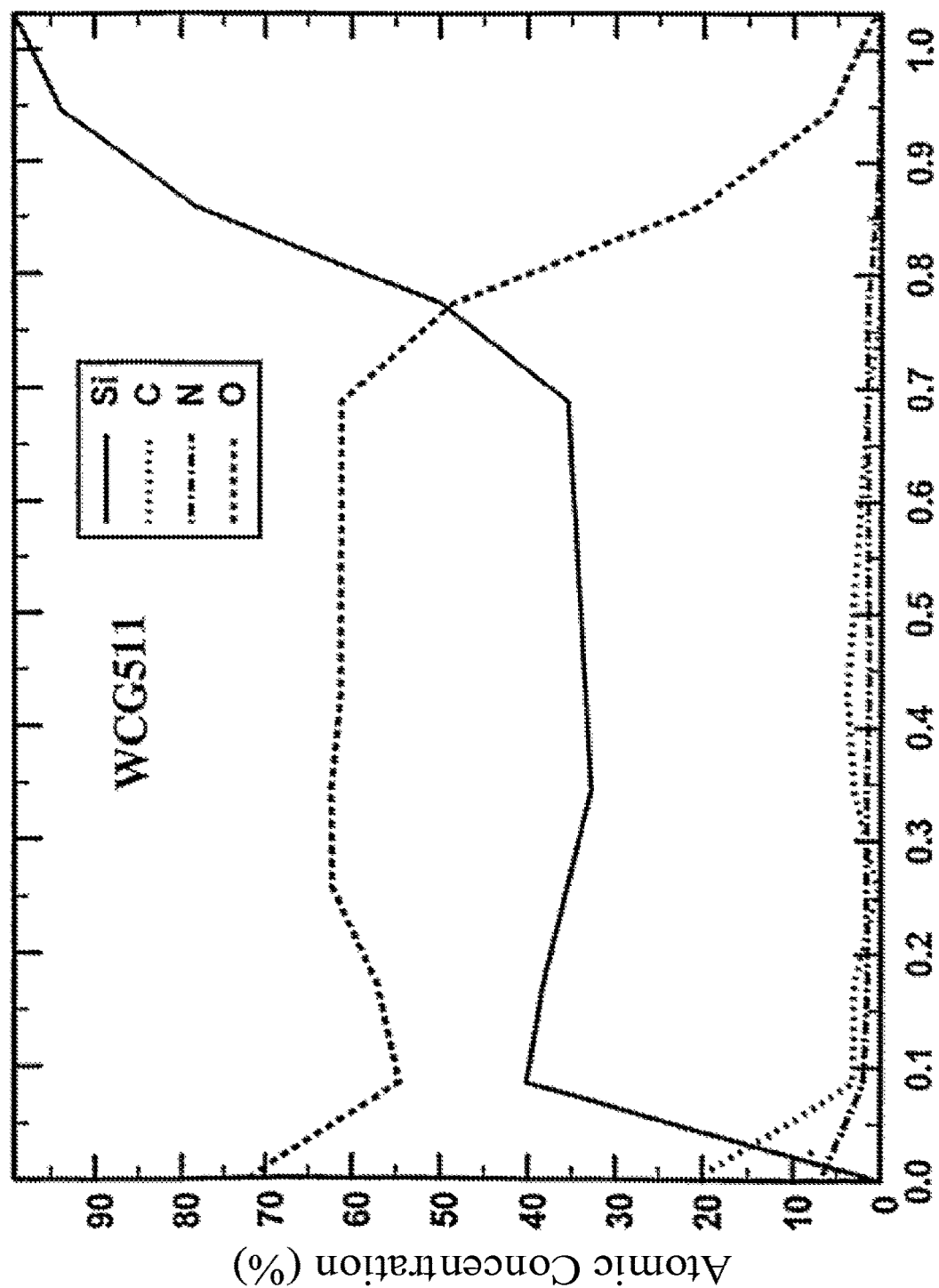
FIG. 8. An AES depth profile showing that the SiOx film improves after all organic components are eliminated.

The film's quality improved after all organic components were eliminated. The AES depth profile in FIG. 8 is of a 110 μm-thick SiOx film grown on a p-Si substrate in 3 minutes by an inorganic growth solution formulation made up of: 5 volume parts of 34% $H_2SiF_{6(aq)}$, 1 volume part of 60% $H_2TiF_{6(aq)}$, and 1 volume part of 5% $K_3Fe(CN)_{6(aq)}$. Due to a relatively low Fe concentration, this SiOx film had good electrical and dielectric properties for solar cell applications. It was one of the first RTWCG solution formulations to be fully compatible with the front and back contact metallization of solar cells. However, the overall reflectance in the visible was only slightly lower than that of the slow growth rate SiOx solution formulation (FIG. 7). The non-metalized portions of the n+-Si emitter's surface was not etched back enough to form a good quality selective emitter. The RTWCG SiOx film's metallic content can be further lowered by being grown in other preferred growth solution formulations, or by adding a short etching step in diluted $HF_{(aq)}$, as shown herein.

Figure 9A:
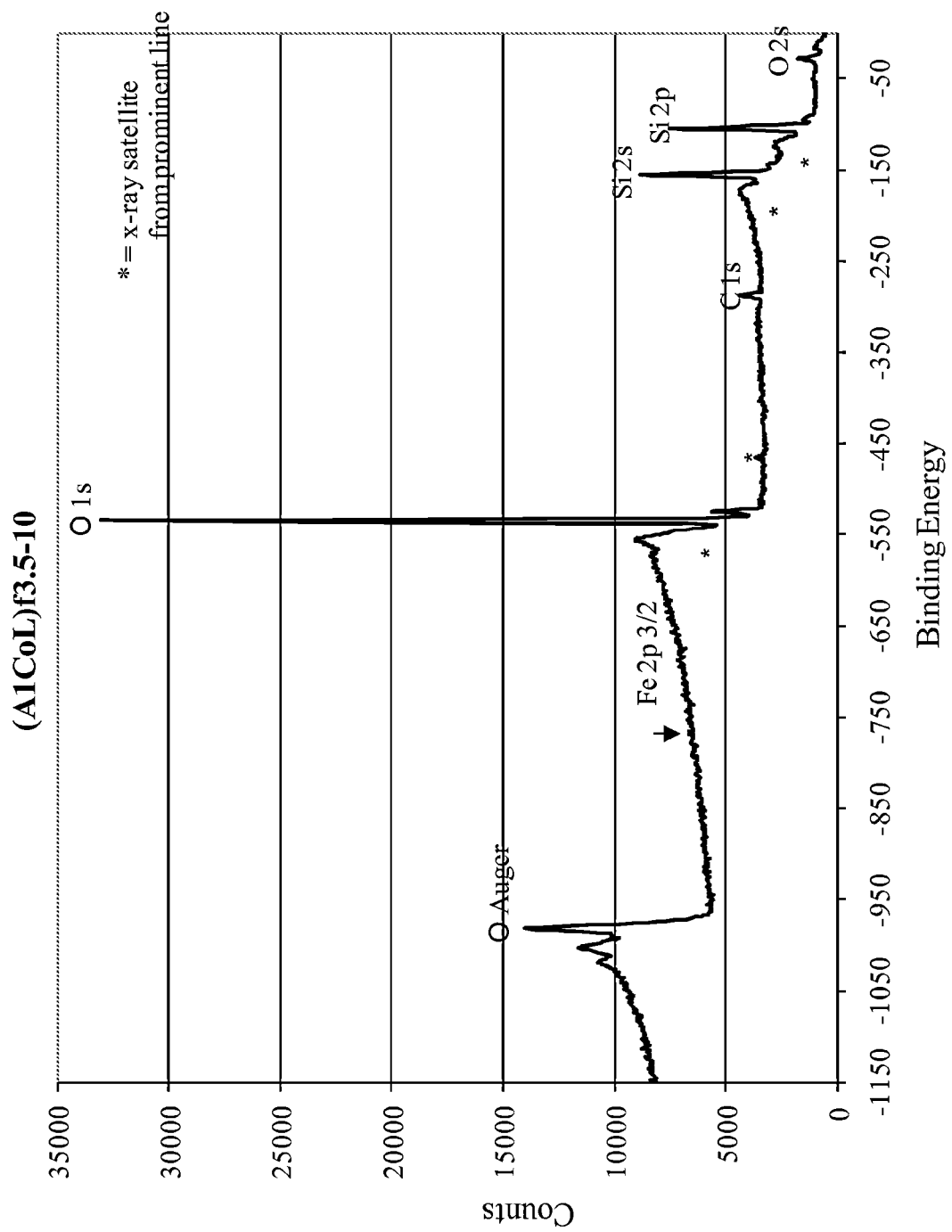
FIG. 9(a). XPS surface survey of an as-grown SiOx film showing only trace levels of metallic impurities.

The preferred solutions that have a Si source component and grow low metallic RTWCG SiOx films are constituted of: 1 to 5 volume parts of 34% $H_2SiF_{6(aq)}$, 1 to 4 volume parts of 60% $H_2TiF_{6(aq)}$, 1 to 4 volume parts of 10% $K_3Fe(CN)_{6(aq)}$, and 1 to 5 volume parts of 20 g $Co(OH)_2$ dissolved in 1 L water. Cobalt improves the optical properties of the resultant SiOx films. A XPS surface survey of an as-grown SiOx film using this preferred solution formulation is shown in FIG. 9(a). Only a trace amount of Fe is found by the high performance XPS system. The low, 5.4%, average reflectance of this SiOx film is explained by the graded index of refraction of the film shown in FIG. 9(b).

The index of refraction at the surface of the as-grown film was found, using ellipsometry, to be approximately 1.4. This value is in good concordance with the atomic chemical composition of the film's surface, where 31.5% is silicon, 62% is oxygen, and 5.6% is carbon. Small amounts of nitrogen, fluorine, trace levels of iron, and other metallic and non-metallic impurities together account for 0.9% of the film's surface composition.

Figure 9B:
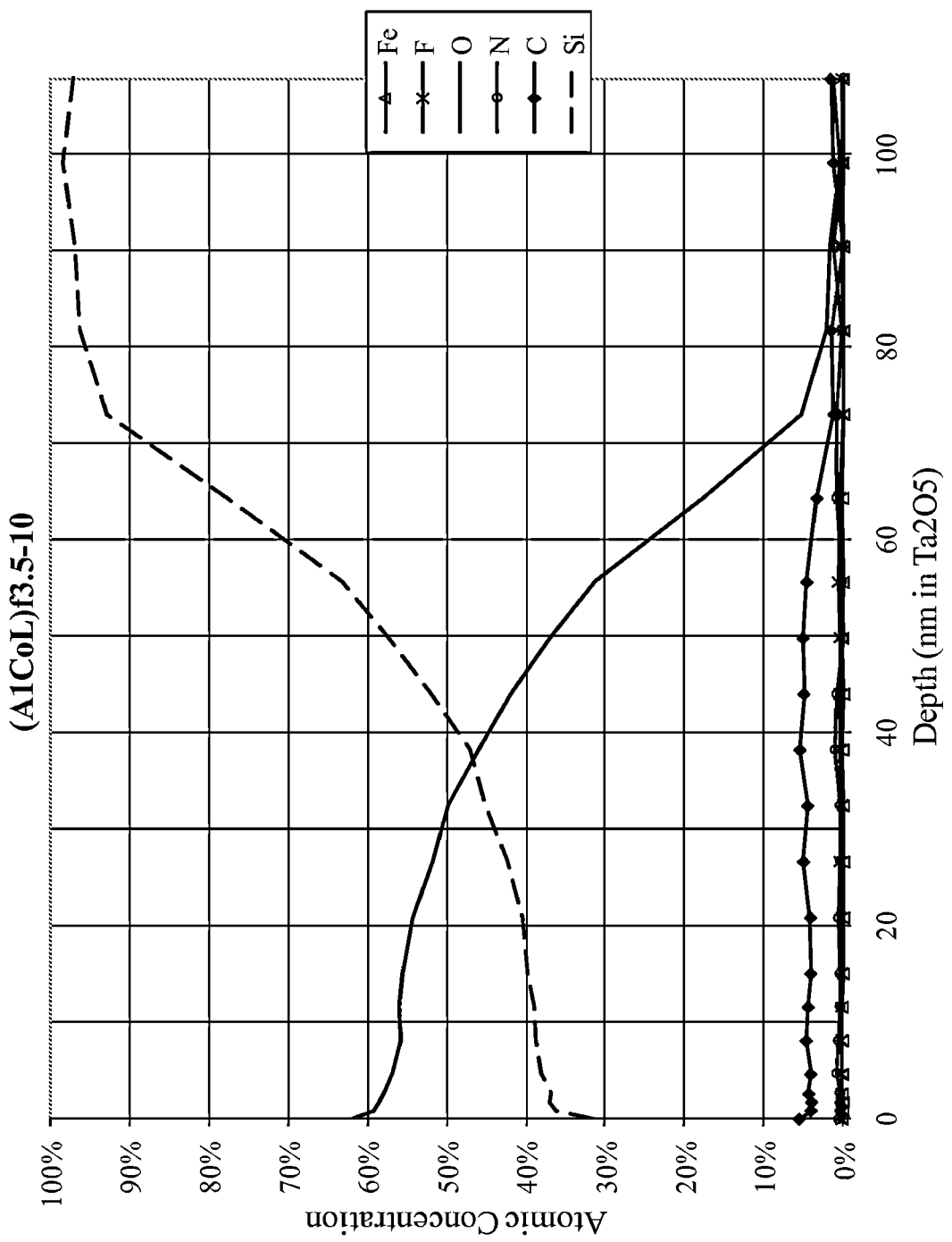
FIG. 9(b). An XPS depth profile for the film in FIG. 9(a). The oxygen concentration gradually decreases with depth while the silicon concentration gradually increases with depth.

As evident in FIG. 9(b), the film's surface is $SiO_2$-rich. However, the SiOx composition becomes gradually more silicon-rich toward the SiOx/Si interface. The SiOx film has a graded index of refraction which increases as a function of depth from about 1.4 at the surface, to about 3.5 at the SiOx/Si interface. This graded index of refraction explains the film's low reflectivity.

Figure 10:
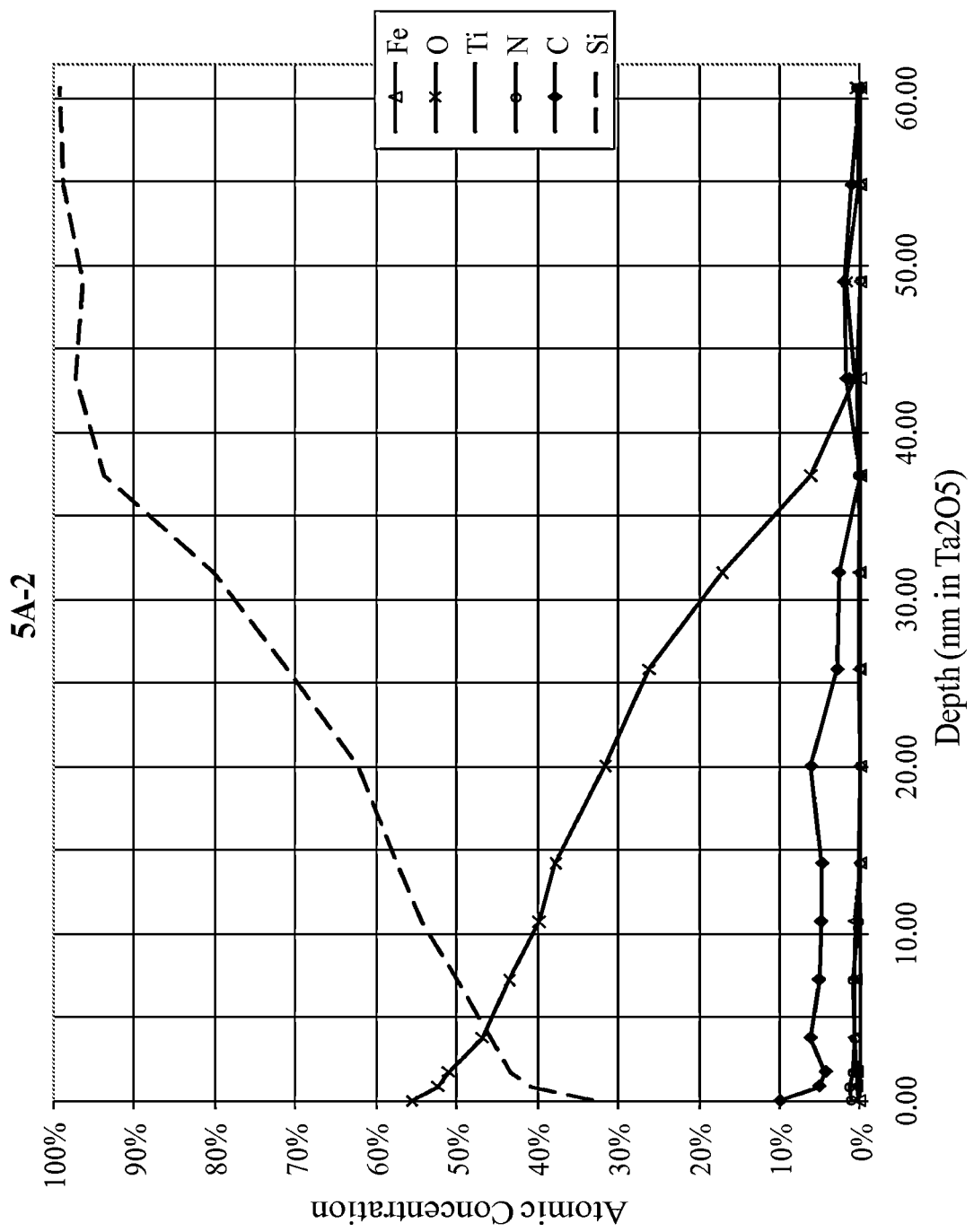
FIG. 10. XPS depth profile of a RTWCG SiOx film. After a short mild etch step the sample's Fe and Ti impurity concentration levels fell below the instrument's detection limit.

TXRT depth profiles of RTWCG SiOx films show that the greatest concentration of metallic impurities is at, or near to, the film's surface, probably due to absorption from the growth solution. After growing the RTWCG film, and the subsequent water rinse, most of the surface metallic contaminants can be removed by a mild $HF_{(aq)}$ etch. The atomic concentrations of the main components of a SiOx film—are shown in the XPS depth profiles in FIG. 10. The film was grown in a solution composed of: 3 volume parts $H_2SiF_6$ saturated with silica, 2 volume parts 60% $H_2TiF_{6(aq)}$, and 2 volume parts 10% $K_3Fe(CN)_{6(aq)}$. The resulting RTWCG SiOx film was rinsed with water and then etched for 15 seconds in a diluted hydrofluoric acid solution; 1 volume part $HF_{(conc)}$ to 64 volume parts $H_2O$. Lastly, the sample was rinsed in DI water and dried with nitrogen. The mild etch resulted in lower levels of metallic impurities. Fe's atomic concentration dropped from about 1.3% to under the instrument detection limit of 0.1%, and likewise, Ti dropped from about 1% to again below the instrument detection limit. As an added bonus, the mild etch created a textured SiOx film surface which lowered the AM 1.5 AWR from an initial value of 4.9% to 3.08%.

Figure 11:
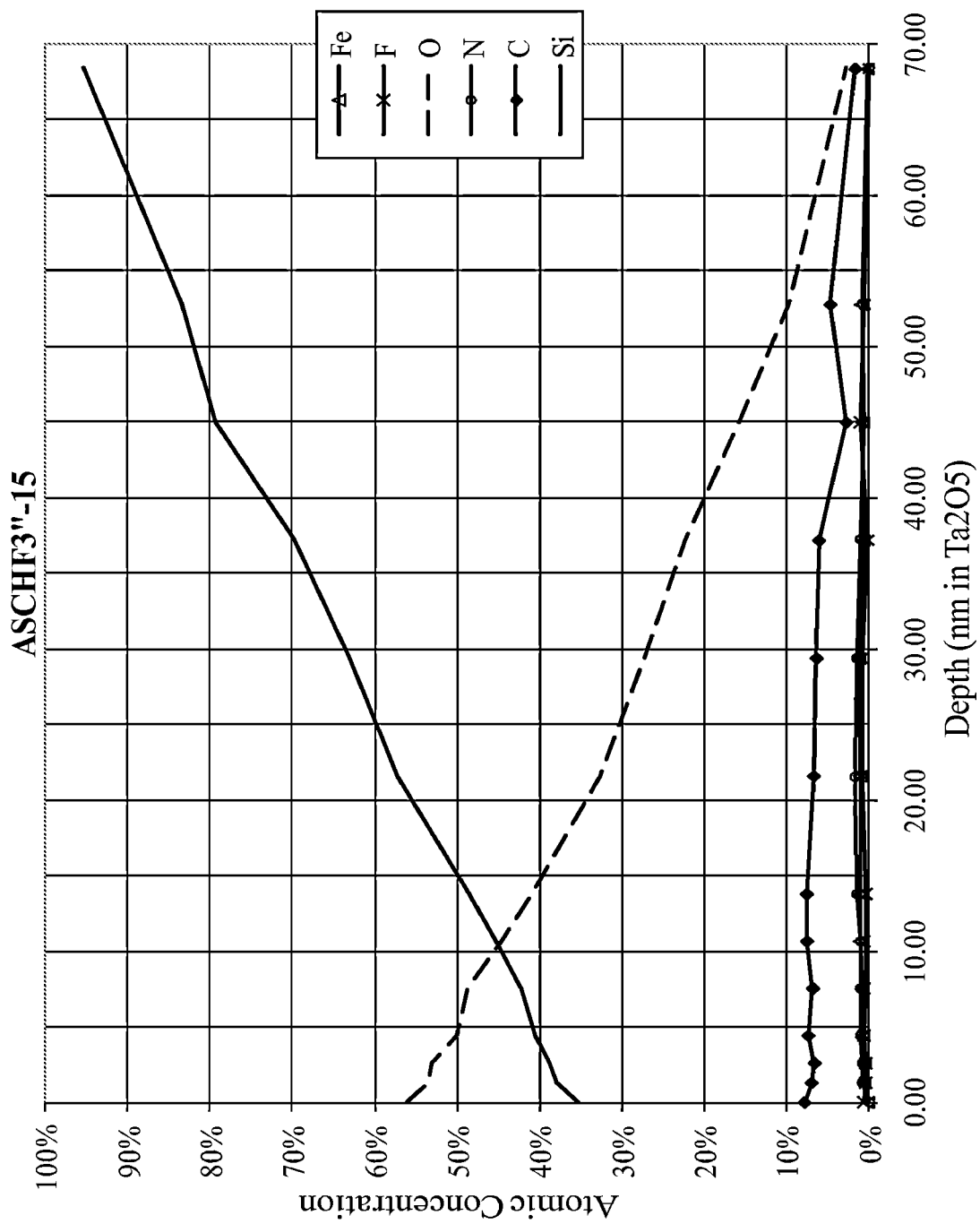
FIG. 11. XPS depth profiles of the main components of a RTWCG SiOx film grown using a RTWCG SiOx solution formulation made of: 2 volume parts $H_2TiF_{6(aq)}$, 2 volume parts colloidal silica supersaturated with $SiO_2$, and 1 volume part 10% $K_3Fe(CN)_{6(aq)}$.

In one or more embodiments, the RTWCG solution is made of 2 volume parts $H_2TiF_6$, 2 volume parts colloidal silica supersaturated with $SiO_2$, and 1 volume part 10% $K_3Fe(CN)_{6(aq)}$. The smooth RTWCG SiOx film grown on a smooth n+/p c-Si wafer had a very low AM 1.5 AWR of 4.78%. The solution created a film which had, similarly to the film from FIG. 10, a gradual increase in Si concentration with depth, see FIG. 11. Its index of refraction increased with depth from a surface value of 1.35 to 3.5 at the SiOx/Si interface. The film's surface carbon has been shown to drastically increase the film's chemical stability but has no large effect on the graded index of refraction.

Figure 12:
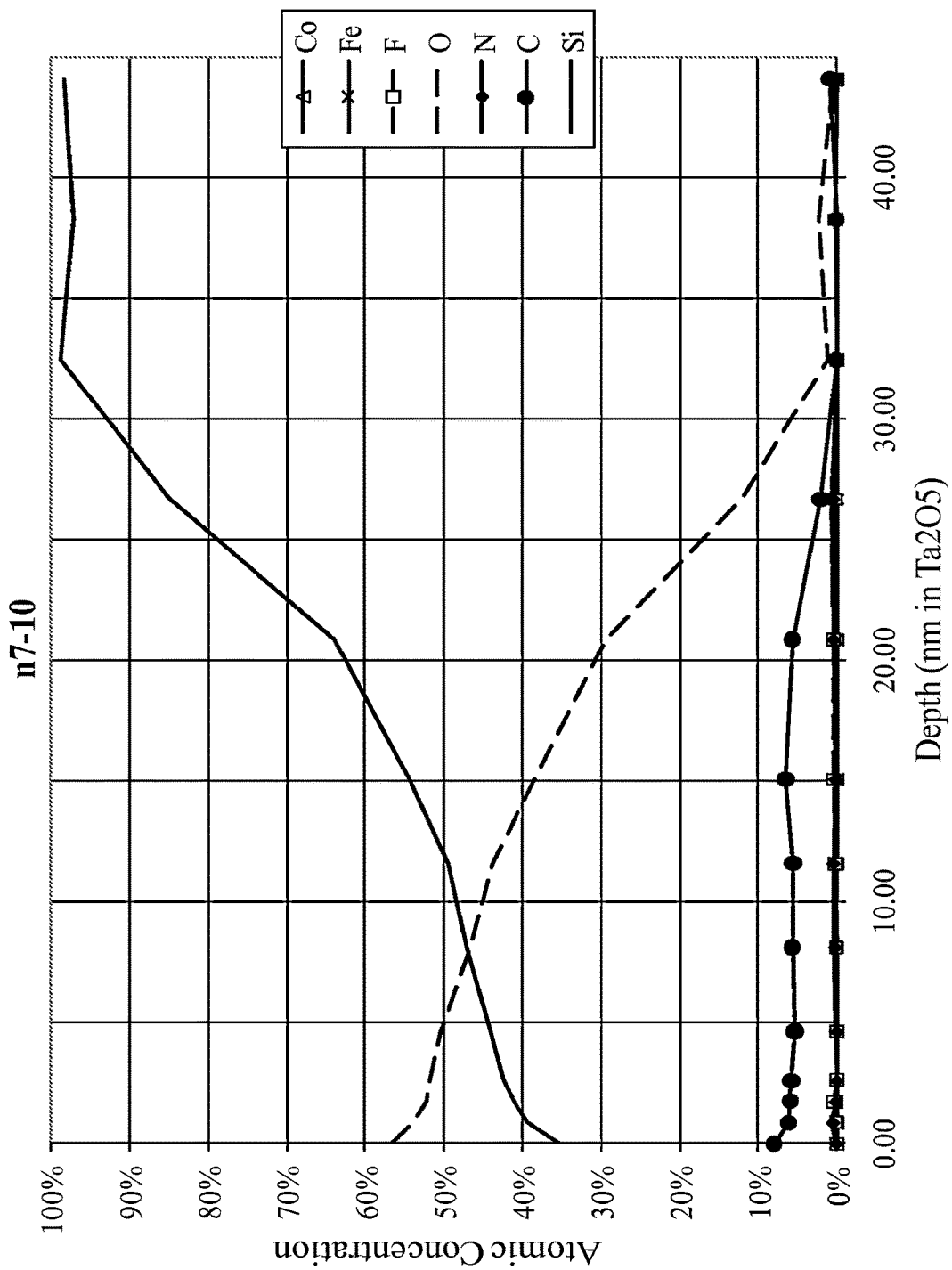
FIG. 12. XPS depth profiles of the main components of a low metallic impurity RTWCG SiOx thin film grown using a RTWCG solution formulation made of 5 volume parts 70% $NH_4SiF_{6\,(aq)}$, 2 volume parts 60% $H_2TiF_{6(aq)}$, 2 volume parts 10% $K_3Fe(CN)_{6(aq)}$, and 3 volume parts of a solution made by dissolving 10 g $Co(OH)_2$ in 1 L 10% $HCl_{(aq)}$.

It has been found that the relatively large surface metallic impurity concentration of up to 1% for as-grown SiOx films was to a great extent introduced by the commercial grade $H_2SiF_6$ silicon source component which is extensively used for the near room temperature liquid phase deposition (LPD) of $SiO_2$ films on silicon and other substrates. Other Si components have been tried to replace the traditional $H_2SiF_6$ silicon source component. FIG. 12 shows the XPS depth profile of a RTWCG SiOx film grown using a growth solution made of 5 volume parts 70% $NH_4SiF_{6(aq)}$, 2 volume parts 60% $H_2TiF_{6(aq)}$, 2 volume parts 10% $K_3Fe(CN)_{6(aq)}$, and 3 volume parts of a solution made by dissolving 10 g $Co(OH)_2$ in 1 L 10% $HCl_{(aq)}$. The as-grown film, on a n+-Si substrate, had Ti and Fe atomic concentrations that were below the XPS detection limit. The 140 nm-thick film had an AM 1.5 AWR, over the 400-1200 nm spectrum, of 5.14%.

The elimination of silicon source components from the RTWCG SiOx growth solution formulation, resulted in increased SiOx growth rates with sufficient etch back depths to form excellent quality selective emitters that preserved the integrity of the screen printed front and back contacts, and a reduction in the resulting SiOx film's metallic impurities concentration. Below are two examples, from among a larger number of such formulations tested.

Figure 13:
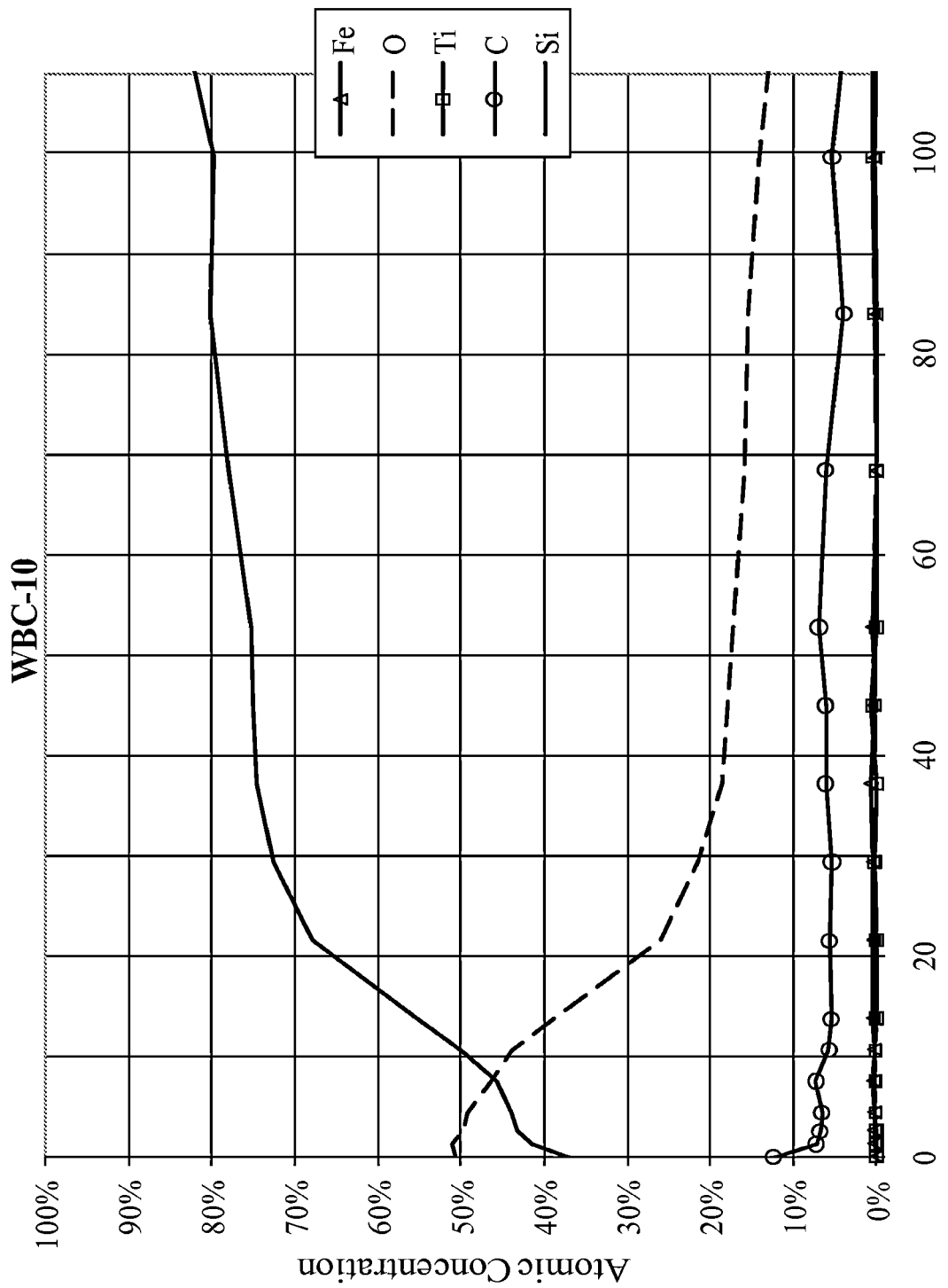
FIG. 13. XPS depth profiles of the main components of a ~400 nm-thick low metallic impurities RTWCG SiOx film grown on a n+c-Si substrate using: 2 volume parts 60% $H_2TiF_{6(aq)}$, 2 volume parts 5% $K_3Fe(CN)_{6(aq)}$, and 3 volume parts $H_2O$.

FIG. 13 shows the XPS depth profile of a low metallic impurities RTWCG SiOx film grown on a n+c-Si substrate using a solution of: 2 volume parts 60% $H_2TiF_{6(aq)}$, 2 volume parts 5% $K_3Fe(CN)_{6(aq)}$, and 3 volume parts $H_2O$. Versions of the above RTWCG solution with varying component concentrations were tested on a large number of n+p c-Si and mc-Si small area silicon solar cells. Good results were obtained from the resulting high quality RTWCG SiOx ARC/SE cell structures. The amounts of metallic impurities contained within the as-grown SiOx films were decreased by longer post-growth water rinse times. The atomic concentration of the Fe and Ti metallic impurities were under 0.1% and formed either Si-Me or Me-O bonds, as found by the XPS binding energies of oxygen, silicon, titanium, and iron peaks.

The thickness of the non-metalized emitter surface which is etched back during RTWCG SiOx growth is dependent on the solution's concentration, which can be altered to produce good quality selective emitters while growing optimal thicknesses of SiOx ARC films. For instance, a particular formulation was constituted of relatively high concentrations of $H_2TiF_{6(aq)}$ and $K_3Fe(CN)_{6(aq)}$. The growth time for a 140 nm-thick SiOx ARC film on smooth n+/p c-Si emitter surfaces was approximately 50 seconds. The solution produced a film with an AM 1.5 AWR of 6.45%, and etched back a depth of 0.18-0.22 µm from the non-metalized emitter surface.

Figure 14:
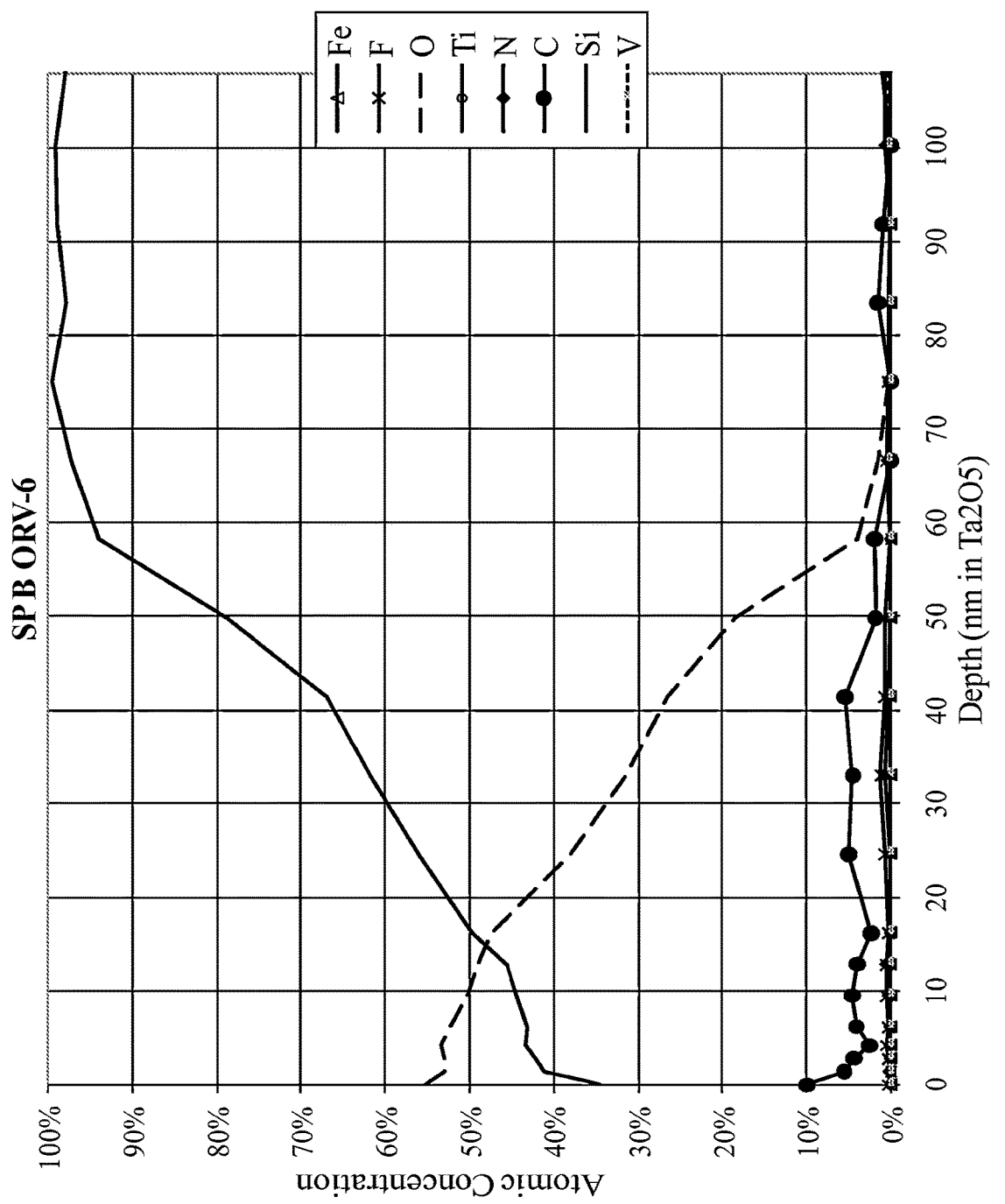
FIG. 14. XPS depth profiles of the main components of a low metallic impurity RTWCG SiOx thin film grown on a n+c-Si substrate using a RTWCG solution formulation made of 1-3 volume parts 60% $H_2TiF_{6(aq)}$, and 1-3 volume parts 1-5 g $V_2O_5$ per 1 L 10% $HCl_{(aq)}$.

FIG. 14 shows the XPS depth profiles of the components of a low metallic impurities RTWCG SiOx film grown on a n+c-Si substrate by a preferred growth solution of 1 to 3 volume parts of 60% $H_2TiF_{6(aq)}$ and 1 to 3 volume parts of 1-5 g $V_2O_5$ dissolved in 1 L 10% $HCl_{(aq)}$, hereafter called the VT solution. The VT solution meets all the necessary requirements for the formation of good quality RTWCG SiOx ARC/SE, and has provided one of the highest gains in efficiency. It is fully compatible with the front and back surface metallization. Metallic impurities, concentrated mostly on the film's surface, were found to have concentrations below the instrument detection limits of NASA Glenn's high resolution XPS system.

Smooth, 120-150 nm-thick, SiOx films were grown on heavily doped n+ surfaces by growth solutions such as utilized in FIG. 13 and FIG. 14. Their as-grown AM 1.5 AWR values of 5% to 9% were lowered by an additional TO formation step. The smooth SiOx films were highly transparent to visible radiation especially toward the lower wavelength end of the 400-1200 nm AM 1.5 solar spectra. It is at the lower wavelength end that all other standard single layer and, especially, multi-layer ARC's absorb the most. Examples of realization will show that the absorption of visible light is below 1% even for 240 nm-thick SiOx films.

By a wide margin, the most costly component of VT, and related, growth solutions is the 60% $H_2TiF_{6(aq)}$ component. Moreover, it has been observed that there are quality issues between batches of the chemical, especially if obtained from different vendors. For reasons of economy and quality control, this component has been created in the lab. Anywhere from 10 g to 275 g of technical grade $TiO_2$ anatase were dissolved per liter of 10%-50% $HF_{(aq)}$. Into this, 2 g to 50 g $V_2O_5$ were either added directly, or were first dissolved in 10% to 30% $HCl_{(aq)}$ and mixtures of different ratios of $V_2O_5/HCl_{(aq)}$ to $H_2TiF_6/HF_{(aq)}$ were created. Ultra-high purity water, semiconductor grade HF, and semiconductor grade HCl were used.

SiOx growth solutions containing higher concentrations of the V+ ion component produce the SiOx film at increasingly higher growth rates. Table 1 shows the length of time necessary to create the simultaneous RTWCG SiOx ARC/SE/TO cell structures on a n+-Si substrate. A SiOx thickness from 130-150 nm (see Table 1), takes from less than 1 second to about 15 seconds, depending on the amount of $TiO_2$ source added to a constant amount of $V_2O_5$ component. In this, and many other similar experiments, the SiOx thickness was estimated from a pre-established color code and/or by using Dektak profiles of photoresist masked silicon surfaces.

TABLE 1

Time necessary for several growth solutions to grow a metallic blue RTWCG SiOx film. The concentration of the $V_2O_5$ component was kept constant (52 g/L) while the concentration of the $TiO_2$ anatase component was varied.

| Concentration $TiO_2$ Dissolved in HF (conc) | Concentration $V_2O_5$ Dissolved in HF (conc) | Oxidation Time for 150 nm SiOx Thickness |
|---|---|---|
| 373 g $TiO_2$/L | 52 g $V_2O_5$/L | 15 seconds |
| 298 g $TiO_2$/L | 52 g $V_2O_5$/L | 3 seconds |
| 224 g $TiO_2$/L | 52 g $V_2O_5$/L | 1 seconds |
| 149 g $TiO_2$/L | 52 g $V_2O_5$/L | <1 seconds |
| 75 g $TiO_2$/L | 52 g $V_2O_5$/L | <1 seconds |

The ultra-high growth rates in Table 1 are a challenge to control in an industrial setting due to minor differences in growth time between the leading parts of the cell and the lagging parts of the cell. In one or more embodiments, the solution is tailored to grow the ARC/SE/TO structures in at least 20 seconds, and most preferably from 25 seconds to 1 minute.

Figure 15:
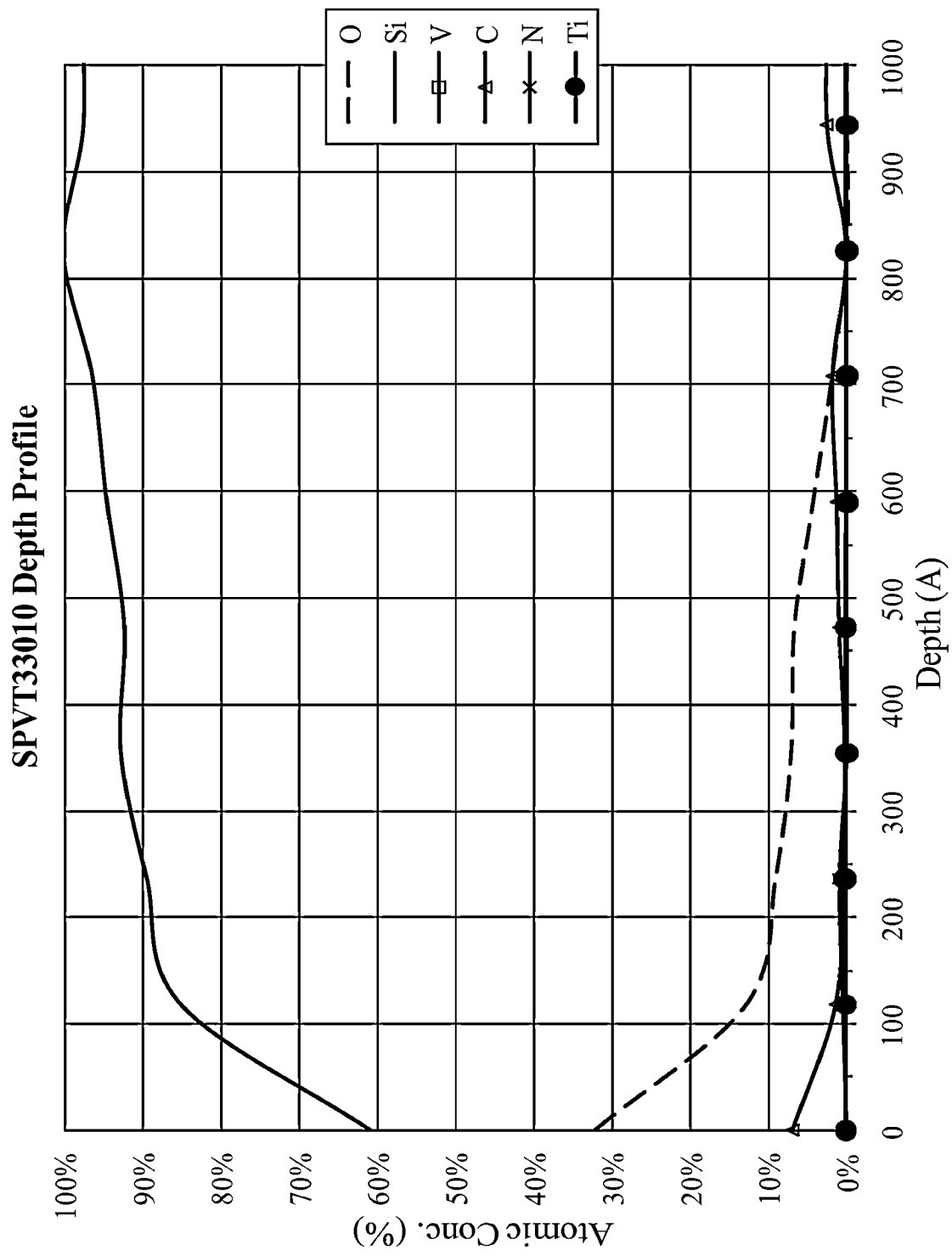
FIG. 15. XPS depth profiles of the main components of a low metallic impurity RTWCG SiOx thin film grown on a n+ c-Si substrate using an ultra-low-cost RTWCG solution formulation made of 1 volume part of a solution of 10 g $TiO_2$ anatase dissolved in 20% $HF_{(aq)}$ and 1 volume part of a solution of 3.5 g $V_2O_5$ dissolved in 1 L 10% $HCl_{(aq)}$.

FIG. 15 shows the XPS depth profile of the main components of a low metallic impurity RTWCG SiOx film grown on a heavily phosphorus doped n+c-Si substrate. The ultra-low cost growth solution used to create the film was constituted of: 1 to 3 volume parts of 10 g/L of $TiO_2$ anatase dissolved in 15% to 30% $HF_{(aq)}$, and 1 to 2 volume parts of 3.5 g/L $V_2O_5$ dissolved in 10% $HCl_{(aq)}$. The time required for this solution to grow 130-150 nm-thick RTWCG SiOx films is between 20-30 seconds.

Higher growth rate solutions, such as was used in FIG. 15, are more silicon-rich, even at the film's surface, as compared to lower growth rate solutions. For this reason, the faster growth solutions create films with a surface index of refraction as high as 2.2 which increases gradually to 3.5 at the SiOx/Si interface. The concentration of silicon gradually increases toward the SiOx/Si junction, while its atomic concentration of oxygen gradually decreases as a function of SiOx depth. Although the reflectance of these Si-rich SiOx films are higher than the reflectance of the SiOx films in FIG. 10, their AM 1.5 AWR is still well below 10%. These Si-rich SiOx films are more transparent in the visible spectra than any other state of the art single layer, and much more transparent than multi-layer ARC's.

High growth rate, ultra-low cost, solutions that produce a 150 nm-thick good quality RTWCG SiOx film, have been made by dissolving a single metallic oxide, metallic chloride, or metallic fluoride component in various concentrations of aqueous HF. Oxides of transitional metallic elements, described herein, are the preferred metallic oxide components. The SiOx growth rate increases with higher concentrations of the metallic oxide component, and, to a lesser extent, the concentration of the HF used.

Figure 16:
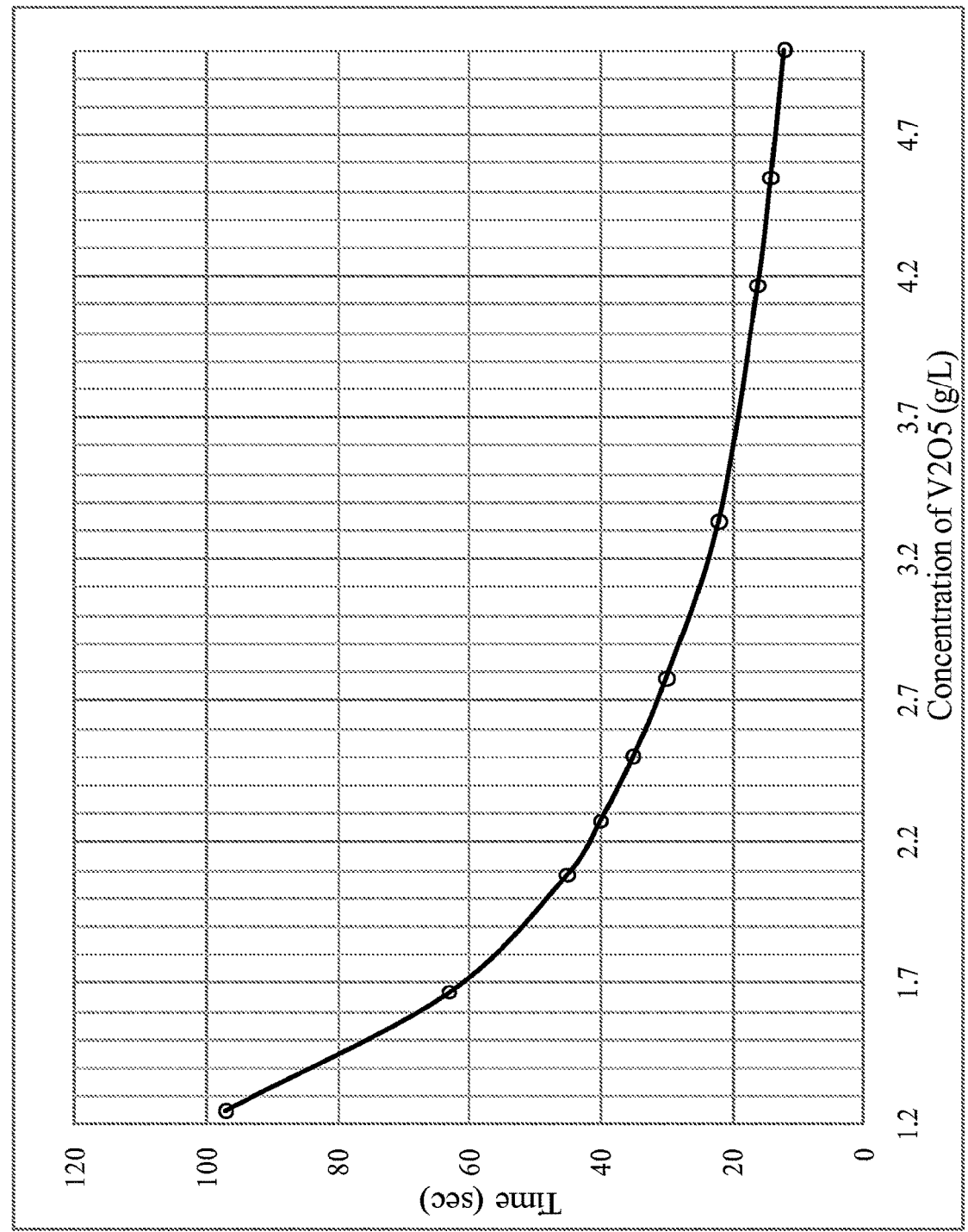
FIG. 16. Graph of the time required for a RTWCG growth solution of varying concentrations of $V_2O_5$ dissolved in 50% $HF_{(aq)}$ to grow a metallic blue, 130-150 nm-thick, SiOx film.

Vanadium pentoxide dissolved in $HF_{(aq)}$ is an example of a growth solution created by dissolving a metallic oxide component in HF. FIG. 16 shows the length of time required to grow 130 to 150 nm-thick RTWCG SiOx films on a heavily phosphorous doped silicon substrates versus normalized quantities of $V_2O_5$ dissolved in 50% $HF_{(aq)}$. The SiOx growth rate is to a much greater extent dependent on the $V_2O_5$ concentration in HF, and to a lesser extent on the dilution of the aqueous HF solution. Solutions of varying quantities of $V_2O_5$ were dissolved in varying $HF_{(aq)}$ concentrations. On similar heavily phosphorus doped n+-Si substrates, 140 nm-thick SiOx films were grown using different growth solutions. The time required to form the film was measured and the results are shown in Table 2. As can be seen, there is only a relatively small decrease in growth time for solutions with constant quantities of $V_2O_5$ dissolved in increasingly stronger HF concentrations. Solutions of increasingly larger $V_2O_5$ quantities dissolved in equal concentrations of HF show a much more pronounced decrease in growth time.

Growth solutions with a $V_2O_5$ concentration of less than 7.5 g $V_2O_5$/L $HF_{(aq)}$ produce SiOx films with an atomic concentration of vanadium that is less than 0.1%. Solutions, such as in Table 2, that have higher $V_2O_5$ concentrations produce SiOx films with progressively increasing atomic concentrations of metallic vanadium. Because of this, and the quality control issues created by ultra-high growth rate solutions which grow a 140 nm-thick SiOx film in under 10 seconds, the preferred $V_2O_5$ concentration is below 7.5 g $V_2O_5$/L $HF_{(aq)}$, and the preferred HF concentration is between 10% and 30%.

TABLE 2

Time required to grow metallic blue RTWCG SiOx films using a growth solution with varying amounts of the catalyst $V_2O_5$ dissolved in varying concentrations of $HF_{(aq)}$.

| Grams of $V_2O_5$ per Liter of HF | Growth Time Required to Grow 140 nm-Thick (metallic blue) RTWCG SiOx Films Using the Following Concentrations of HF: | | | |
|---|---|---|---|---|
| | 10% $HF_{(aq)}$ | 20% $HF_{(aq)}$ | 30% $HF_{(aq)}$ | 40% $HF_{(aq)}$ |
| 1.5 g $V_2O_5$/L HF | 185 seconds | 180 seconds | 180 seconds | 130 seconds |
| 3.0 g $V_2O_5$/L HF | 54 seconds | 51 seconds | 45 seconds | 44 seconds |
| 4.5 g $V_2O_5$/L HF | 23 seconds | 22 seconds | 26 seconds | 24 seconds |
| 6.0 g $V_2O_5$/L HF | 16 seconds | 14 seconds | 13 seconds | 12 seconds |
| 7.5 g $V_2O_5$/L HF | 16 seconds | 11 seconds | 11 seconds | 8 seconds |
| 9.0 g $V_2O_5$/L HF | 16 seconds | 7 seconds | 6 seconds | 5 seconds |
| 10.5 g $V_2O_5$/L HF | 16 seconds | 7 seconds | 6 seconds | 5 seconds |
| 12.0 g $V_2O_5$/L HF | 12 seconds | 5 seconds | 5 seconds | 4 seconds |

Figure 17A:
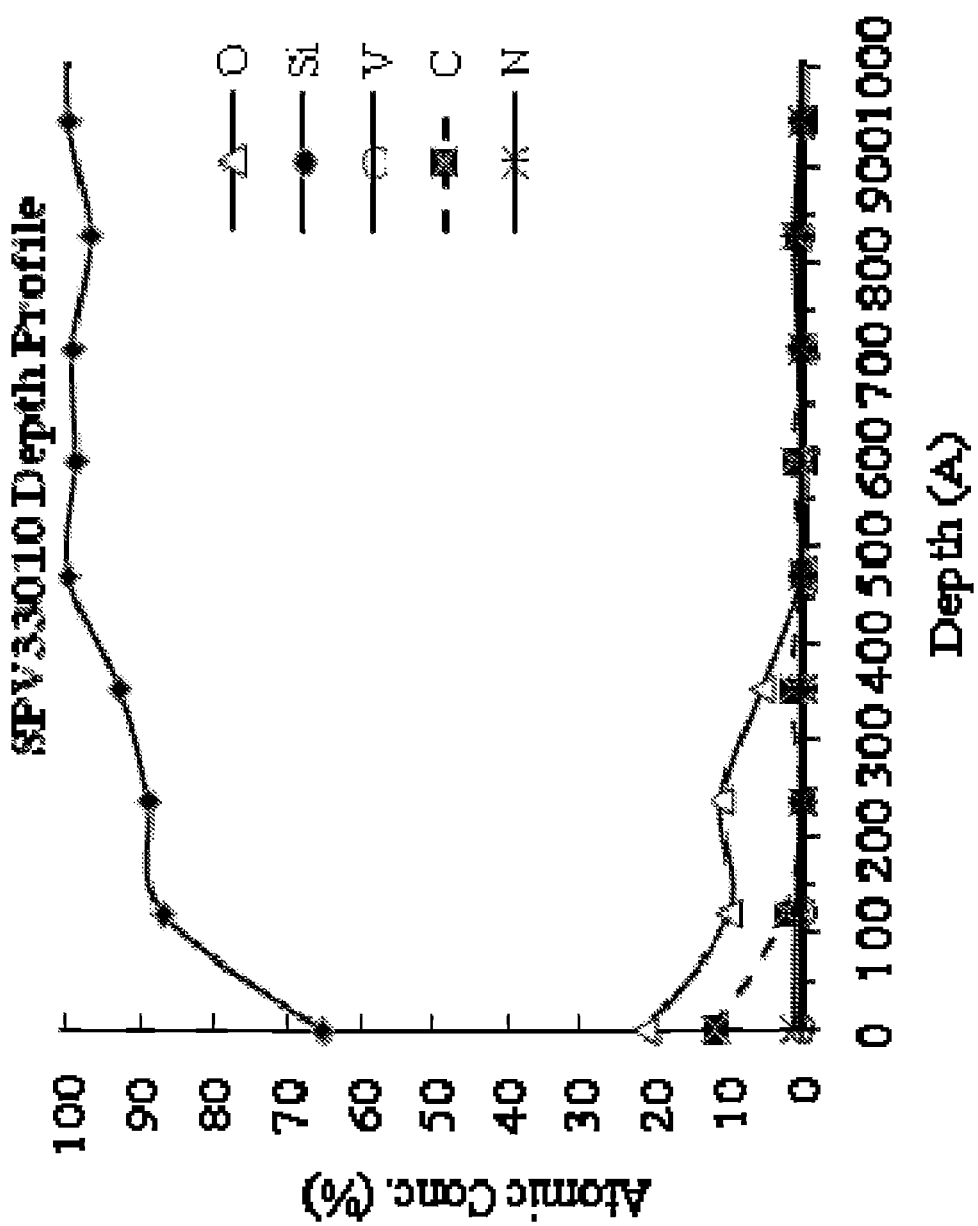
FIG. 17(a) The XPS depth profiles of the main components of a RTWCG SiOx film, created by a growth solution such as in FIG. 16, on a n+ c-Si substrate.
Figure 17B:
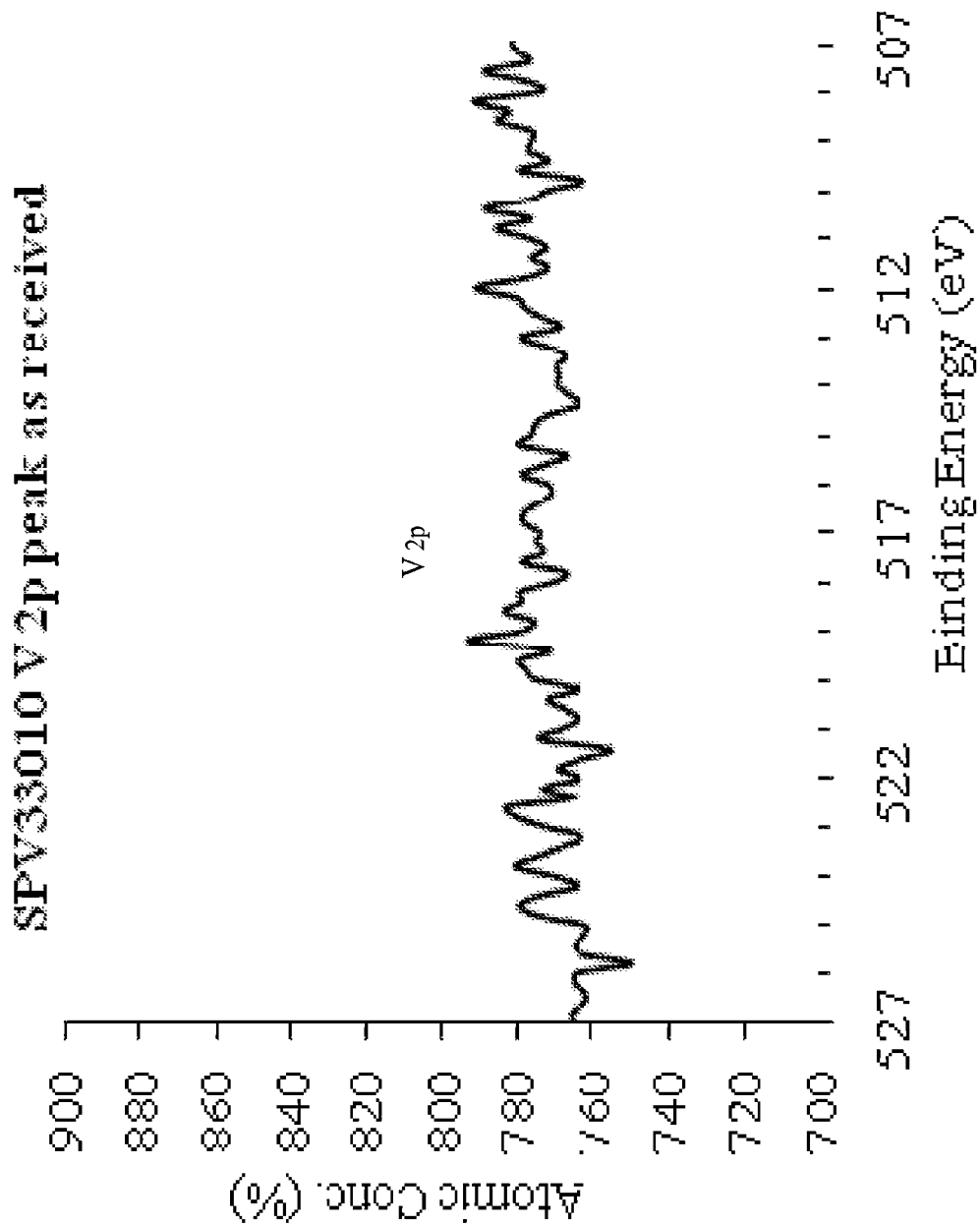
FIG. 17(b) The V $2p$ peak of a RTWCG SiOx film grown in a growth solution such as in FIG. 16.

SiOx FIG. 17(a) shows a XPS depth profiles of the main components of a low metallic impurities RTWCG SiOx film grown by a $V_2O_5$/50% $HF_{(aq)}$ growth solution. In about 30 seconds an approximately 140 nm-thick film was grown on a n+ c-Si substrate. As can be seen, this fast growing SiOx film is silicon-rich, and has graded silicon and oxygen depth profiles. In FIG. 17(b) the vanadium peak is shown to be at the background level, and therefore, below the 0.1% instrument detection limit of the XPS system.

Figure 18:
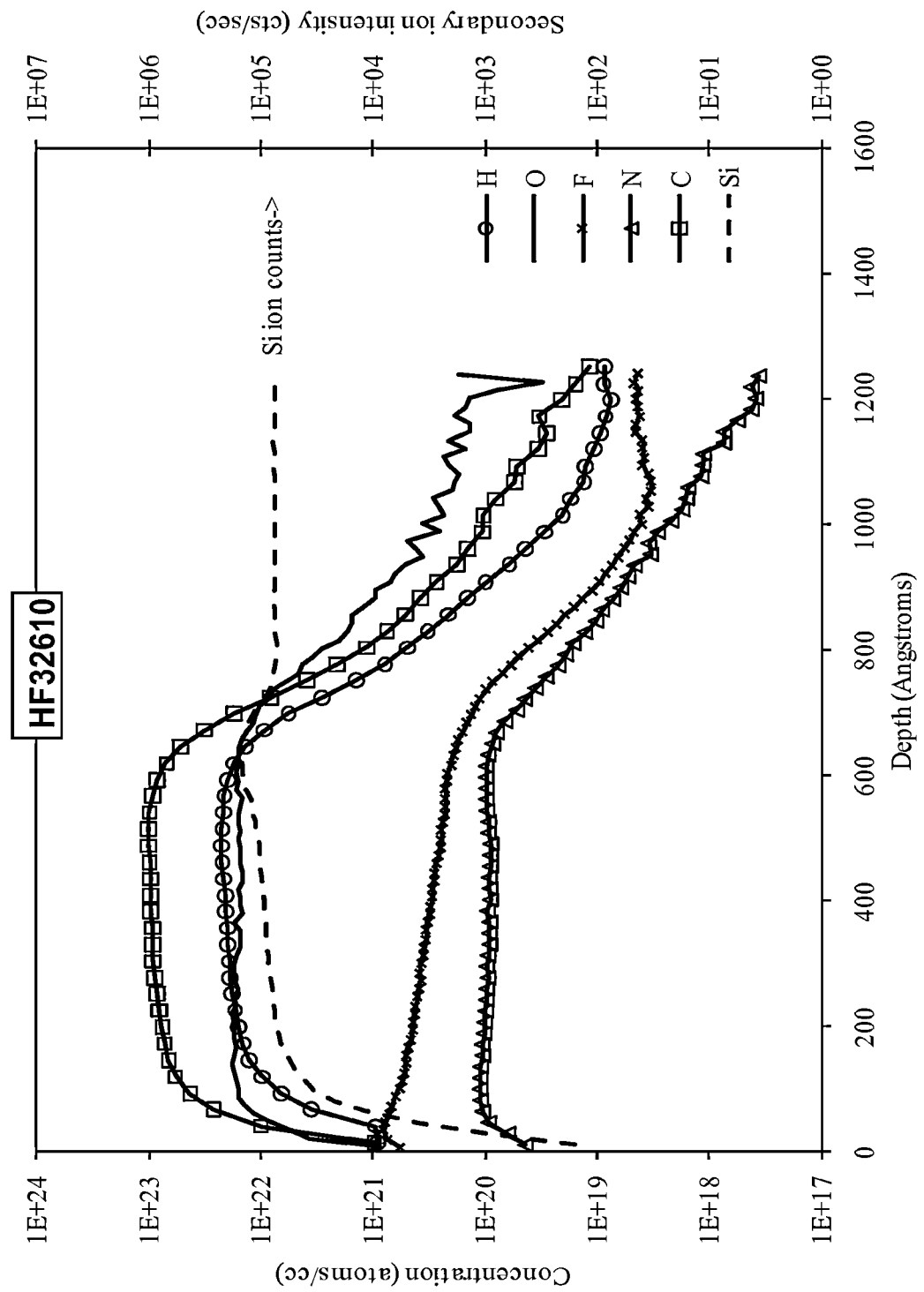
FIG. 18. SIMS diffusion profiles of the main, non-metallic, impurities found in a RTWCG SiOx film grown in 30 seconds in a growth solution made by dissolving 1.7 g $V_2O_5$ per 1 L 50% $HF_{(aq)}$.

As is well known in the art, XPS, AES, and other surface analysis techniques cannot detect elements such as hydrogen that have a low atomic number. However, SIMS can be successfully employed to determine the amount of hydrogen, as well as other impurities, present in the RTWCG SiOx films. FIG. 18 shows the SIMS atomic concentration depth profiles of the main, non-metallic, impurities found in a fast growing, Si-rich, SiOx film which was grown in a solution of similar formulation to the solutions used for FIG. 16. The film had a relatively high atomic concentration of carbon, a relatively low atomic concentration of hydrogen, and even lower fluorine and nitrogen atomic concentrations.

The carbon atomic concentration of the RTWCG SiOx film (FIG. 18) is significantly higher than the atomic concentration of, known in the art, low temperature SiOx depositions. For example, the carbon atomic concentration of the RTWCG SiOx film is up to two orders of magnitude higher than the carbon atomic concentration of the "Extra Low-temperature $SiO_2$ Deposition Using Aminosilanes" (I. Suzuki et all) which utilize the, known in the art, "atomic layer deposition (ADL)" at a temperature of 250° C. However, the atomic concentration of hydrogen, and nitrogen of the RTWCG SiOx and the $SiO_2$ ADL films are practically identical.

Since the RTWCG SiOx is a room temperature process, the atomic concentration of hydrogen gradually decreases with depth toward the SiOx/Si interface. This suggests that the, known in the art, hydrogen passivation effect is minimal at the SiOx/Si interface and, obviously, non-existent in the silicon bulk. However, the I-V characteristics of small area MOS devices, discussed herein, have shown that by heating the substrates, after the RTWCG SiOx growth, at a relatively low temperature of about 200° C., some of the hydrogen in the SiOx film passivates well the SiOx/Si interface. Heating the SiOx film at higher temperatures can passivate even some of the silicon bulk defects.

Experiments on a large number of small area solar cells have shown that the RTWCG of Si-rich SiOx films such as in FIGS. 15 and 17 in ultra-low cost, high growth rate, RTWCG growth solutions, offers a good compromise between cost and electrical and dielectric properties. They may be preferred for the formation of good quality RTWCG SiOx ARC/SE/TO crystalline silicon solar cell structures on lower cost solar grade c-Si, mc-Si or poly-Si substrates. Although the resulting films have a somewhat higher reflectance, the SiOx films grown by these solutions have low metallic concentrations and are compatible with the metallization present on solar cells. Similarly to other RTWCG SiOx growth solutions, the good quality SE and TO efficiency enhancement features are concomitantly created.

Aside from the RTWCG SiOx preferred solution formulations for solar cell applications that utilize Fe, Ti, V, and Co ions, there are a large variety of other $Me^{+n}/Me^{+(n+m)}$ ions where n is from 0 to 4, and m is from 1 to 4. Specific examples include, but are not restricted to, metallic ions such as: Ti, Co, V, Cr, Fe, Ni, Cu, Y, Sr, Ce, Ba, Zr, Nb, Ru, Rh, and Pd. Some of these ions, however, only weakly catalyze the growth of SiOx making them impractical for high volume solar cell fabrication. For instance, the fastest Nb:HF growth solution formulation takes 40 min to grow the necessary thickness for a RTWCG SiOx ARC film.

Chemicals containing metal groups (e.g. $K_3Fe(CN)_6$, $V_2O_5$, $TiO_2$ anatase, $Co(OH)_2$, etc.) are dissolved in acidic solutions to create growth formulations that enhance the growth of the SiOx-based thin film while creating a good quality selective emitter. The preferred solutions contain $HF_{(aq)}$ of various concentrations, and may contain combinations of various concentrations of other acids such as HCl, $H_2SO_4$, and $HNO_3$. Whereas the HF component is used to etch back the emitter, other acids may be desired to dissolve certain metallic ion components that do not readily dissolve in HF.

Figure 19:
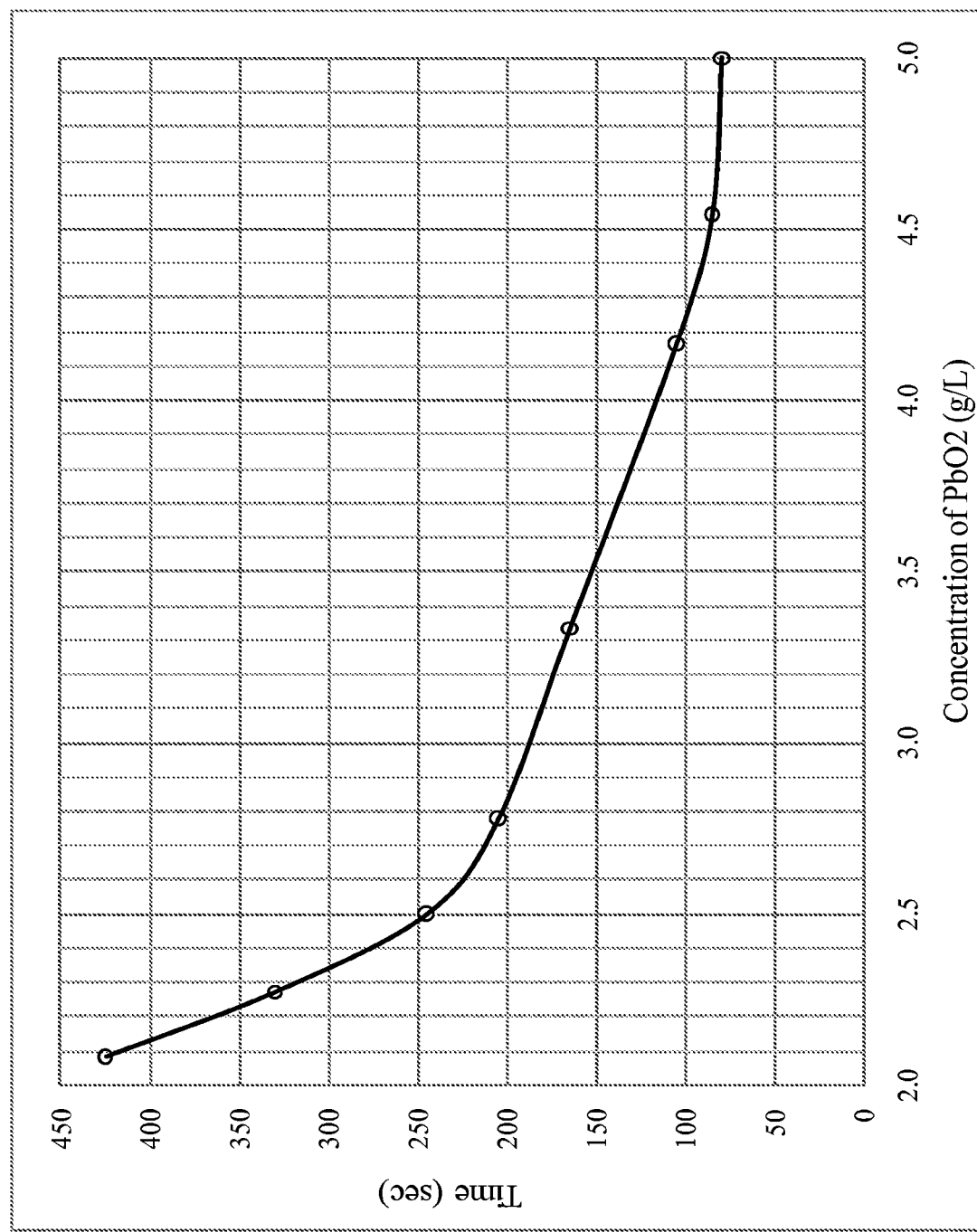
FIG. 19. Plot of the time required to grow 130-150 nm-thick RTWCG SiOx films on heavily phosphorous doped silicon substrates versus the normalized quantity of $PbO_2$ dissolved in 50% $HF_{(aq)}$.

Group IV, $Sn^{4+}$ and $Pb^{4+}$ ions dissolved in $HF_{(aq)}$ are relatively strong homogeneous RTWCG SiOx catalysts. In a preferred embodiment of the invention, the Pb-based RTWCG SiOx growth solution is made by dissolving 3-7.5 g of $PbO_2$ per 1 L of 10%-50% HF. As with all other growth solution formulations, see FIG. 19, the SiOx growth rate depends on the concentration of the catalyst in solution.

A low cost RTWCG SiOx growth solution that grows a very uniform metallic blue (130 nm-150 nm thick) SiOx layer on heavily phosphorous doped n+-Si substrate in 80 seconds, can be made by dissolving 4.5 g $PbO_2$ in 1 L of 50% $HF_{(aq)}$. The resulting film contains only trace (if any) atomic concentrations of Pb and has good electronic/optical properties. The thickness of the emitter which is etched back by the solution can be adjusted by varying the $HF_{(aq)}$ concentration between 10%-50%, to produce a good quality selective emitter. There are many co-catalysts which can increase its growth rate without significantly increasing the resulting film's metallic impurity concentration; examples are Ti, Co, V, and Fe-based compounds.

Aqueous HF solutions containing several oxidizing ions including, but not restricted to, $MnO_4^-$ and $Cr_2O_7^{2-}$ can also be used as homogeneous catalysts for the growth of RTWCG SiOx films.

In an effort to develop the most effective, lowest cost, and environmentally benign RTWCG growth solutions, non-metallic catalysts have been successfully utilized to grow SiOx on n+/p c-Si and mc-Si surfaces. Group VII Chlorine, Fluorine, Iodine, and Bromine ions in aqueous acidic solutions can be used in RTWCG SiOx growth solutions. According to one or more embodiments, RTWCG SiOx growth solutions are prepared by dissolving iodine pentoxide ($I_2O_5$) into various concentrations of $HF_{(aq)}$. The solution can grow the desired SiOx ARC thicknesses in less than 50 seconds. These growth solutions are compatible with the front screen printed metallization of standard crystalline n+/p Si solar cells. The resulting good quality SiOx films have a low reflectance, passivate the emitter's surface well, and produce a good quality selective emitter. All iodine-containing chemical compounds, at our disposal, when dissolved in acidic HF-based solutions grew SiOx films including, but not restricted to, iodic acid ($HIO_3$), potassium iodine (KI), and $I_2O_5$.

The $I_2O_5$:HF growth solution, depending on the screen printing Al paste, sintering temperature, and time, may react with Al-based back screen printed contacts, degrading them if the cell is fully immersed for longer than one minute. High growth formulations must be utilized if solar cells with Al back contacts are to be fully immersed in iodine-based growth solutions. Of course, there are other methodologies besides full immersion that can be utilized to avoid the undesired reaction with the Al back contact. The cells can float on the growth solution with the emitter face down, or a thin film of growth solution can be applied only on the emitter's surface.

In one experiment, RTWCG SiOx growth solutions were formulated which had varying amounts of $I_2O_5$ dissolved in varying strengths of $HF_{(aq)}$. The $I_2O_5$ concentration ranged from 0.3-2 g/L, and the $HF_{(aq)}$ concentration ranged from 10%-50%. It was determined that the SiOx growth rate on the similar heavily doped n+ silicon surfaces is heavily dependent on the $I_2O_5$ concentration, and to a lesser extent on the concentration of HF utilized. A concentration of 2 g $I_2O_5$/1 L 50% $HF_{(aq)}$, creates a 130 to 150 nm-thick metallic blue oxide in about 15 seconds. A concentration of 0.3 g $I_2O_5$/1 L 10% $HF_{(aq)}$, grows the same SiOx thickness in 5 minutes.

Further experimental investigations of growth solution components have revealed that besides $HIO_3$, $I_2O_5$, and KI, there are a relatively large number of iodine containing chemicals that can be used to produce improved quality RTWCG SiOx thin films for solar cells and other applications. This list includes, but is not restricted to: $BI_3$, $I_2O_4$, $I_2O_5$, $I_2O_9$, $IF_5$, $SiI_4$, $PI_3$, $P_2I_4$, $TiI_4$, $VI_3$, $CoI_2$, $NiI_2$, $AsI_3$, $SnI_4$, $SbI_3$, $TeI_4$, $PbI_2$, and $BiI_3$. According to this invention, various combinations of one or more iodine containing chemicals dissolved in $HF_{(aq)}$, will catalyze or co-catalyze the SiOx film and will produce the efficiency enhancement features of the RTWCG SiOx ARC/SE/TO cell structure on n+-Si or p+-Si surfaces. The above catalysts when added to several SiOx growth solution described herein, have also proven to increase the quality of RTWCG films grown on other than Si substrates. For example if $AsI_3$ is added to the VT RTWCG growth solution in FIG. 14, the passivation capability of the RTWCG Ga—As—O thin film dielectric grown on p-GaAs and n-GaAs substrates is significantly increased.

Compared to conventional crystalline solar cell designs, the efficiency gained from the RTWCG SiOX ARC/SE/TO cell structure is due to significantly lower optical, resistive, and recombination losses. The reflectance and absorption of the RTWCG SiOx film are very low, the SiOx films passivate well, a highly effective selective emitter (SE) is created, and there are inherently lower resistive losses due to the smooth SE/textured SiOx concept.

The environmentally friendly RTWCG SiOx method and process, as described herein, is designed to be utilized for the fabrication of low cost, high efficiency, crystalline silicon solar cells with conventional screen printed metallization. The RTWCG SiOx ARC/SE/TO process is simple, controllable, and in less than one minute will:
  i. in-situ clean the silicon and metallization surfaces;
  ii grow a graded index of refraction SiOx antireflection coating (ARC) which, on production type n+p Si substrates, has an AM 1.5 average weighted reflectance (AWR) of between 5%-9% and an AM 1.5 AWR of between 3% and 5% on optimized RTWCG SiOxARC/TO cell structures;
  iii. the SiOx passivates very well dangling bonds at the SiOx/emitter interface;
  iv. produce a good edge isolation if the masked diffusion described herein is utilized;
  v. use the standard screen printed metallization as a mask to etch back only the emitter's active areas and thus create an excellent quality SE that is compatible with large-scale, low-cost, production; and
  vi. produce an optional textured SiOx surface that can further reduce optical loses.

The foregoing and other objects, features and advantages of the invention will be apparent from the following more particular examples of preferred embodiments of the invention.

Example 1—Ultra-Low Cost RTWCG SiOX Solution

Ultra-low cost RTWCG SiOx aqueous solution formulations using diluted chemistries are preferably produced on site at the fabrication facility. This not only significantly reduces the cost of $H_2SiF_6$, $H_2TiF_6$, and other solution components but will maximize the manufacturer's quality control.

In a preferred embodiment of the invention, the RTWCG SiOx growth solution formulation eliminates the need for a silicon source, such as $H_2SiF_6$ or any other silicon source found in the prior art RTWCG SiOX growth solution formulations. ACS grade, or higher grade, $HF_{(conc)}$ and ultra-high purity water can be used to dilute the concentrated HF solution to the desired 10% to 40% concentration. ACS or better grade $HCl_{(conc)}$ also can be used and diluted to desired concentrations. The RTWCG SiOX growth solution also includes non-invasive aqueous components to which small amounts, 1-10 g per 1 L $HF_{(aq)}$, of a single preferred catalyst or a combination of preferred catalysts are added. The preferred catalysts are of ACS, or better, grade and examples include but are not restricted to: titanium dioxide (anatase), vanadium pentoxide, iodine pentoxide, potassium ferricyanide, lead dioxide, and optionally further include either cobalt oxide, or cerium oxide.

Figure 20:
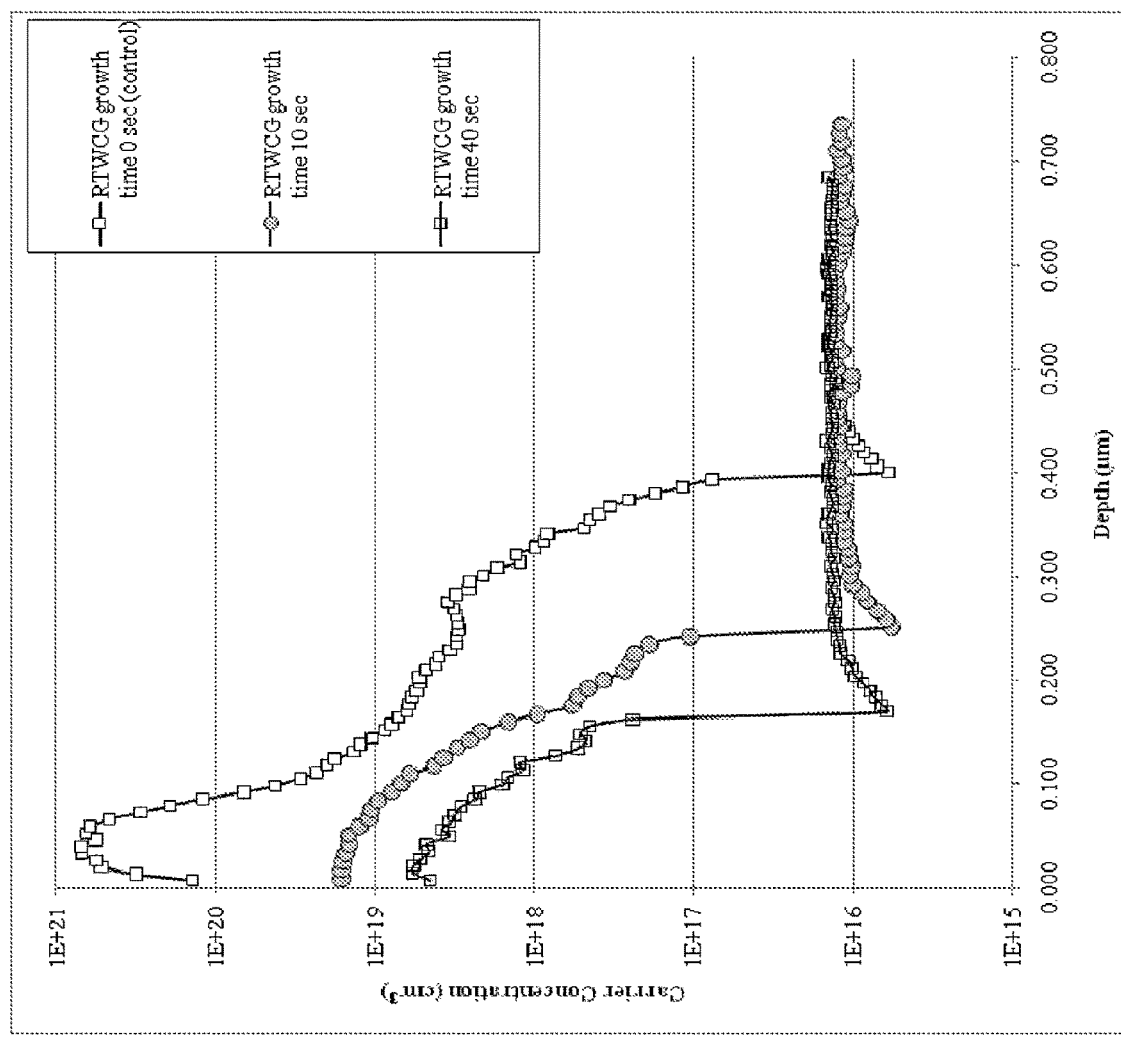
FIG. 20. The net majority carrier concentration depth profiles of emitters belonging to samples cut from the same n+/p FZ c-Si wafers showing the effects of etch-back after a 10 sec SiOx growth time and a 40 sec growth time. The profiles were acquired by the spreading resistance analysis method after removing the resulting RTWCG SiOx film.

Two samples were cut from the same FZ c-Si n+/p diffused wafer. One of the samples was fully immersed in an ultra-low cost, high growth rate, vanadium-based SiOx growth solution for 10 seconds and the second sample for 40 seconds. After removing the resulting SiOx films by a buffered $HF_{(conc)}$ etch solution, the net majority carrier concentration depth profiles of the remaining emitters were acquired and are shown in FIG. 20. The diffused samples for this experiment were produced per our specifications and the testing was performed by Solecon Laboratories, Inc. The spreading resistance analysis method was utilized to acquire the majority carrier concentration depth profiles while sheet resistance values were acquired by four-point probe measurements. As can be seen in Table 3 after the 10 sec SiOx growth time the emitter's sheet resistance increased to ~114 Ω/sq from its original 43 Ω/sq value, and the emitter's sheet resistance was significantly higher, ~695 Ω/sq, after the 40 sec SiOx growth time.

TABLE 3

Average four point probe sheet resistance values of the n+/p c-Si samples in FIG. 20, at several SiOx growth times.

| RTWCG SiOx Growth Time (sec) | 0 | 10 | 20 | 30 | 40 |
|---|---|---|---|---|---|
| Average 4PP Sheet Resistance (Ω/sq) | 43.2 | 114.4 | 260 | 406.8 | 695 |

Example 2—In Situ Surface Cleaning and Compatibility with Screen Printing Metallization All experimental small area high efficiency cells are fabricated in clean room facilities, yet most of the current state-of-the-art solar cell manufacturing is conducted in non-clean room environments. Non-clean room environments negatively affect the efficiency of cells by introducing impurities on the cell surface. The RTWCG SiOx ARC/SE process, being the last fabrication step, recaptures the efficiency that is lost due to non-clean room environments by cleaning the active surfaces and screen printed front grid lines. Moreover, as can be seen in the examples of realization below, the in situ cleaning lowers the efficiency dispersion within the same batch as well as between batches.

FIG. 21(*a*) shows the Nomarski view a c-Si solar cell with a pyramid-textured front surface which had a high peak-to-valley aspect ratio of 25 μm. As can be seen in FIG. 21(*b*), the RTWCG SiOx process is fully compatible with screen printed metallization. Because of the high aspect ratio of the texturized surface (see FIG. 21(*c*)) parts of the grid lines lay suspended between pyramids without touching the bottom of the valleys.

The mechanical and electrical integrity of the front contacts was examined on a large number of RTWCG SiOx-coated small and large area c-Si, cast mc-Si, and poly-Si n+/p solar cells. It was found that the preferred RTWCG SiOx processes do not adversely affect screen printed contacts. For instance, practically all of the cells' series resistance (Rs) decreased by as much as 40% post RTWCG SiOx coating. The lower Rs contributed to significant fill factor (FF) and efficiency increases.

Post-RTWCG growth Pmax increases of over 100% cannot be explained solely by a reduction in optical losses or the inherent increase of the blue response. One explanation is that the RTWCG growth solution in situ cleans the cell surfaces immediately preceding the growth of SiOx. This is advantageous especially to cells with poor surface conditions due to various contaminants which decrease the open circuit voltage (Voc) and the short circuit current (Isc). Furthermore, by cleaning the front contacts, certain metallization related conditions which are known to lower the fill factor (FF) are mitigated.

Figure 21B:
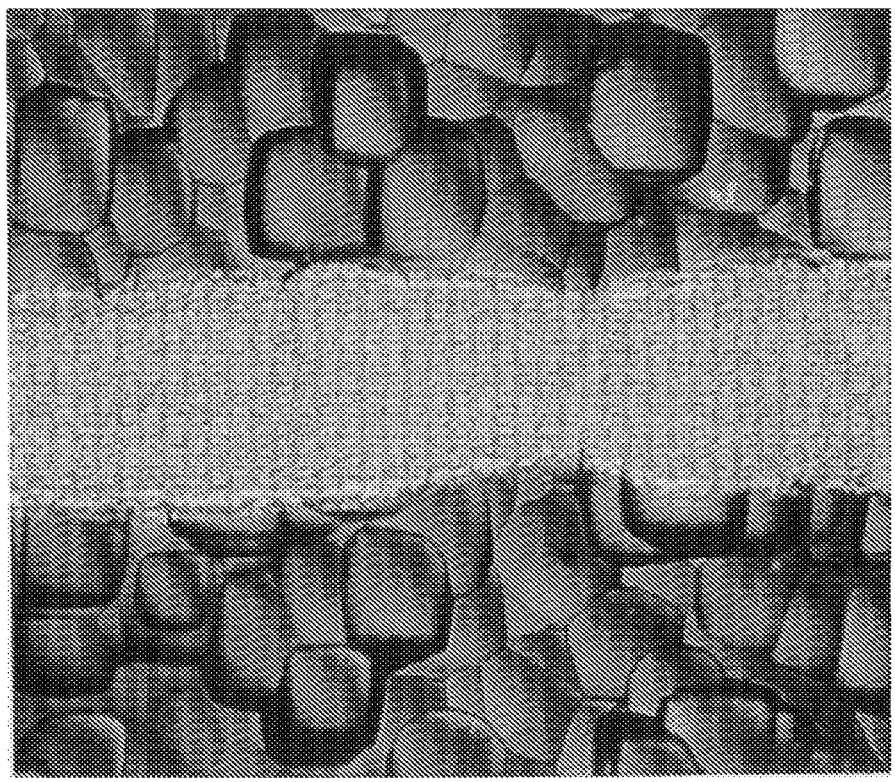
FIG. 21 (a) A typical Nomarski view of a pyramids-coated c-Si solar cell before the RTWCG SiOx, (b) after RTWCG SiOx, and (c) a typical Dektak surface profile of a pyramids coated bare n+/p c-Si structure in FIG. 21(a).
Figure 21A:
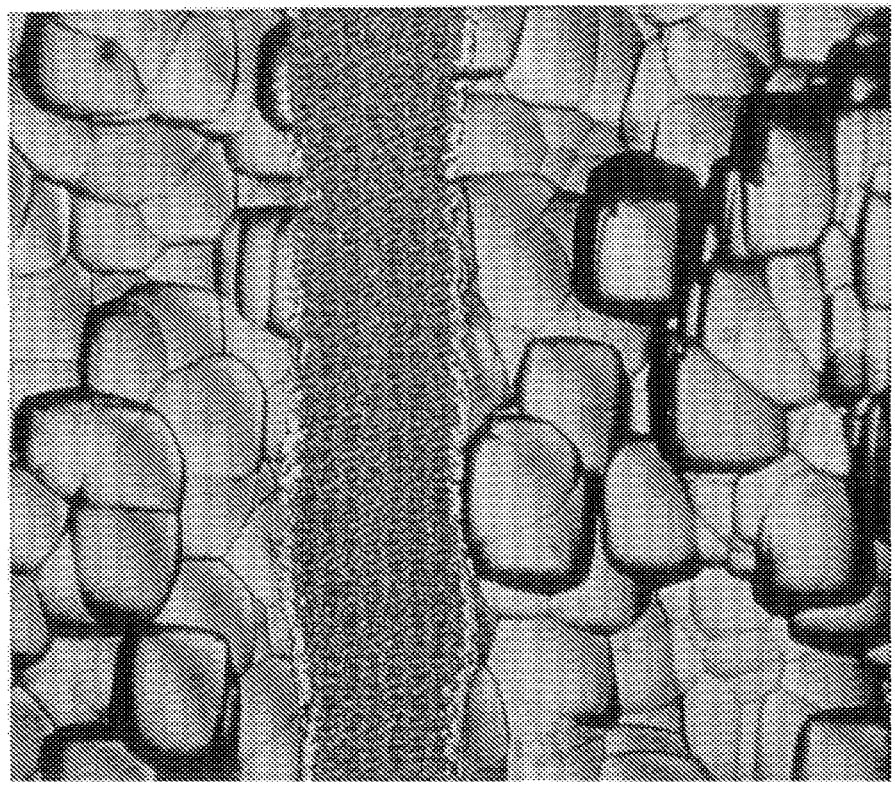
Figure 21C:
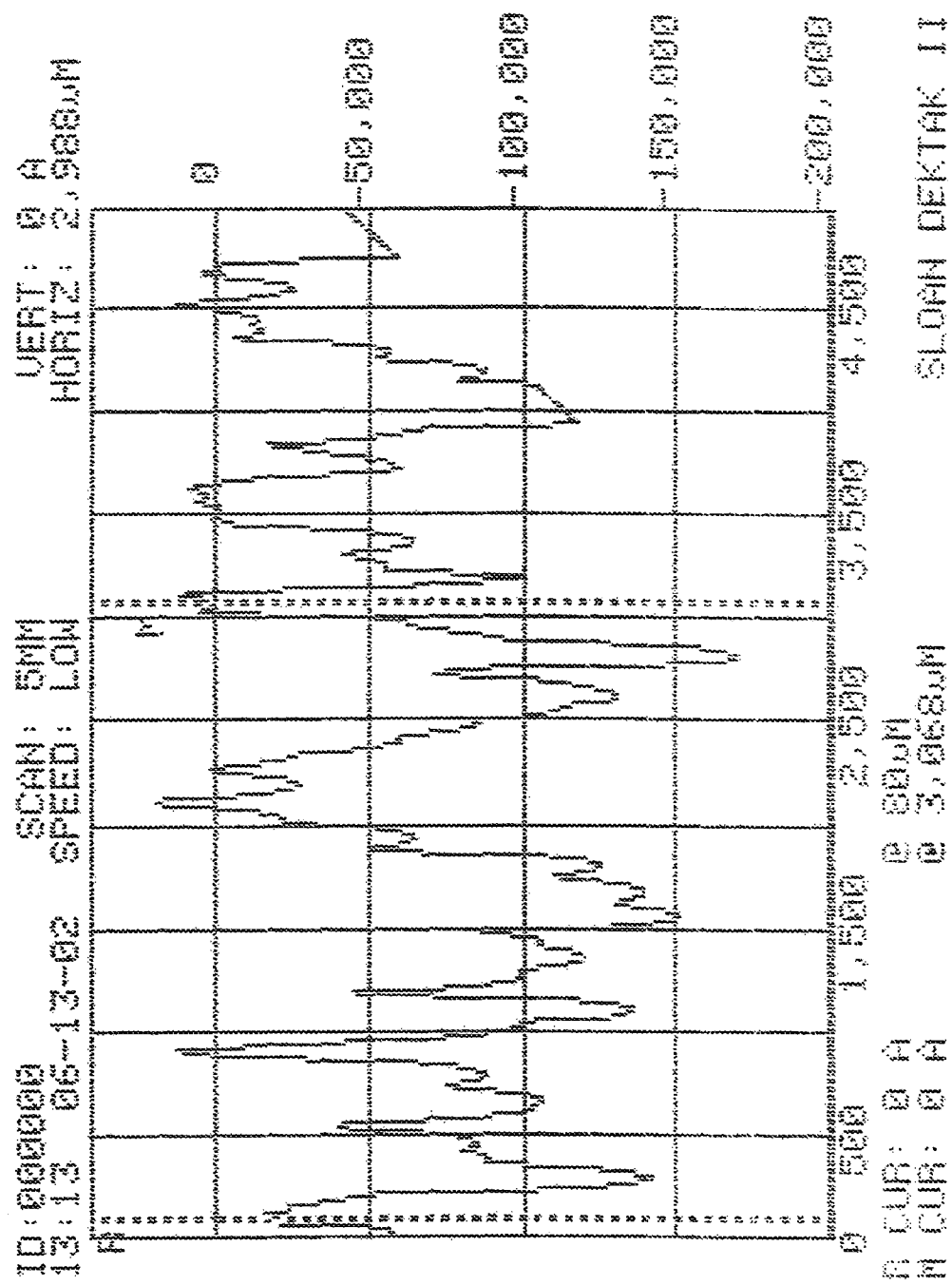

It is well known in the art that during the firing step a silver-based oxide contaminates the Ag-based screen printed front contacts and the conventional Ag-based back buss bars. The contamination may decrease the electrical conductivity of the buss bar and increase the contact resistance between the buss bar and the interconnect material. As can be seen in FIG. 21(b), RTWCG growth solutions do not cover the metallization with SiOx and in fact clean the oxide contamination as evidenced by the oxidized pre-RTWCG metallization in FIG. 21(a) versus the clean silver-colored post growth metallization in FIG. 21(b).

Long term endurance tests were performed on small area bare and SiOx coated cells that were cut from the same industrial large area c-Si and mc-Si cells. These cells were kept in a lab environment for up to 11 years. Tests have shown that, post-SiOx growth, the Ag-based front contacts resist aging and maintain their silver color, integrity, and solderability. As-fired Ag metallization surfaces, after being exposed an equal length of time to the same laboratory environment, became oxidized and more difficult to solder.

The preferred short RTWCG SiOx ARC/SE/(TO) process step is compatible with the conventional Al-based screen printing contacts. Certain RTWCG SiOx growth solution components such as $H_2SO_4$ may thin down the Al back contact thickness somewhat or change its color from light gray to dark gray, and should be avoided.

Small amounts of the Al back contact is dissolved when a cell is fully immersed in the growth solution. It has been shown that neither the composition, nor the quality, of the SiOx films is altered by these small amounts of dissolved Al even if the solution is reused repeatedly. The presence of Al in RTWCG films grown in reused growth solutions was undetectable by either XPS or AES analysis. The performances of small area solar cells which were fully immersed in reused growth solutions compared well to those immersed in fresh solutions.

Practically all RTWCG SiOx growth solution formulations appear to chemically passivate well the Al-based screen printed back contacts. This was clearly indicated by some long-term endurance tests including the long-term test, described above, in which small area cells were kept in a chemistry lab environment for approximately 11 years. After several years, the Al back contacts of some bare cells had visibly degraded to a powdery appearance. The Al back contacts of the SiOx coated cells maintained their chemical, mechanical, and electrical integrity.

Example 3—RTWCG SiOx ARC

The efficiency of a solar cell is in large measure determined by its reflectance, and hence, its ability to retain rather than reflect solar energy back into space. Many solar cell manufacturers still use titanium dioxide (TiOx) as a single layer antireflection coating (SLARC), which is usually spray coated onto the cells, then baked in order to eliminate the solvents. The main drawback of the relatively low cost TiOx ARC is the fact that it has a relatively large, ~15%, AM 1.5 AWR. Additionally, TiOx films cover the front surface metallization, requiring it to be removed from the front bus bars to allow for cell interconnection into lines during solar modules fabrication.

Silicon Nitrate (SiNx) ARCs are a better approach since their AM 1.5 AWR is 12%. SiNx is deposited by chemical vapor deposition (CVD), or plasma enhanced CVD (PECVD) at relatively low temperatures in air or vacuum. SiNx deposition is rather expensive from a process, maintenance, and especially capital equipment perspectives. However, as opposed to the $TiO_2$ ARC, the screen printed front grid metallization pastes can be fired through the SiNx thin film, thus eliminating the additional relatively low-yield process step of removing the film from the front buss bars surfaces. In order to further reduce the relatively high reflectance of single layer ARC (SLARC) films, both surface texturing and double or triple layer ARC (DLARC or TLARC) can be used. Due to their relatively high cost, DLARC or TLARC are not industrially utilized.

Figure 22:
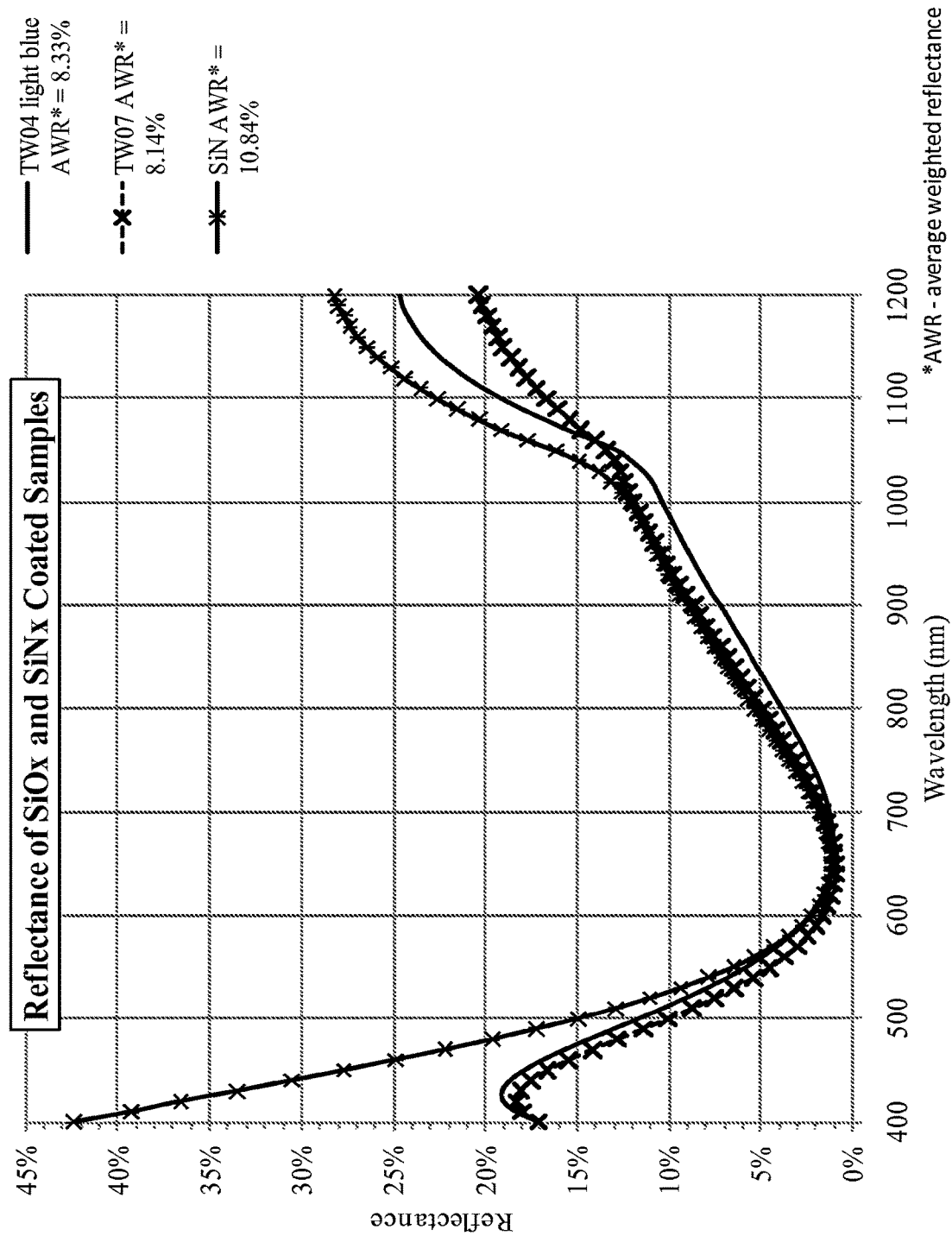
FIG. 22. Reflectance plots acquired by an independent solar cell R&D laboratory of their optimal SiNx ARC and two non-optimized RTWCG SiOx ARC.

As the SiNx ARC is becoming more and more the c-Si solar cells industry standard, it is instructive to compare the optical and electric properties of CVD SiNx with that of RTWCG SiOx films. In FIG. 22 are the reflectance plots acquired by an independent laboratory, for their optimal SiNx ARC and two non-optimized RTWCG SiOx ARC's. The AM1.5 AWR on the 400-1200 nm wavelengths range is 12.1% for the optimized SiNx film, and 8.3% and 8.5% for the two non-optimized SiOx films. The larger reflectance of the CVD SiNx film is mostly due to a significant reflectance increase in the blue region of the visible light spectra. The AM 1.5 average weighted reflectance (AWR) values given herein were calculated using known in the art spectral irradiance data for AM 1.5 (normalized to 1,000 $W/m^2$) from R. Hulstrom, R. Bird, and C. Riordan, "Spectral solar irradiance data sets for selected terrestrial conditions," *Solar Cells*, vol. 15 (4), pp. 365-391, 1985.

Figure 23:
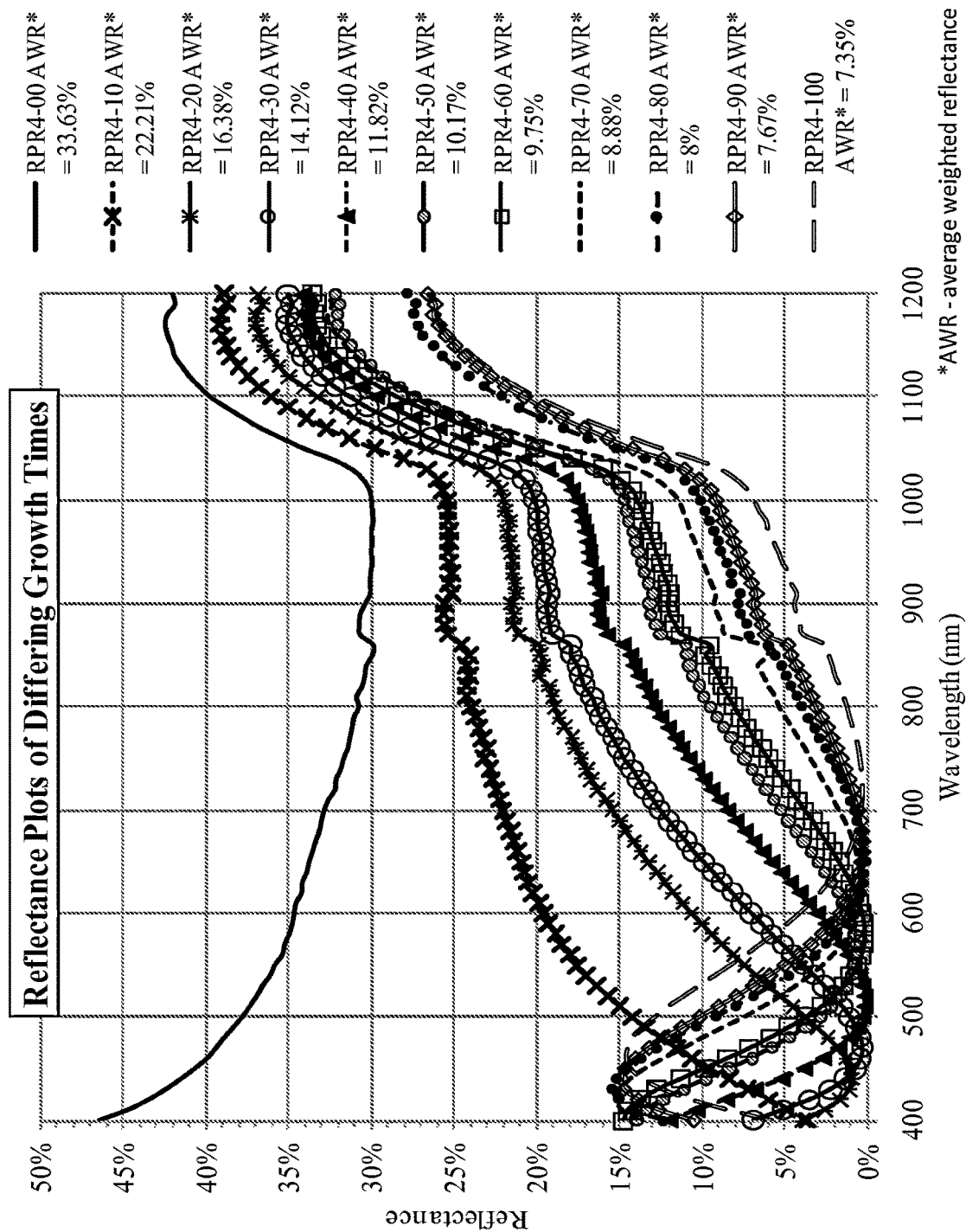
FIG. 23. A family of reflectance plots of RTWCG SiOX-coated n+/p diffused c-Si structures such as in FIG. 3, as a function of SiOX growth time (in seconds).

Typically, a non-optimized SiOx ARC produced by the RTWCG process has an AM 1.5 AWR in the range of 6%-9%, which is lower than that of any other SLARC thin film on a smooth silicon surface. For example, FIG. 23 shows a family of RTWCG SiOx reflectance plots for SiOx films grown on n+/p Si kink-and-tail diffused structures such as in FIG. 3. The "PR4-y" notation stands for Planar RTWCG SiOx ARC grown on n+-p 4-inch polished single crystal silicon (c-Si) wafers, where "y" is the SiOx growth time (in seconds).

In Table 4 are shown the AM 1.5 AWR of RTWCG SiOx as a function of growth time for films grown using the same growth solution as in FIG. 12 on four different families of substrates. The first column contains data for the "PR3-y" family of SiOx films in FIG. 23. The AWR data in the second column refer to a family of SiOx films grown on pyramids-coated c-Si n+/p diffused structures. The data from SiOx films grown on cast mc-Si and thin film mc-Si (ribbon) n+/p structures are in the third and fourth columns, respectively.

From Table 4, the pre-coated AWR of the pyramids coated n+/p c-Si Si diffused structure is 32.68% and 33.63% for the n+/p c-Si diffused structures with a smooth surface. After growing a suitably thick (70 sec and 80 sec growth times) RTWCG SiOx ARC/SE, the AWR is actually lower on cell structures with a smooth surface as compared to the AWR of pyramids coated surfaces. Since smooth emitters have lower resistive losses than the pyramid textured emitters whose higher resistive losses are especially associated to the high lateral resistance, the use of a pyramid textured emitter surface such as in FIG. 21(a) does not appear to be justified for the RTWCG SiOx ARC/SE process.

TABLE 4

AM 1.5 Average Weighted Reflectance (AWR) of RTWCG SiOx films grown on crystalline n+/p c-Si, cast mc-Si, and poly-Si wafers in the wavelengths range of 400-1200 nm as a function of SiOx growth time.

| RTWCG SiOx Growth Time (sec) | AM1.5 Average Weighted Reflectance (%) | | | |
|---|---|---|---|---|
| | c-Si Smooth Surface (see FIG.20) | c-Si pyramids Coated Surface (see FIG. 18) | mc-Si (cast) Wafers | mc-Si (ribbon) Wafers |
| 0 | 33.63 | 32.68 | 32.06 | 32.95 |
| 10 | 22.21 | | 20.86 | |
| 20 | 16.38 | | 18.66 | |
| 30 | 14.12 | | 12.77 | 9.95 |
| 40 | 11.82 | 10.49 | 13.94 | 8.82 |
| 50 | 10.17 | 10.14 | 13.94 | 7.53 |
| 60 | 9.75 | 9.78 | 12.67 | 7.1 |
| 70 | 8.88 | 9.36 | 13.13 | 6.88 |
| 80 | 8 | 9.08 | 11.95 | 6.35 |
| 90 | 7.67 | 8.98 | 10.66 | 6.52 |
| 100 | 7.35 | | 9.24 | |

The ribbon mc-Si substrates had the highest SiOx growth rate which produced SiOx films with the lowest AWR of 6.35%. For reasons which are not fully understood, the SiOx growth rate on cast n+/p mc-Si diffused wafers is lower, which explains the higher AM 1.5 AWR for this particular family of diffused wafers. The AM 1.5 AWR below 10% was obtained after a relatively long SiOx growth time of 100 seconds (Table 4). Later experiments used a higher growth rate SiOx solution formulation on the same cast mc-Si diffused substrates. The appropriate SiOx film thickness was achieved in 45 seconds and resulted in a much lower AM 1.5 AWR of 6.32%.

As has already been shown herein, certain RTWCG formulations with a high SiOx growth rate of up to 500 nm/min in less than 1 minute grow a textured ARC SiOx film, while creating an excellent quality SE, and surface passivation. The resulting cells have a low AM 1.5 AWR and the entire RTWCG SiOx ARC/SE/TO enhancement features occur in one single wet chemical process step.

Figure 24:
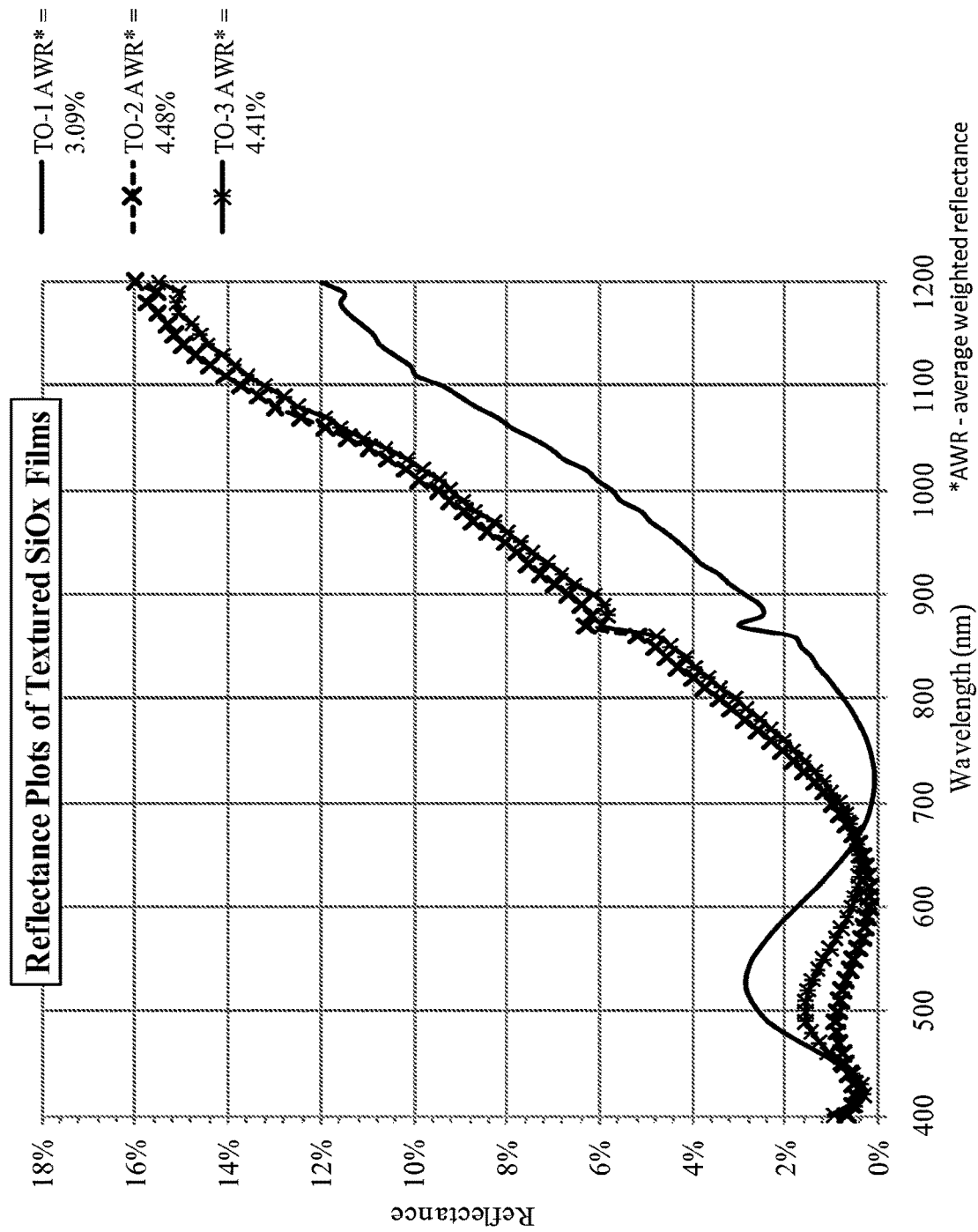
FIG. 24. A family of three low reflectance plots for textured SiOx films grown in fast-growth RTWCG SiOx solutions on n+/p c-Si substrates with smooth emitters.

The lowest AM 1.5 AWR values are obtained for SiOx films grown in high growth rate RTWCG solutions that texture the SiOx surfaces and have a graded index of refraction. The reflectance plots of textured RTWCG SiOx films grown on smooth n+/p c-Si substrates are shown in FIG. 24. Post SiOx growth, TO-1 was dipped in 1% $HF_{(aq)}$ for 15 seconds and yielded an AM 1.5 AWR value of 3.09%. SiOx films TO-2 and TO-3, with AM 1.5 AWR of about 4.5%, were as-grown films. The AWR values of these low-cost films are as low, or lower, than the AWR values of the, known in the art, cost prohibitive, three layers ARC's.

Example 4—RTWCG SiOx Thin Film Transparency

To reduce the ARC thin film's useful light absorption, it has to be as transparent as possible in the wavelength range of 300-1200 nm. Compared to the RTWCG SiOx ARC, traditional SLARCs have greater absorption of visible light especially in the blue portion of the spectra. Although often not accounted for, light absorption is especially significant in the case of thicker, multi-layer ARC's.

The term "transparent layers" refers to layers which have a sufficiently low extinction coefficient value (k). For example, a layer is substantially non-absorbing for visible light at thicknesses of about one-quarter wavelength of visible light if, in the visible region of the usable AM1.5 spectrum, k is less than 0.10. A low extinction coefficient (k) can be equated to a low absorption ($\alpha$) (e.g. a k of less than 0.1 corresponds to a of less than 1%), since $\alpha = 4\pi k/\lambda$. If k is higher than 0.1, such as is the case of thermal $SiO_2$, then the film is highly absorbing, rendering films of high k inappropriate for solar cell ARC's.

Figure 25A:
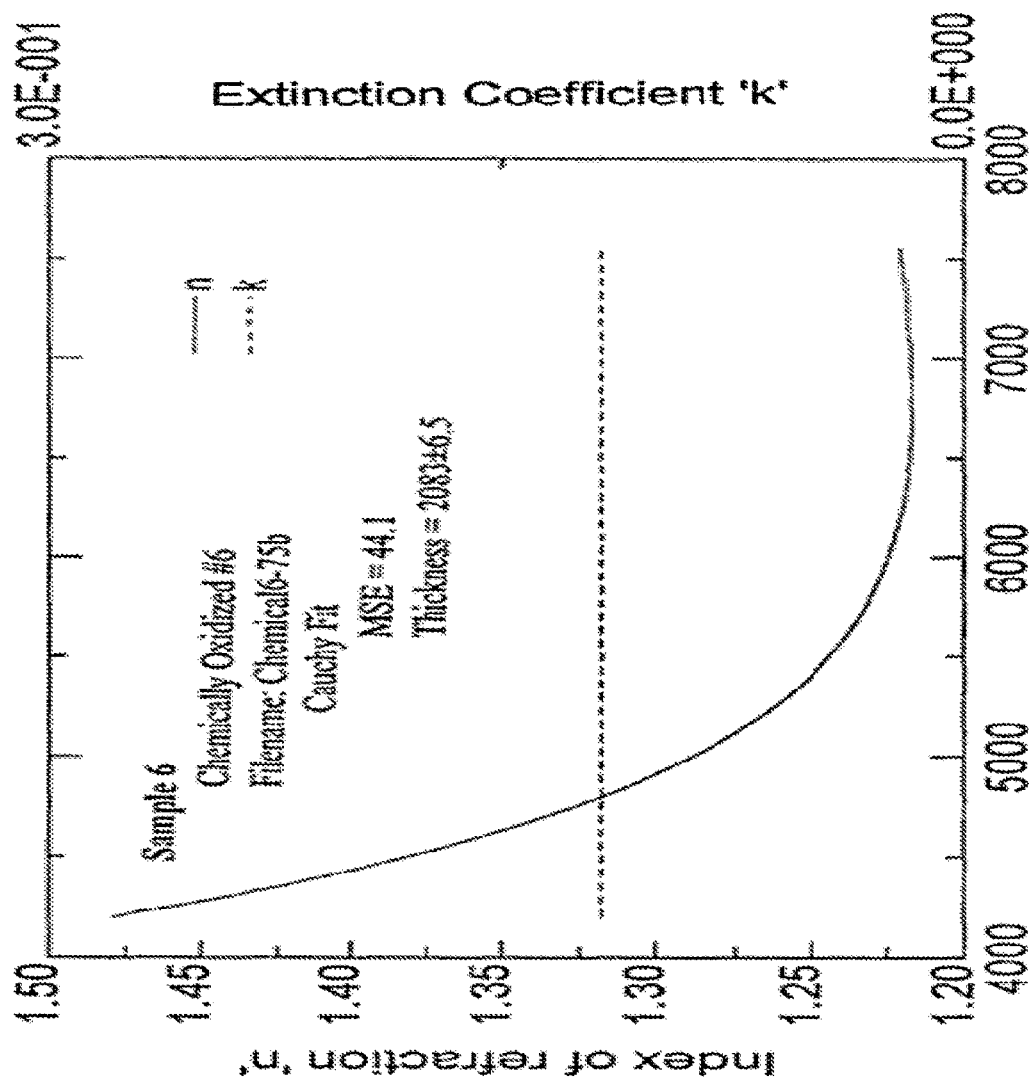
FIG. 25(a) Index of refraction and extinction coefficient vs wavelength for a low metallic impurities high growth rate SiOx film such as in FIG. 13.

FIG. 25(a) shows the index of refraction and the extinction coefficient for the state of the art transparent RTWCG SiOx thick film (208 nm) grown by using a high growth rate solution, such as in FIG. 14. The extinction coefficient in the 400-800 nm wavelength range is below 0.02, making the film suitable for thicker films necessary for creating a textured surface. The extinction coefficient of a silicon-rich SiOx film grown on a c-Si substrate by a growth solution such as in FIG. 15, is a bit higher at just under 0.04 (see FIG. 25(b)). These k values of the RTWCG ARC compare very well to competitive ARCs such as optimized SiNx SLAR (k>0.06), TiOx SLAR (k>0.08), or the known double and triple layer ARCs (k>0.1). Because the RTWCG SiOx films are highly transparent and their reflectance decreases very gradually with thickness, small variations in the SiOx thickness are less critical than would be for conventional ARC's. The factor which limits the thickness level of the SiOx film is the depth to which the emitter is etched back during the growth process.

Example 5-RTWCG Selective Emitter

The industry has long recognized the benefits of a selective emitter but has not had a cost effective way of realizing this efficiency enhancement feature. While good optical performances are important, a preferred RTWCG SiOx growth process also creates a, highly cost-effective, good quality selective emitter (SE).

For screen-printed contacts to have a reasonably low contact resistance, a heavily diffused emitter must be employed. This introduces a large number of surface defects which lower the cell efficiency. However this is not an issue for the RTWCG process which etches back only the non-metalized emitter surfaces. Thus, the emitter regions under the contact grids are left undisturbed and heavily diffused. In other words, the grid metal serves as a mask for etching back the emitter's non-metalized surface. Because the RTWCG SiOX film is grown very rapidly, <1 min, there is no damage done to the grid.

Good screen-printed contacts with a contact resistance of around $1.0 \times 10^{-4}$ $\Omega\text{-cm}^2$ along with a sheet resistance of over 100 $\Omega$/sq and a surface doping level of approximately $1 \times 10E+19$ $\text{cm}^{-3}$ are pivotal requirements for manufacturing efficient solar cells. Implementing a thicker, more heavily doped, emitter allows much greater latitude during the metallization firing step. It permits front grid metallization materials that are more penetrating and conductive, reducing the resistive losses and improving yield. A high doping level below the screen printed front contact metallization results in an acceptably low contact resistance of less than $1.0 \times 10^{-3}$ $\Omega\text{-cm}^2$ and a small density of junction shunting paths. However, this type of emitter has a low open-circuit voltage as well as poor short-circuit currents caused by a poor blue response.

Figure 26:
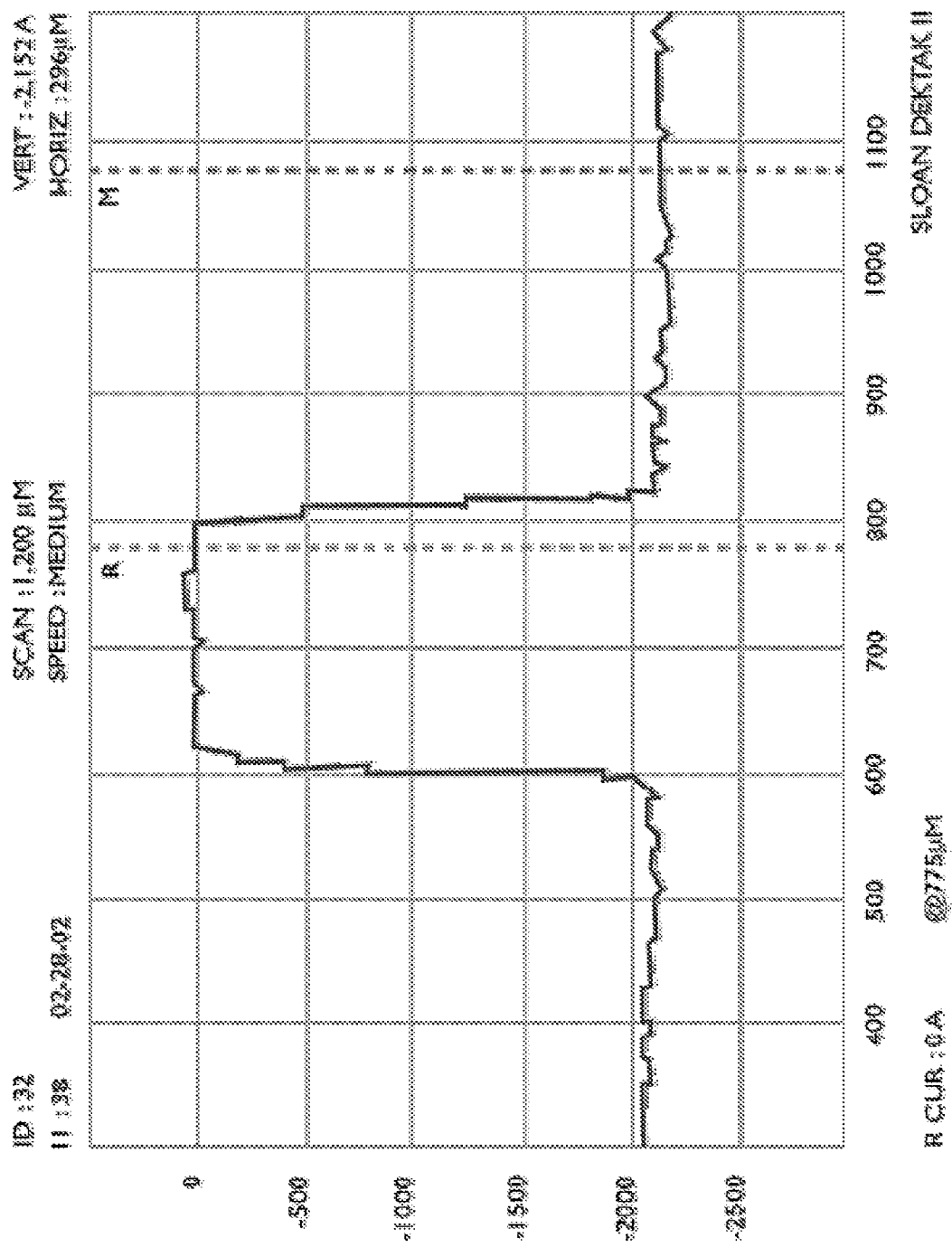
FIG. 26. Dektak plot showing the thickness of silicon removed from the non-metalized emitter's surface during the RTWCG SiOx growth.

To simulate the front grid lines of a cell, narrow photoresist lines were created on a smooth n+/p c-Si kink and tail diffused emitter surface such as in FIG. 3. Since the RTWCG growth solutions are nonreactive with photoresist, the SiOx film grew only on the bare portions of the emitter. The surface profilometry in FIG. 26 was obtained after removing the photoresist and SiOx film, and it shows the depth of the emitter which was etched back by the growth solution. In a preferred embodiment according to one or more embodiments, for a well designed kink-and-tail diffusion profile, the growth solution should etch back the emitter by 0.2 µm for the RTWCG SiOx ARC/SE cell structure, and slightly more than 0.25 µm for the RTWCG SiOx ARC/SE/TO cell structure.

An optimal kink-and-tail diffusion profile according to this invention has a kink at approximately 0.1 µm below the emitter's surface (see FIG. 3). This kink represents the so-called "dead layer," or an area with a large defects density. Since the RTWCG SiOx growth solution removes 0.2 µm or more of the emitter's non-metallized surface, the dead layer is etched back on the active areas but not from under the front contacts. Consequently, the SE forms simultaneously with the SiOx ARC growth. This new SE concept has been successfully tested on a large number of production-type single crystal (c-Si), cast multicrystalline (mc-Si) and polycrystalline n+/p silicon solar cell lots, acquired from various solar cell producers. For reasons briefly shown below, the good quality RTWCG SE is by far the single largest contributor to the efficiency gain of the RTWCG SiOx ARC/SE/TO technology as compared to traditional cell technology that does not incorporate a SE or incorporates less effective state of the art SE.

The RTWCG SiOx growth solution etches back the heavily damaged emitter layer to a depth that depends on the formulation used and the length of growth time. In preferred embodiments according to one or more embodiments, the optimal growth solutions, discussed above, were formulated to grow a 130-220 nm-thick SiOX ARC and to etch back between 0.20-0.25 µm of the non-metalized emitter. A near optimal kink-and-tail phosphorous diffusion has an initial junction depth of about 0.55 µm, the kink at a depth of 0.1 µm, and a surface net majority carrier concentration between 5E+20/cm$^3$ and 8E+20/cm$^3$. After the growth solution etches back the active emitter's surface, the remaining non-metalized surface concentration is between 8E+18/cm$^3$ and 1E+19/cm$^3$ which while assuring a good blue response can still produce a fill factor of above 0.78.

Figure 27:
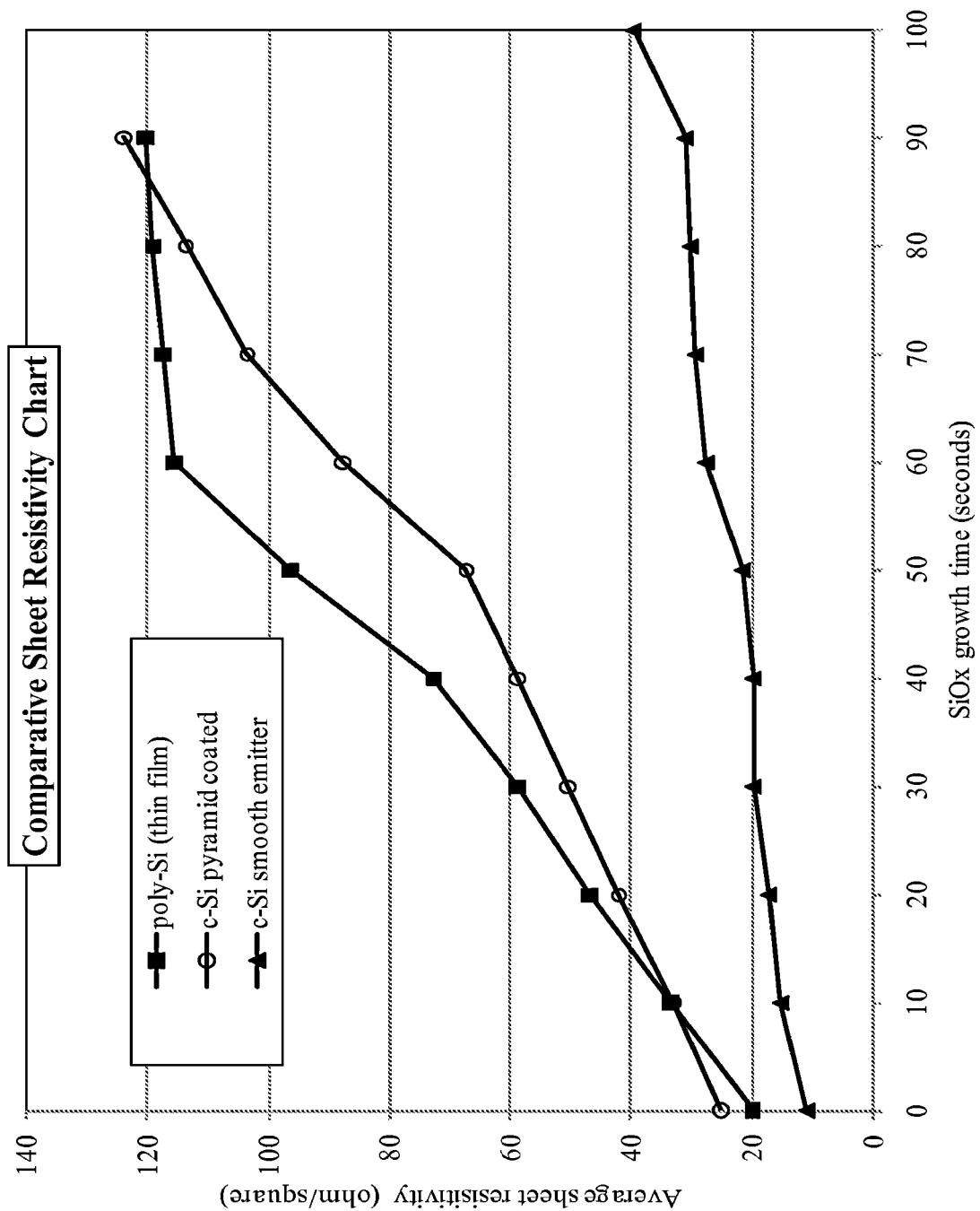
FIG. 27. Sheet resistivity charts for two c-Si and one mc-Si phosphorus diffused n+p (P,B) Si structures with deep emitters as a function of SiOx growth time.

FIG. 27 shows sheet resistance plots as a function of RTWCG SiOx growth time for two n+p c-Si and a thin film poly-Si diffused structures. The heavily diffused c-Si smooth emitter structure had an initial sheet resistance of approximately 12 Ω/sq, a similar kink-and-tail diffusion to FIG. 3, and a junction depth of nearly 0.7 µm. As can be surmised by the low initial sheet resistance, this diffused structure has a thicker than optimal junction depth with a fairly deep 0.2 µm kink. After a RTWCG SiOx growth time of 100 seconds, the remaining sheet resistance was still approximately 40 Ω/sq. The internal and external quantum efficiencies of small area cells fabricated on these diffused structures were plotted pre and post RTWCG SiOx ARC/SE formation. As it will be shown herein, despite the post growth increase in the blue response of up to 60%, which corresponded to an increase of up to 52% in Isc, and 54% in Pmax, the blue response was far from optimal. The sheet resistance of deep junction pyramids coated c-Si structures increased from 26 Ω/sq to ~85 Ω/sq after a 60-second SiOx growth time and to ~105 Ω/sq after a 70-second growth time. This is in concordance with a large increase in the blue response yielding an average Pmax increase of 56% for a small lot of large area cells fabricated utilizing the same n+/p diffused structures.

FIG. 27 shows that the poly-Si n+/p diffused structures' sheet resistance increases at a faster rate than the rate at which the c-Si cells' sheet resistance increases. After a 60-second SiOx growth time the sheet resistance reached ~115 Ω/sq from an initial pre-growth value of 20 Ω/sq. The accelerated sheet resistance increase which can be observed for poly-Si substrates relative to Cz c-Si or cast mc-Si substrates is congruent to an observable accelerated SiOx growth rate on the "thin film" poly-Si n+/p cell structures. Obviously for equal growth times, faster growth rates will etch back the non-metalized emitter to a greater extent, producing cell structures with larger sheet resistance values. There appears to be a direct correlation between the concentration of oxygen in the crystalline silicon wafers and the growth rate of the RTWCG SiOx film; the larger the oxygen content, the larger the SiOx growth rate.

As it will be shown herein, the RTWCG SiOX ARC/SE process' ability to significantly increase the cell's power is to a large extent due to an increase in the blue response. It is worth mentioning that all c-Si, cast mc-Si and poly-Si large area solar cells used for the incremental optimization of the RTWCG SiOx ARC, and SE, were production cells of varying emitter depth, some were too deep, some too shallow. None of these cells, however, were optimized for the RTWCG SiOx ARC/SE cell structure, much less so for the enhanced efficiency RTWCG SiOX ARC/SE/TO cell structure. Except for a limited number of c-Si cells fabricated on non-optimized diffused structures (i.e. FIG. 3), none of the large area cells, as it will be described in more detail in the next sections, contained an intentionally designed kink-and-tail emitter diffusion profile. Despite this, the RTWCG SiOX ARC/SE cell structures created on a small lot of 12 CZ c-Si 6-inch production cells had an average Pmax increase of 56%, based on the manufacturer's AM 1.5 I-V data, and an average AM 1.5 efficiency of 15.6% with the highest AM 1.5 efficiency of 16.4%.

Nine 6-inch "thin film" poly-Si n+/p production-type solar cells, based on the manufacturer AM 1.5 I-V data, had an average Pmax increase after creating the RTWCG SiOX ARC/SE cell structure of 47.7%. This represents an estimated absolute gain of 9.4% over conventional cells using a SiNx ARC, as calculated from data in the art which show the maximum Pmax (efficiency) increase after SiNx coating at approximately 39% for small area cells, and up to 35% for production cells. The disproportionally large increase of deep emitter cells' Pmax compared to the Pmax of conventional cells that make use of any other ARC yet do not possess an SE, is due to the large increase in the blue response of the RTWCG SiOX ARC/SE cell structure. This is clearly shown by the external quantum efficiency plots performed on cells as shown in the next sections. Even for cells that do not have an optimal kink-and-tail diffusion, but have a thick enough emitter and a high enough initial net majority donor concentration at the emitter's surface, the contribution of the SE in the RTWCG SiOX ARC/SE/(TO) cell structure is significantly higher than other known in the art SE schemes.

In a preferred embodiment according to one or more embodiments, the efficiency enhanced RTWCG SiOX ARC/SE/(TO) cell structure requires an initial sheet resistance of 20-25 Ω/sq. Post SiOx growth, the emitter's sheet resistance must be 110-120 Ω/sq. There are gradual declines in FF for sheet resistances that go over 120 Ω/sq to 150 Ω/sq and accelerated declines as they go past 150 Ω/sq.

Example 6—Textured RTWCG SiOx Films

Surface texturing of the emitter is frequently used in the design of conventional n+/p crystalline silicon solar cells to reduce optical loses by decreasing the reflection of light away from the surface. Surface texturing, mostly used for c-Si solar cells, is attained by chemically etching the wafer prior to diffusion. For example, the preferential etching along the (111) faces of a (100) silicon substrate results in a surface covered by "random pyramids." Our experience has shown that the peaks of these pyramids, which can have a height of 25 µm (see FIG. 21(c)), can break off during the removal of the diffusion glass following diffusion. The screen printing process can then create shunting paths that may drastically reduce the shunt resistance, the fill factor, and the open circuit voltage all of which significantly lower the cell efficiency.

Despite the, known in the art, mechanical failure described above and the known difficulties of producing good quality textured mc-Si substrates, most laboratories and cell producers still use some form of textured emitter surface. Although the AWR of cells with textured emitters can in some cases be markedly lower, the downside is an increase in lateral emitter resistance losses that lower the fill factor.

To our knowledge the concept of using a textured oxide (TO) deposited on a smooth emitter surface was, at least for crystalline silicon solar cells, first proposed in 1994 by NREL. If well designed, this approach significantly reduces the resistive losses associated with a larger effective sheet resistivity, and may significantly reduce the possibility of the above mechanistic failure from occurring. For instance, Gee et al from NREL used CVD deposited optimized textured-ZnO coatings, and reported an AM 1.5 AWR of as low as 6% for encapsulated c-Si wafers, and demonstrated improvements in encapsulated cell performance of up to 0.5% absolute as compared to encapsulated SLAR planar cells.

The ability to texture the surface of the RTWCG SiOx film to produce the so called TO feature is the last efficiency enhancement element of the RTWCG SiOx ARC/SE/TO cell structure design disclosed herein. Conventional textured emitter surfaces experience a voltage drop due to the lateral flow of current towards the grid fingers which causes a reduction in conversion efficiency. A smooth emitter surface and textured SiOx assure a significant decrease of the emitter's sheet resistance thus increasing the crystalline silicon solar cell efficiency. Optimized RTWCG TO films further increase the already proven efficiency gains of the RTWCG SiOx ARC/SE solar cell structures.

RTWCG SiOx films that are grown in low growth rate formulations have a smooth surface topography. These smooth SiOx films can be textured to form the TO SiOx feature by an additional short wet process step lasting from 10 to 15 seconds. The resulting pyramid-like features on the SiOx surface, preferably grown on smooth emitters, will re-capture light that would otherwise reflect off of the cell without the, previously described, negative consequences of textured emitter surfaces. The usefulness of this TO feature, shown in the examples of realization to follow, becomes increasingly important as the incident angle of light moves away from being perpendicular to the surface of the cell.

Figure 28:
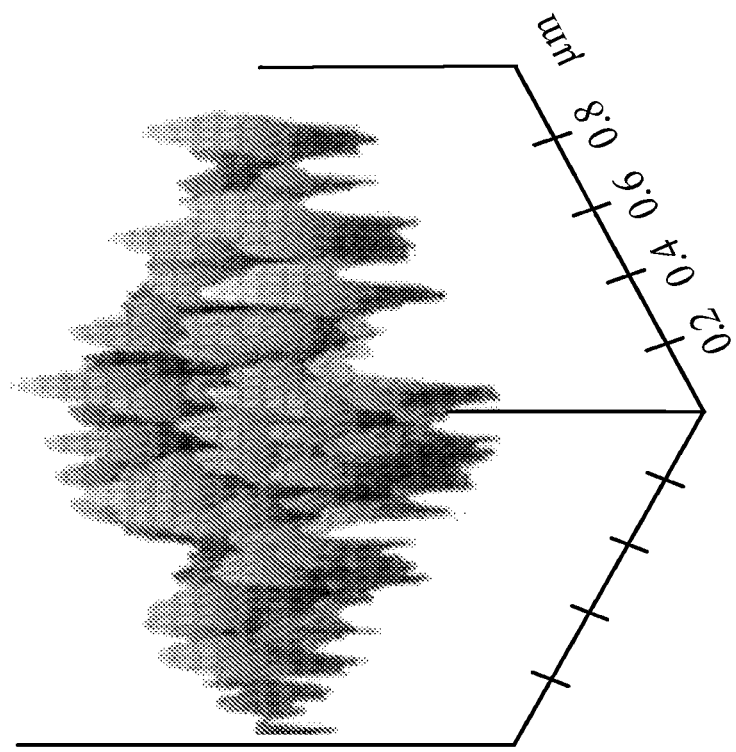
FIG. 28. AFM surface topography of a RTWCG SiOx film grown on solar grade c-Si substrate prior to (left) and after (right) etching for 15 seconds in 1% $HF_{(aq)}$.
Figure 28:
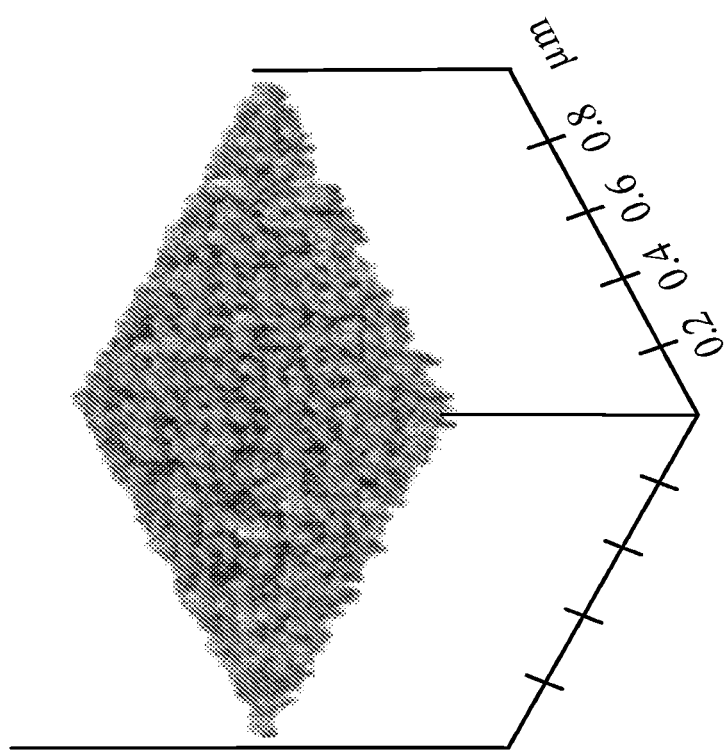

FIG. 28 shows the AFM surface topography before and after a 15 seconds 1% $HF_{(aq)}$ etch of a RTWCG SiOx film grown on a solar grade c-Si substrate. The thicker, 0.25 µm, SiOX film had textured features which further reduced the film's reflectivity in the upper end of the visible light spectrum, leading to efficiency gains. The lowest AM 1.5 AWR of 3.09% recorded thus far, as shown in FIG. 24, was on a SiOx film grown on a smooth n+c-Si emitter surface with a subsequent 15 seconds submersion in 1% $HF_{(aq)}$.

High SiOx growth rate solutions create the textured SiOx film surface as part of a single RTWCG SiOx ARC/SE/TO process step. As can be seen in FIG. 24, these SiOx films have a very low AM 1.5 AWR value of about 4.5%. Since the pyramid-like features are approximately 120 nm tall, the RTWCG SiOx ARC/SE/TO process step should create a film thickness of no less than 220 nm. To achieve this film thickness, the active emitter will be etched back by 0.25 µm to 0.3 µm, meaning that the kink-and-tail diffusion profile must create a junction depth of no less than 0.6 µm.

Example 7—Preliminary Qualification Tests of RTWCG SiOx Films for Solar Cells and Other Applications The shelf life of several RTWCG solutions formulations have been tested. The longest shelf life test was of nearly eight years, conducted on an earlier solution formulation. For this ongoing shelf life test, one gallon of VT solution such as in FIG. 14, kept in an enclosed nalgene container, was periodically used during the said time frame to grow SiOx films on over 100 large area c-Si, mc-Si and poly-Si n+/p solar cells. To date, there have been no significant changes in the quality of the RTWCG SiOx ARC/SE cell structures produced or the resulting solar cell performances. Small area n+/p solar cells have also been utilized to test the shelf-life of the more recent RTWCG growth solution formulations. Most of the newer formulations again showed no significant changes in the RTWCG cell structure or performances.

Preliminary qualification tests of the high growth rate RTWCG SiOx films, including but not restricted to those described below, indicate that these SiOx films can potentially be used not only for silicon solar cell applications but for a host of other electronic (microelectronic) and optoelectronic (photonic) applications. Electrical and dielectric properties of the RTWCG SiOx films were extracted from a relatively large number of Al (Au)/as grown RTWCG SiOx film/Si/Au:Ti MOS capacitors with a front gate area of about 0.049 $cm^2$. The I-V and C-V characteristics were acquired on the fabricated MOS capacitors prior to and after various stress conditions, which were used to determine: (i) resistivity, (ii) leakage current, (iii) dielectric constant, and (iv) breakdown voltage of the SiOx thin films.

Figure 29A:
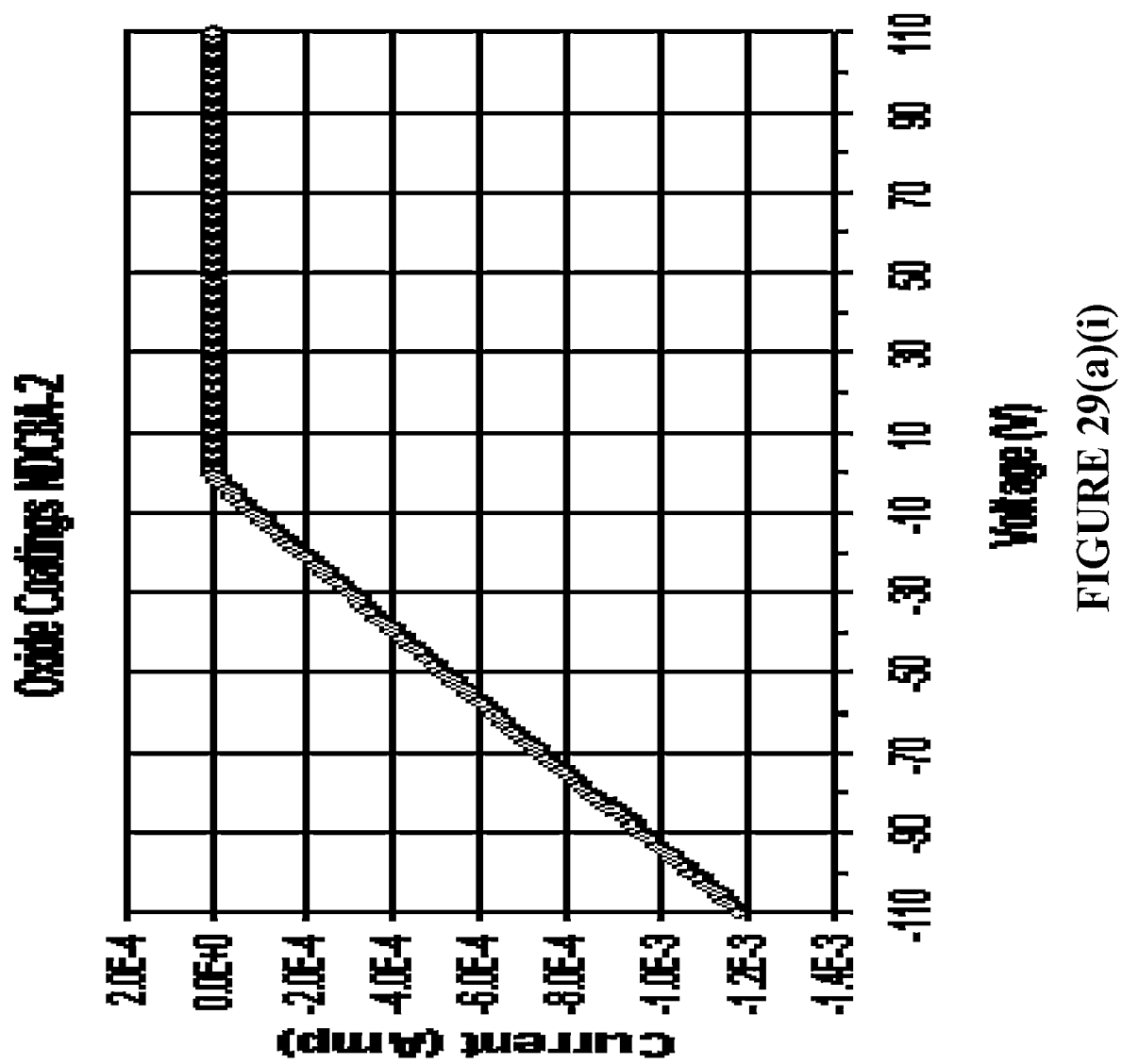
FIG. 29(a) Typical I-V characteristics from: (i) (−)110 V to +110 V, and (ii) from (−)3 V to +3 V bias voltage of a Al/as grown RTWCG SiOX/Si/Ti—Au MOS capacitor. The ~110 nm-thick SiOx film was grown in a solution such as in FIG. 13.
Figure 29B:
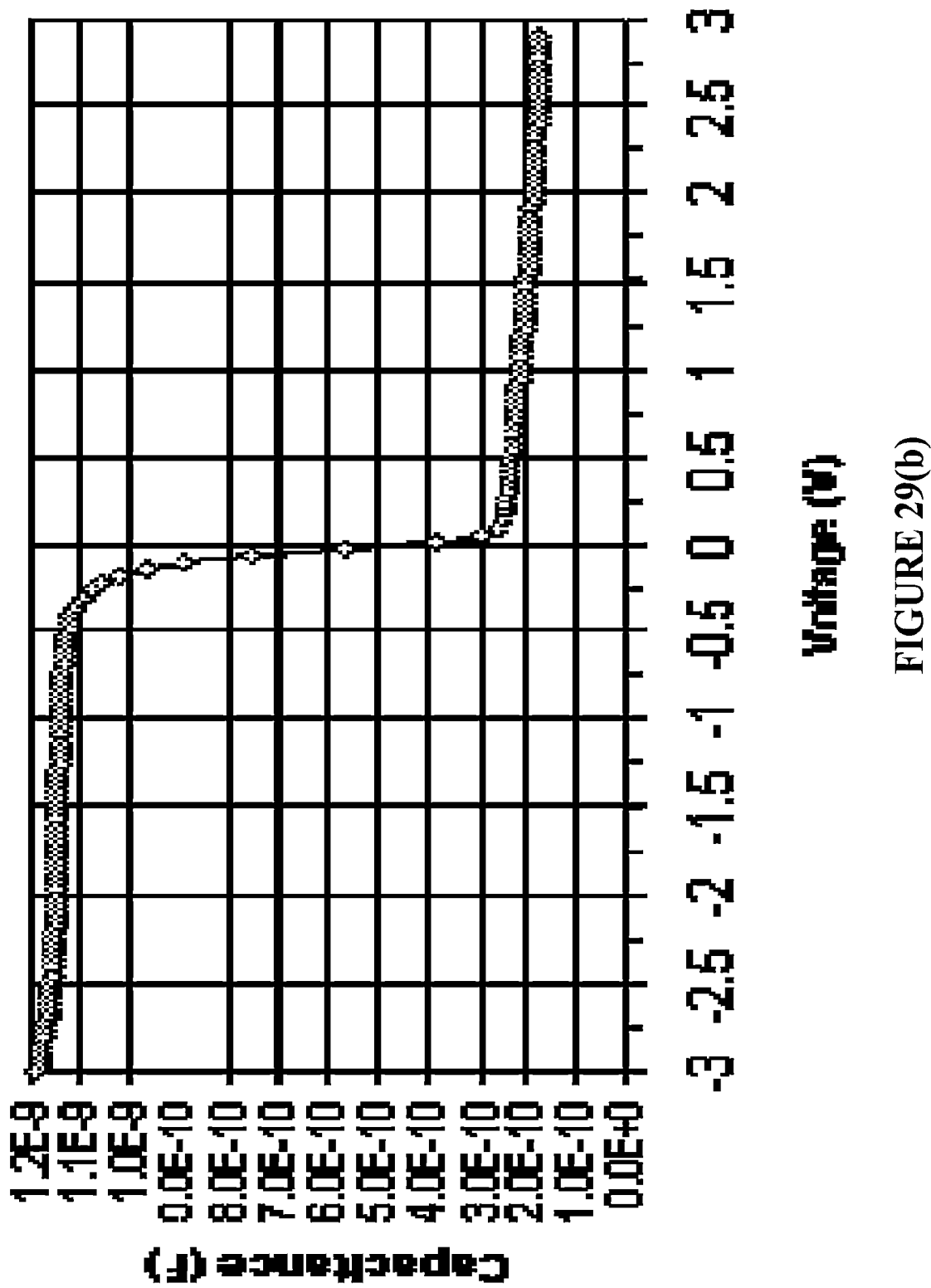
FIG. 29(b) C-V plot of the MOS capacitor in FIG. 29(a).

FIG. 29(a) shows the I-V characteristics of an Al/as grown RTWCG SiOx/Si/Ti-Au MOS capacitor for which the SiOX film thickness was 110 nm. The density of mobile ions within the SiOx thin film is shown to be very small by the I-V characteristics at bias voltage from (−) 110 V to (+) 110 V, and at bias voltage from (−)3 V to (+)3 V. Further evidence is the well behaved C-V plot in FIG. 29(b) acquired on the same MOS capacitors. The films' I-V characteristics not only meet the criteria for solar cell applications, but also for a host of other, more demanding, electronic and optoelectronic (photonic) device applications.

In a series of experiments, preferred RTWCG SiOx growth solution formulations, described herein, were utilized to create Al/as-grown SiOx/p-Si/Au:Ti MOS capacitors. Their I-V and C-V characteristics were acquired before and after voltage stress of up to 1 hour at a fixed bias of either (−)100 V or (+)100 V. The time dependent leakage current and breakdown voltage failed to show any noticeable variations resulting from the voltage stress.

The state-of-the-art leakage current density of RTWCG SiOx films is approximately 25 nA/$cm^2$ at 8 MV/cm applied positive electric field, and below 0.8 nA/$cm^2$ leakage current at 0.3 MV/cm applied positive and negative field. The state of the art resistivity of the RTWCG SiOx film is approximately $4 \times 10^{14}$ Ω-cm. The data compares well with known in the art data for spin-on and CVD SiNx films deposited at temperatures lower than 500° C. These results show that the RTWCG SiOx thin film dielectric is suitable for use as a passivation/antireflection coating for high efficiency silicon solar cells and for microelectronics and photonics applications.

Figure 30:
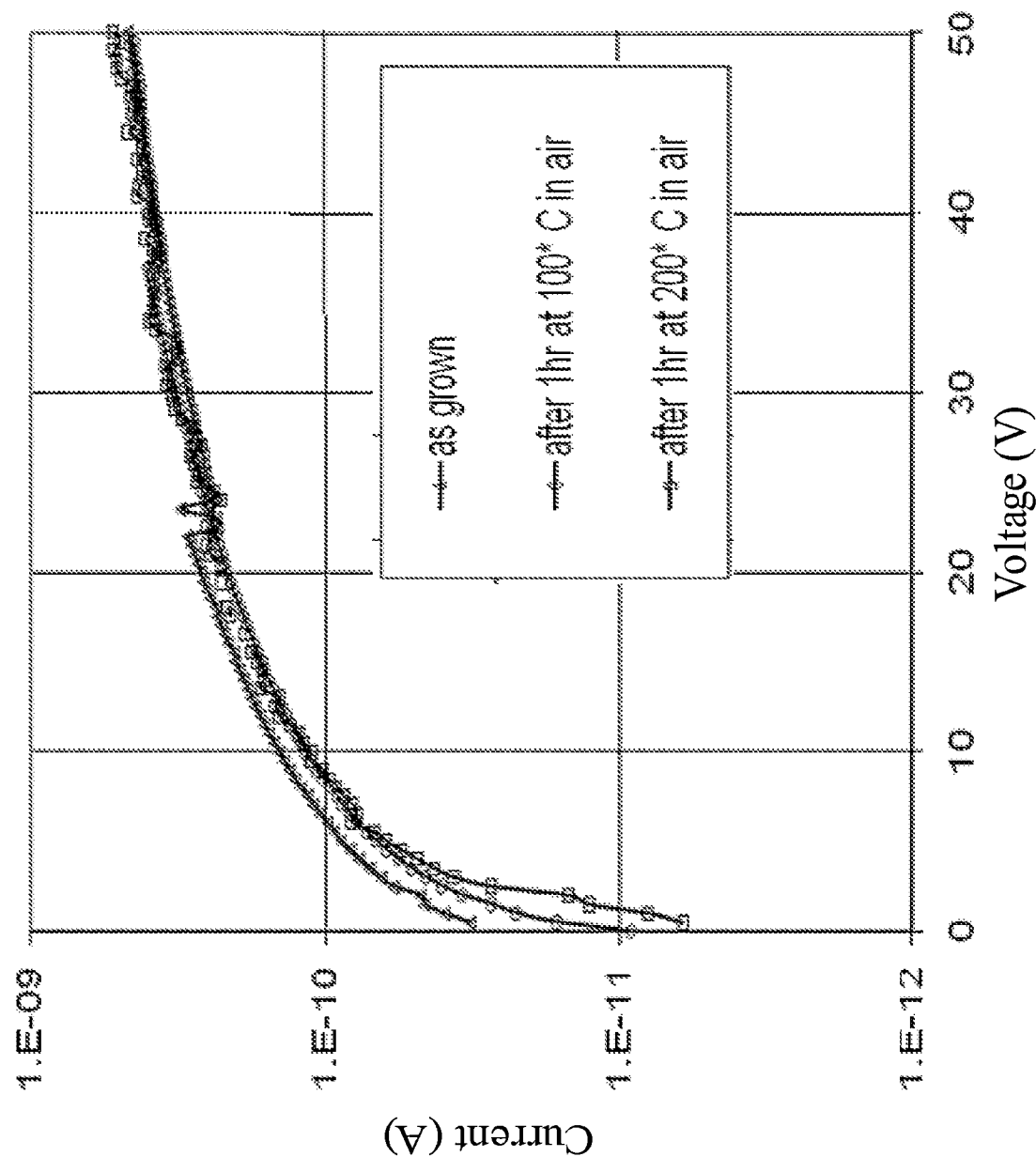
FIG. 30. I-V characteristics of a Al/as-grown SiOx film/p-Si/Au:Ti MOS capacitor (SiOx thickness: ~100 nm, front gate area: 0.049 $cm^2$), prior to and after one hour heat treatment in air at 100° C., followed by one hour heat treatment at 200° C.

FIG. 30 shows the I-V characteristics of an Al/as-grown RTWCG SiOx (100 nm-thick) film/p-Si/Au:Ti MOS capacitor, before and after an initial 1 hour heat treatment at 100° C., followed by a 1 hour 200° C. heat treatment. The leakage current decreased because the heat treatment dried out the surfaces of the as-grown SiOx film. The I-V data obtained from a large number of c-Si and mc-Si cells showed that humidity is driven off the surface of the as-grown SiOx film by a 5 min blow drying at approximately 120° C. In a related experiment it was found that by simply keeping the cells at room temperature for two to three days (depending on the thickness of the SiOx film) the Pmax increased by the same relative percentage as the cells that were heat treated at 120° C. for 5 minutes.

Five Al/as-grown RTWCG SiOX film/p-Si/Au:Ti MOS capacitors, five small area n+/p c-Si, and five small area n+/p mc-Si RTWCG SiOx ARC/SE solar cells were heat treated in air for 1 hour at progressively higher temperatures of 200° C., 300° C., 450° C., and 600° C., respectively. As can be seen in FIG. 18, the relatively high atomic concentration of hydrogen at the SiOx surface decreases with depth. Based on our experimental data, temperatures as low as 200° C. can cause hydrogen to migrate toward the SiOx/Si interface and passivate it. There is an observable drop in leakage current from approximately 5E-11 A/cm² to as low as 2E-12 A/cm² after a 200° C. heat treatment of up to 1 hour, at 0.3 MV/cm applied positive and negative bias. This decrease we believe is due in part to hydrogen passivation of the SiOx/Si interface. The leakage current of the MOS capacitors decreases incrementally, at smaller rates, after additional heat treatments of up to 1 hour at temperatures ranging from 200° C. to 450° C.

At 600° C. all MOS capacitors' leakage current increased somewhat, and the Pmax of all c-Si and me-Si solar cells decreased marginally due to a small decrease in Voc and FF. These findings were most likely caused by Al from the metal gate penetrating through the MOS capacitors' SiOx film, and the solar cells' Ag diffusing from the front grid lines causing some minor short-circuiting paths. It is worth mentioning, however, that the above c-Si and me-Si small area test cells were cut from production type solar cells that had a shallower junction than the optimal RTWCG SiOx ARC/SE(TO). According to this invention, the emitter of the RTWCG SiOx ARC/SE cell design should be 0.55 μm thick, and about 0.65 μm thick for the RTWCG SiOx ARC/SE/TO cell design.

Figure 31:
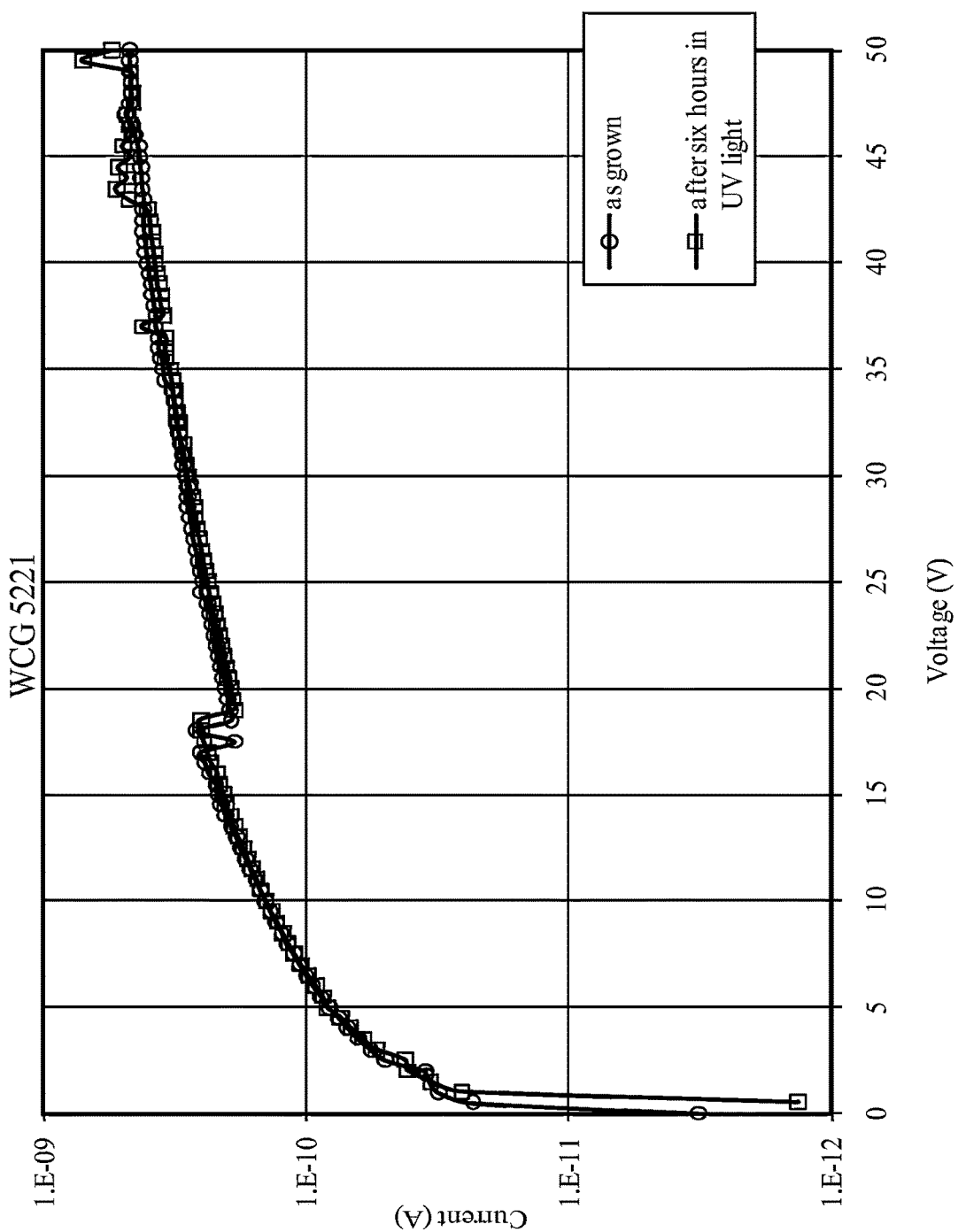
FIG. 31. I-V characteristics of a Al/RTWCG SiOx/Si/Au:Ti MOS capacitor kept at room temperature prior to and after the exposure to high intensity (about 5 $W/cm^2$) near UV radiation for six hours. SiOX thickness: ~120 nm.

In FIG. 31 are shown I-V characteristics of an Al/as grown RTWCG SiOx/Si/Au:Ti MOS capacitor kept at near room temperature prior to and after the exposure to relatively high intensity (5 W/cm²) near U-V radiation for six hours. The SiOx thickness in this example was about 140 nm, which is near the optimum thickness for use as an ARC. The above UV stress condition did not increase the leakage current as confirmed by the I-V data of small area c-Si and me-Si cells acquired prior to and after the exposure of the cells to near UV radiation for as long as 6 days. In one such experiment, 12 small area c-Si cells and 12 mc-Si small area cells were kept for 4 days under the above UV exposure. Surprisingly, the Isc, Voc, FF, Pmax, and Rs were either essentially unchanged or increased slightly. During the I-V testing, the temperature of the cells were kept at near 25° C. by the small area I-V system which was calibrated using NREL standard cells prior to acquiring all I-V data for this and all other stress-test experiments.

An existing high density xenon plasma (10E+5 to 10E+6, 1-3 eV) system, that could acquire in-situ I-V characteristics with applied voltage from (−)200 V to (+)200 V, was used to study plasma induced damage to the SiOx thin films. The plasma induced damage was evaluated for a family of 1-V curves, after the SiOx films were exposed several times to the plasma environment. Thin, 50 nm, SiOx films with a large, 1%, atomic concentration of Fe were grown on the front of 2-inch Si wafers. Good quality Au—Ti ohmic contacts were applied on the back surfaces.

Figure 32A:
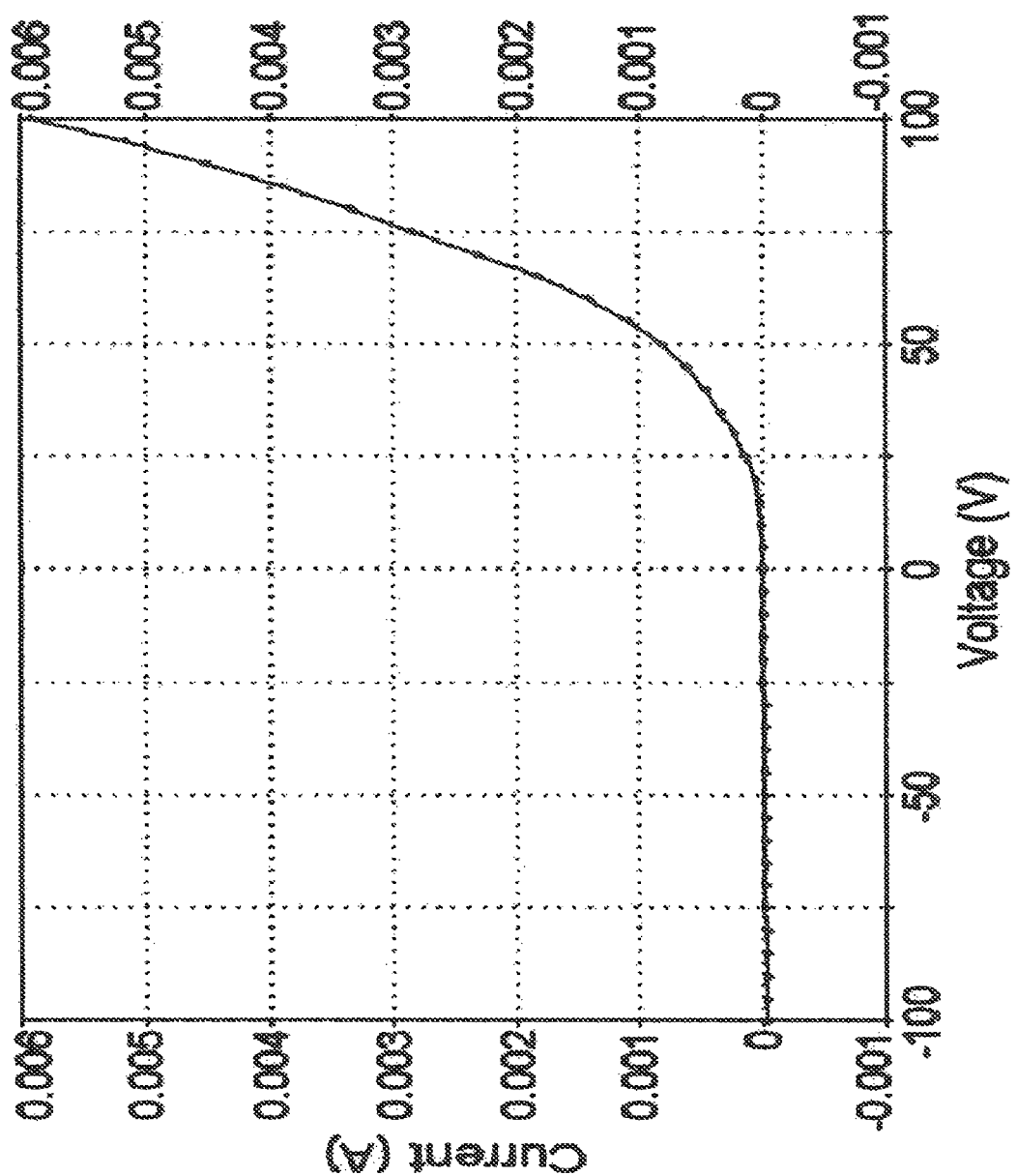
FIGS. 32(a) and 32(b). I-V plots of a 50 nm-thick SiOx-coated 2-inch p-Si wafer after 20 minutes in high density xenon plasma of 2×10E+5 $cm^{-3}$, electron temperature 1.7 eV, plasma potential 9.8 V, and neutral gas (Xe) residual pressure of 6×10E-5 Torr. The I-V plots were acquired after a 20-minute plasma exposure.
Figure 32B:
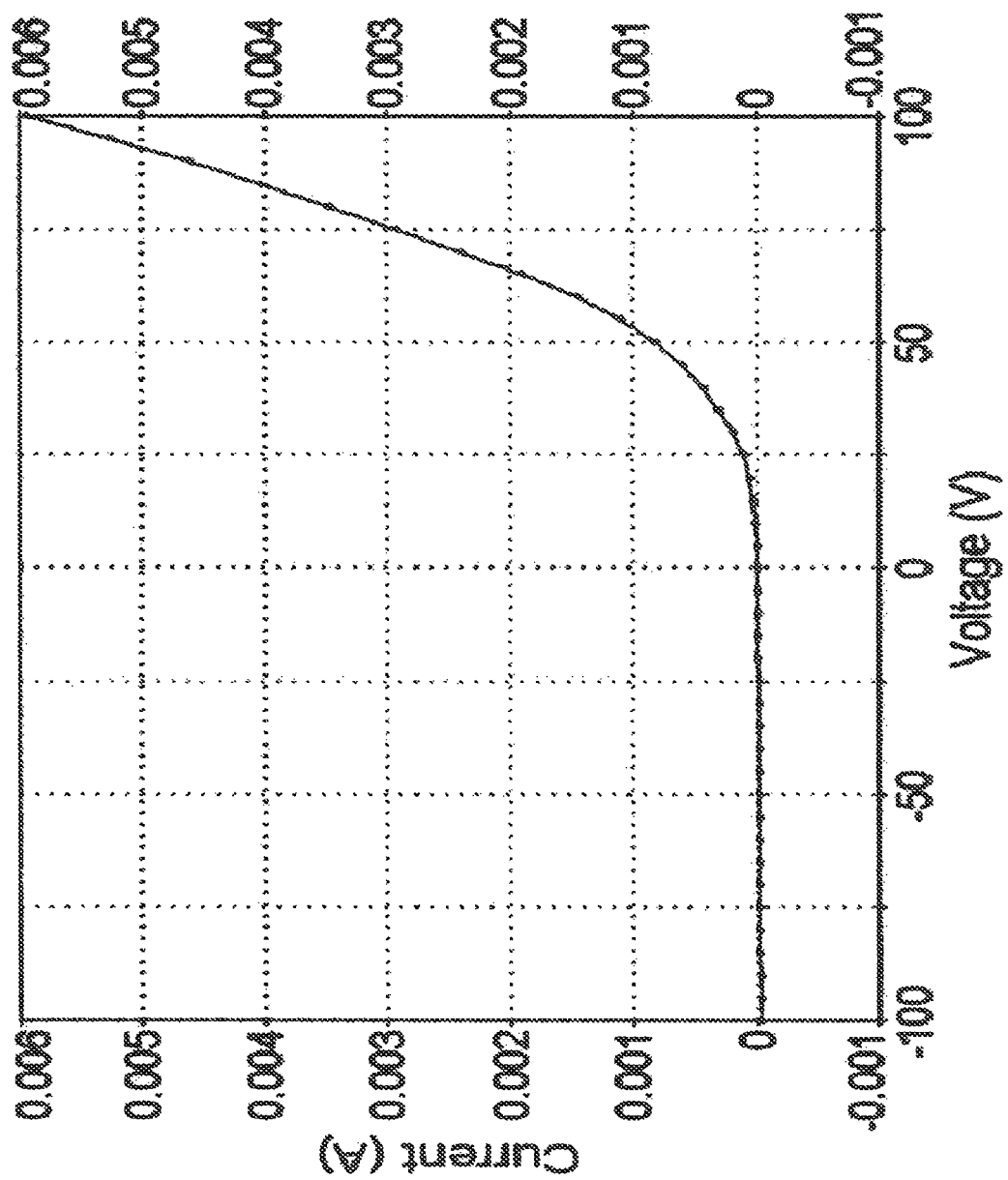

FIGS. 32(a) and 32(b) show two I-V plots for the SiOx coated 2-inch p-Si wafer, mentioned above, after a 5-minute plasma exposure. The plasma density was 2×10E+5 cm-3, the electron temperature was 1.7 eV, the plasma potential was 9.8 V, and the neutral gas (Xe) residual pressure was 6×10E-5 Torr. The I-V plots of FIGS. 32(a) and 32(b) clearly suggest that positive mobile ions are present, but the extremely small hysteresis, suggested by the two curves, indicates that the plasma generated SiOx/Si interface traps have a very low density. The I-V plots of the same sample after a subsequent 15 minutes plasma exposure, again show quasi-identical curves. This suggests that even after a combined 20-minute plasma exposure, a very small density of plasma generated SiOx/Si interface traps were created, despite a relatively large metallic impurity concentration in the SiOx film.

The leakage current through the SiOx film depends on the plasma density and the neutral (Ar) gas pressure. When a bias voltage of (+)70 V was applied, the leakage current was 1.6 mA for an Ar pressure of 2×10E-5 Torr, and 2.7 mA for an Ar pressure of 10E-4 Torr.

A SiOx film with a worst-case scenario, ~3%, Fe impurity atomic concentration, was biased at (−)200 V. Initially, its leakage current was 57 μA, and 60 μA after a 1 minute exposure. After the sample was biased at (+)100 V (Ar pressure 77 μTorr) the SiOx film had an initial leakage current of as high as 7 mA, but decreased to ~6 mA after one minute. Because changes in the SiOx top layer were suspected, a SiOx film was exposed to high intensity plasma for 25 minutes. XPS/SEM analyses, however, did not show any changes to the SiOX surface.

Conductivity (σ) can be estimated by using the equation:

$$\sigma = \frac{4t}{\pi d^2} \times \frac{I}{V}$$

where I is the leakage current, V is the bias voltage, d is the diameter of the sample, and t is the film thickness. One particular set of measurements, see above, had I=6 mA, V=100 V, d=5 cm, and t=50 nm. Applying the above equation, the SiOx film had $\sigma = 1.5 \times 10^{-11}$/Ω-cm, which corresponds to a relatively low film resistivity of about 6×10E+10 Ω-cm. Even though this relatively high conductivity refers to a worst-case scenario of Fe contamination, it nonetheless compares well with published values for conventional TiOx ARC films as well as other so called room temperature spin-on thin film dielectrics.

TABLE 5

Damp heat endurance test of small area
RTWCG SiOx-coated mc-Si solar cells cut
from the same large area production cell.
Damp Heat Test (DH): 80° C. with Relative Humidity near 100%

| Cell # | Solution | Description | Isc (A) | Voc (mV) | FF (%) | Rs (Ω) | Pmax (W) |
|---|---|---|---|---|---|---|---|
| A8 - 3 | MA-1 | Bare | 139.62 | 501 | 71.22 | 0.4652 | 49.782 |
|  |  | After SiOx | 199.62 | 512 | 69.81 | 0.3888 | 70.459 |
|  |  | After 72 hrs | 199.98 | 513 | 68.69 | 0.3933 | 70.474 |
|  |  | After 96 hrs | 203.29 | 513 | 68.38 | 0.3909 | 71.264 |
|  |  | After 144 hrs | 204.93 | 513 | 67.9 | 0.3999 | 71.359 |
|  |  | After 240 hrs | 206.21 | 513 | 67.64 | 0.3913 | 71.584 |
| A8 - 5 | H -1 | Bare | 150.85 | 500 | 70.83 | 0.4369 | 53.385 |
|  |  | After SiOx | 217.82 | 510 | 67.11 | 0.3887 | 74.491 |
|  |  | After 72 hrs | 216.11 | 512 | 68.27 | 0.3835 | 75.468 |
|  |  | After 96 hrs | 219.07 | 511 | 68.21 | 0.3791 | 76.361 |
|  |  | After 144 hrs | 217.15 | 511 | 68.47 | 0.3753 | 76.041 |
|  |  | After 240 hrs | 219.84 | 512 | 68.08 | 0.3833 | 76.589 |
| A8 - 14 | B | Bare | 175.14 | 500 | 70.98 | 0.3884 | 62.115 |
|  |  | After SiOx | 253.53 | 511 | 64.29 | 0.4156 | 83.336 |
|  |  | After 72 hrs | 251.88 | 512 | 64.97 | 0.4129 | 83.729 |
|  |  | After 96 hrs | 253.2 | 512 | 66.84 | 0.3552 | 86.598 |
|  |  | After 144 hrs | 255.09 | 512 | 66.25 | 0.3548 | 86.456 |
|  |  | After 240 hrs | 254.53 | 511 | 65.71 | 0.3721 | 85.512 |

Table 5 contains IV data for three small area mc-Si solar cells before and after full immersion in three different RTWCG SiOx growth formulations. It shows what happens to the Isc, Voc, FF, Rs, and Pmax after the RTWCG SiOX ARC/SE mc-Si cell structure formation and after exposure, for up to 240 hours, to a damp heat environment (80° C. at ~100% relative humidity).

The smaller than would be expected increases in Isc, Voc, and Pmax were caused by bare cells possessing a thinner-than-optimal emitter thickness. Cells having thicker emitters would take full advantage of the SE created during the RTWCG SiOx growth. This example shows that even if the remaining emitter is very thin, the cell does not degrade during the DH test. The next example of realization contains before and after SiOx coating I-V data for production cells that, although were not optimized for the RTWCG SiOx ARC/SE cell design, possessed thicker emitters.

Example 8—Performances of n+/p (P,B) RTWCG SiOx ARC/SE c-Si, Cast mc-Si, and Poly-Si Solar Cells The RTWCG SiOX ARC/SE/TO low-cost crystalline silicon solar cell technology works well with all crystalline silicon substrates such as Czochralski and float zone single crystal (c-Si), cast multi-crystalline (m-Si), and ribbon poly-crystalline silicon (poly-Si) substrates. The RTWCG SiOx process fits well with existing manufacturing methods such as screen printing metallization and only the diffusion step requires modification. Otherwise, it reduces the number and complexity of standard processing steps.

Optimization of the growth solutions took into account a large number of RTWCG SiOx variables such as solution formulations, growth rate, and the non-metalized emitter's etch back level. Structure variables that had to be taken into account included the junction depth, diffusion profile, and the kink depth of a kink and tail diffusion profile. Optimized metallization-compatible RTWCG SiOx growth solutions, in less than one minute, must be able to perform the following:

i. in situ clean the surfaces of bare cells;
ii. produce a low reflectance, high transmittance SiOx film;
iii. concomitantly produce a good quality selective emitter;
iv. create an optional textured film surface.

Completion of this exhaustive work was possible using a large number of production type c-Si as well as cast and ribbon mc-Si diffused structures and bare solar cells. Only a small number of small area solar cells were fabricated on diffused n+/p structures with a kink-and-tail diffusion profile, a requirement for the RTWCG SiOx ARC/SE/(TO) process.

Table 6 contains the manufacturer's I-V data for 12 uncoated 6-inch production c-Si solar cells and the I-V data for the same cells after SiOx coating. The cells' emitter was fairly thick and pyramids-textured, instead of the preferred smooth surface. The textured emitter surface made it impossible to acquire an accurate net majority carrier concentration profile, or the diffusion profile shape, so the junction depth was estimated to be deeper than 0.6 µm. The Isc average gain was modest at approximately 40%, with a surprisingly low average Voc gain of only 5 mV. However, due to a substantially large FF increase of nearly 12%, the average Pmax gain was a noteworthy 56%. Based on the manufacturer's data, the lot's calculated maximum absolute AM 1.5 efficiency was 16.4%, with a lot average of approximately 15.6%. This average efficiency clearly shows the potential of the RTWCG SiOx cell design and technology, especially since the cells were manufactured on scrap silicon substrates, had the large aspect ratio pyramids textured emitter surface, and the diffusion profile was far from optimal for the high efficiency RTWCG SiOX ARC/SE cell design.

Figure 33:
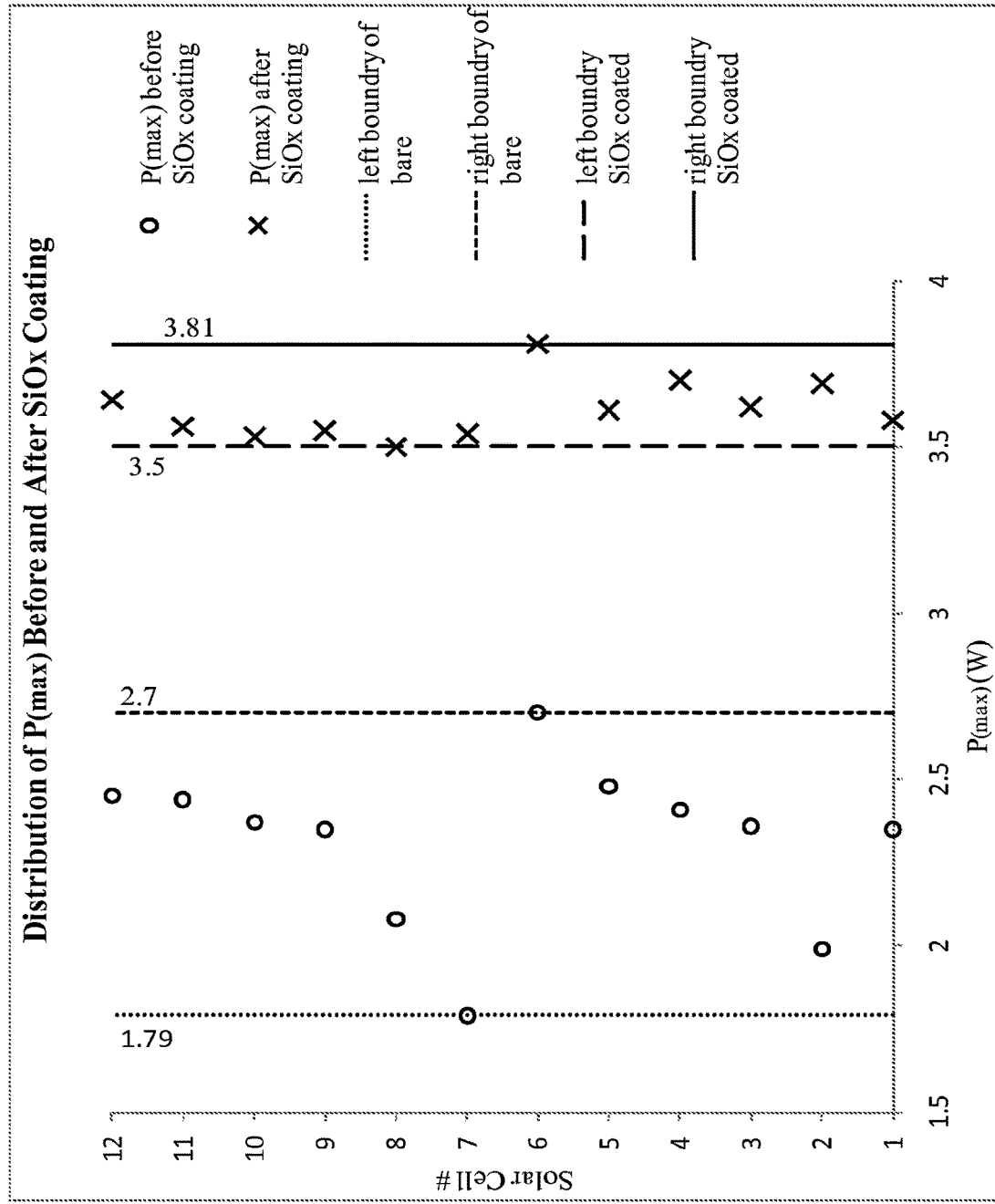
FIG. 33. Pmax dispersion of n+/p c-Si solar cells in Table 6 before and after RTWCG SiOx growth.

Suitable RTWCG SiOx growth solutions preserve the cell's metallization integrity and produce efficiency enhancement features that will, in part, lower reflectance, passivate the surface, and promote a good quality selective emitter. Yet, any given small cell lot (up to 30 cells per lot) contained anywhere from 2 to 5 cells with inordinately large Pmax (efficiency) gains after the SiOx coating. The Pmax of Cell #2 and cell #7 of Table 6, for instance, increased by 85.4% and 97.7%, respectively. This is explained by the SiOx growth solution's ability to in-situ clean the cell surfaces and eliminate certain harmful surface conditions prior to SiOx growth. This benefit, absent from known in the art conventional ARC coating techniques, leads to less Pmax dispersion for practically all of the many production type c-Si, mc-Si, and poly-Si solar cell lots tested. FIG. 33 shows that the Pmax dispersion of the cells in FIG. 6 is noticeably smaller after full immersion in the RTWCG SiOx ARC/SE growth solution.

The I-V data shown in Table 7 is from small area n+/p c-Si solar cells, cut from the same pyramids coated 6-inch cell, that were fully immersed in the RTWCG SiOx growth solution formulation of FIG. 12. Post-growth, the cells were dipped in 1% $HF_{(aq)}$ to produce a textured SiOx surface. Because the emitter was shallow, having an estimated junction depth of 0.45 μm-0.5 μm, the FF expectedly decreased post SiOx growth due to the emitter's etch back. Even though the resulting ~0.25 μm-thick emitter corresponded to an emitter sheet resistance greater than 120 Ω/sq, the series resistance (Rs) of the cell unexpectedly decreased by 23% on average.

The Isc gain (see Table 7) was the main contributor to the Pmax average increase of 51.58%. The relatively smaller Voc increase (up to 13 mV) is concordant to other related I-V data collected for coated cells whose remaining emitter's sheet resistance is over 120 n/sq. Even though the Isc may incrementally increase with increasing sheet resistance, the Voc and FF incrementally decrease. Test cells A5-1 and A5-7 are not included in the average gains since the immersion times of 30 seconds and 150 seconds, respectively, did not create films of similar thickness to the rest of the cells. But it is noteworthy that, as indicated by a 15.7% drop in cell A5-7's Rs, a relatively long immersion time does not seem to adversely affect the integrity of the screen printed contacts. Another interesting observation is that the Voc, Isc, and FF vary only slightly with the immersion times ranging between 50 and 70 seconds; small RTWCG SiOx process time variations do not greatly affect cell performances.

The junction depth is essential for maximizing the RTWCG SiOx ARC/SE/(TO) Pmax (efficiency). Table 8 shows the post SiOx Pmax gains for two small area c-Si solar cells. These were cut from production type n+/p c-Si large area cells, with pyramids coated surface and a deeper emitter estimated at 0.65 μm. The growth solution formulation, and post growth treatment, was the same as that of Table 6. Cell 20-2 had the best Voc and Pmax gains of 30 mV and 109%, respectively. The relatively large Pmax gain was driven by the FF which increased due to a relatively large Rs drop. The relatively large Voc increase indicates good SiOx surface passivation despite the fact that, after the 60-second immersion in growth solution, the remaining sheet resistance was too low at 50 Ω/sq.—The average Voc increase for the 32 small area cells cut from two large area solar cells was 17.2 mV. For this lot of small area solar cells, on average, the Pmax increased by 67.91%, i.e. ranging from 53.88% to 109.1% despite the relatively low average Isc gain of only 41.35%.

The largest Voc increase for a lot of 4 cm² n+/p c-Si cells with smooth emitters and kink-and-tail diffusion profiles such as in FIG. 3, was 17.7 mV. This mediocre increase was expected since, post-RTWCG SiOx ARC/SE cell structure formation, the net majority surface concentration was greater than 9E+19 cm⁻³.

On average the SiOx coating increased the efficiency of the small lot of 10 cells, which included the three cells in Table 10, by 54.49% (AM0 conditions). The average Isc was increased by 50.79%. As a comparison, the efficiency gain for production cells that utilize SiNx coatings does not exceed 35%, even with the positive effect to the cell's bulk which occurs during the CVD SiNx deposition. On this small lot of production cells, there was an absolute efficiency increase over SiNx coated cells of about 14.4%, even though the RTWCG SiOx process is a surface process which does not passivate the bulk. Based on the large volume of tested RTWCG SiOx cells much larger absolute efficiency gains are achievable using near optimal RTWCG SiOx ARC/SE/(TO) cell structures versus cells that utilize optimized SiNx ARC films without a SE.

Table 9 shows the I-V data, measured by the solar cell manufacturer, for a small lot of large area, low-efficiency n+/p poly-Si production solar cells before and after SiOx coating. It is noteworthy that the average Pmax gained by the RTWCG SiOx ARC/SE formation was 48%. As a comparison, to the best of our knowledge, the average gain in Pmax on production cells resulting from SiNx coatings is less than 35% which includes the effect of hydrogen bulk passivation.

Experimental work has shown that the SiOx ARC/SE efficiency enhancement features work better on low efficiency poly-Si production cells than on the more efficient c-Si cells. Table 10 shows the I-V data for three cells, out of a small lot of production type poly-Si solar cells, before and after they were fully immersed in SiOx growth solution. The cells were tested under standard AM0 conditions at NASA GRC; so the standard AM 1.5 efficiency values will be about 20% higher. As can be seen on one of these cells, the main parameter contributing to its large, 97.5%, AM0 efficiency Pmax increase after the SiOx coating was the 89.5% increase in Isc. This large Isc increase cannot be explained by a simple reduction in optical loses, neither can it be explained by simple surface passivation since the maximum increase in Voc was only 16.2 mV. The explanation has to be that there was a combination of optical, surface passivation, and some other factors.

TABLE 6

Prior to and after RTWCG SiOx Coating AM 1.5 I-V data for n+/p c-Si solar cells using scrap wafers and pyramids coated surfaces such as in FIG. 20.

| Cell Description | Isc | Voc (mV) | FF | Pmax |
|---|---|---|---|---|
| Cell 1 Bare | 5.81 A | 593.4 | 68.20% | 2.35 W |
| Cell 1 after 55 sec RTWCG SiOx Coating | 7.97 A | 599.0 | 74.90% | 3.58 W |
| Gain | 37.18% | 0.94% | 9.82% | 52.34% |
| Cell 2(*) Bare | 5.71 A | 585.9 | 59.60% | 1.99 W |
| Cell 2(*) after 60 sec RTWCG SiOx Coating | 8.18 A | 597.0 | 75.60% | 3.69 W |
| Gain | 43.26% | 1.89 % | 26.85% | 85.43% |
| Cell 3 Bare | 5.87 A | 585.9 | 68.60% | 2.36 W |
| Cell 3 after 60 sec RTWCG SiOx Coating | 8.29 A | 596.0 | 73.30% | 3.62 W |
| Gain | 41.23% | 1.72% | 6.85% | 53.39% |
| Cell 4 Bare | 5.83 A | 592.8 | 69.80% | 2.41 W |
| Cell 4 after 60 sec RTWCG SiOx Coating | 8.23 A | 595.0 | 75.50% | 3.70 W |
| Gain | 41.17% | 0.37% | 8.17% | 53.53% |
| Cell 5 Bare | 5.86 A | 596.0 | 70.90% | 2.48 W |
| Cell 5 after 60 sec RTWCG SiOx Coating | 8.15 A | 598.0 | 74.00% | 3.61 W |
| Gain | 39.08% | 0.34% | 4.37% | 45.56% |
| Cell 6 Bare | 5.89 A | 588.0 | 65.60% | 2.70 W |
| Cell 6 after 65 sec RTWCG SiOx Coating | 8.26 A | 592.0 | 74.20% | 3.81 W |

TABLE 6-continued

Prior to and after RTWCG SiOx Coating AM 1.5 I-V data for n+/p c-Si solar cells using scrap wafers and pyramids coated surfaces such as in FIG. 20.

| Cell Description | Isc | Voc (mV) | FF | Pmax |
|---|---|---|---|---|
| Gain | 40.24% | 0.68% | 13.11% | 41.11% |
| Cell 7(*) Bare | 5.74 A | 589.2 | 53.00% | 1.79 W |
| Cell 7(*) after 65 sec RTWCG SiOx Coating | 8.15 A | 595.0 | 72.90% | 3.54 W |
| Gain | 41.99% | 0.98% | 37.55% | 97.77% |
| Cell 8 Bare | 5.88 A | 588.3 | 60.10% | 2.08 W |
| Cell 8 after 70 sec RTWCG SiOx Coating | 8.11 A | 593.0 | 72.80% | 3.50 W |
| Gain | 37.93% | 0.80% | 21.13% | 68.27% |
| Cell 9 Bare | 5.86 A | 590.5 | 67.80% | 2.35 W |
| Cell 9 after 60 sec RTWCG SiOx Coating | 8.21 A | 591.0 | 73.30% | 3.55 W |
| Gain | 40.10% | 0.08% | 8.11% | 51.06% |
| Cell 10 Bare | 5.91 A | 587.3 | 68.40% | 2.37 W |
| Cell 10 after 60 sec RTWCG SiOx Coating | 8.27 A | 590.0 | 72.50% | 3.53 W |
| Gain | 39.93% | 0.46% | 5.99% | 48.95% |
| Cell 11 Bare | 5.87 A | 593.2 | 69.90% | 2.44 W |
| Cell 11 after 60 sec RTWCG SiOx Coating | 8.17 A | 597.0 | 73.10% | 3.56 W |
| Gain | 39.18% | 0.64% | 4.58% | 45.90% |
| Cell 12 Bare | 5.88 A | 593.3 | 70.20% | 2.45 W |
| Cell 12 after 60 sec RTWCG SiOx Coating | 8.24 A | 596.0 | 74.10% | 3.64 W |
| Gain | 40.14% | 0.46% | 5.56% | 48.57% |
| Average of All Bare Cells | 5.84 A | 590.3 | 66.01% | 2.31 W |
| Average of all RTWCG SiOx Coated Cells | 8.19 A | 594.9 | 73.85% | 3.61 W |
| Average Gain | 40.11% | 0.78% | 11.88% | 56.03% |

TABLE 7

I-V data on small area n+/p c-Si solar cells cut from the same 6-inch cell with a shallower emitter, with a junction depth estimated at about 0.45 um, and with a pyramids coated emitter surface.

| Cell Description | Reaction Time (seconds) | Isc Bare Cell (A) | Isc RTWCG SiOx Coating (A) | Voc Bare Cell (mV) | Voc RTWCG SiOx Coating (mV) | FF Bare Cell (%) | FF RTWCG SiOx Coating (%) | Rs Bare Cell (Ω) | Rs RTWCG SiOx Coating (Ω) | Pmax Bare Cell (W) | Pmax RTWCG SiOx Coating (W) |
|---|---|---|---|---|---|---|---|---|---|---|---|
| A5-2 | 50 | 280.31 | 438.29 | 581.0 | 592.0 | 73.8 | 70.1 | 0.25 | 0.19 | 120.18 | 182.05 |
| Gain | | 56.36% | | 1.89% | | -4.95% | | -22.36% | | 51.48% | |
| A5-3 | 50 | 262.89 | 398.84 | 579.0 | 592.0 | 70.9 | 71.1 | 0.28 | 0.20 | 107.91 | 168.19 |
| Gain | | 51.71% | | 2.25% | | 0.28% | | -29.00% | | 55.86% | |
| A5-4 | 55 | 262.71 | 400.85 | 583.0 | 593.0 | 72.4 | 71.2 | 0.27 | 0.20 | 110.92 | 169.16 |
| Gain | | 52.58% | | 1.72% | | -1.77% | | -26.38% | | 52.51% | |
| A5-5 | 55 | 331.66 | 514.03 | 577.0 | 590.0 | 69.6 | 68.0 | 0.21 | 0.17 | 133.28 | 206.31 |
| Gain | | 54.99% | | 2.25% | | -2.28% | | -18.91% | | 54.80% | |
| A5-6 | 60 | 412.68 | 625.86 | 581.0 | 593.0 | 70.4 | 68.1 | 0.18 | 0.15 | 168.82 | 252.73 |
| Gain | | 51.66% | | 2.07% | | -3.17% | | -17.49% | | 49.70% | |
| A5-8 | 60 | 271.71 | 400.57 | 579.0 | 586.0 | 66.8 | 65.6 | 0.27 | 0.22 | 105.03 | 153.98 |
| Gain | | 47.43% | | 1.21% | | -1.80% | | -19.42% | | 46.60% | |
| A5-9*** | 60 | 216.41 | 332.85 | 581.0 | 591.0 | 68.5 | 68.2 | 0.31 | 0.24 | 86.00 | 134.20 |
| Gain | | 55.81% | | 1.72% | | -0.38% | | -22.17% | | 56.04% | |
| A5-10 | 65 | 263.51 | 408.20 | 588.0 | 596.0 | 73.7 | 71.7 | 0.24 | 0.19 | 114.23 | 174.20 |
| Gain | | 54.91% | | 1.36% | | -2.82% | | -21.21% | | 52.49% | |
| A5-11 | 65 | 228.97 | 351.41 | 586.0 | 595.0 | 73.4 | 71.4 | 0.28 | 0.22 | 98.51 | 149.20 |
| Gain | | 55.47% | | 1.54% | | -2.71% | | -21.94% | | 51.45% | |
| A5-12 | 65 | 241.23 | 365.82 | 587.0 | 596.0 | 73.5 | 71.9 | 0.27 | 0.20 | 104.07 | 156.67 |
| Gain | | 51.65% | | 1.53% | | -2.19% | | -22.95% | | 50.54% | |
| A5-13*** | 70 | 218.45 | 334.30 | 589.0 | 597.0 | 73.9 | 72.0 | 0.30 | 0.22 | 95.01 | 143.75 |
| Gain | | 53.03% | | 1.36% | | -2.45% | | -25.79% | | 51.30% | |
| A5-14 | 60 | 272.01 | 409.17 | 590.0 | 596.0 | 74.9 | 72.8 | 0.23 | 0.19 | 120.21 | 177.39 |
| Gain | | 50.42% | | 1.02% | | -2.84% | | -20.20% | | 47.57% | |
| A5-1* | 30 | 263.51 | 408.20 | 588.0 | 596.0 | 73.7 | 71.7 | 0.24 | 0.19 | 114.23 | 174.20 |
| Gain | | 54.91% | | 1.36% | | -2.82% | | -21.21% | | 52.49% | |
| A5-7** | 150 | 312.02 | 456.06 | 577.0 | 583.0 | 66.4 | 64.2 | 0.24 | 0.20 | 119.52 | 170.53 |
| Gain | | 46.16% | | 1.04% | | -3.37% | | -15.79% | | 42.67% | |
| Average | | 271.9 | 415.0 | 583.4 | 593.1 | 71.8 | 70.2 | 0.26 | 0.20 | 113.7 | 172.3 |
| Average Gain | | 52.65% | | 1.66% | | -2.28% | | -22.61% | | 51.58% | |
| Average Deviation | | 34.9 | 55.5 | 3.8 | 2.4 | 2.2 | 1.8 | 0.03 | 0.02 | 14.7 | 21.8 |

TABLE 8

Prior to and After RTWCG SiOx coating AM 1.5 I-V data for n+/p c-Si solar cells using scrap wafers and pyramids coated surfaces such as in FIG. 21.

| Cell # | Description | Isc (mA) | Voc (mV) | FF (%) | Rs (Ohm) | Pmax (mW) |
|---|---|---|---|---|---|---|
| 18-8 | Bare | 222.2 | 569 | 50.71 | 0.408 | 64.1 |
|  | 30 sec Full Immersion | 317.4 | 589 | 61.1 | 0.268 | 114.2 |
|  | Increase | 42.8% | 3.5% | 20.5% | −34.3% | 78.2% |
| 20-2 | Bare | 81.85 | 550 | 39.36 | 1.58 | 17.73 |
|  | 60 sec Full Immersion | 114.4 | 580 | 55.85 | 0.69 | 37.07 |
|  | Increase | 39.8% | 5.5% | 41.9% | −56.3% | 109.1% |

TABLE 9

Prior to and after RTWCG SiOx coating AM 1.5 I-V data on large area n+/p poly-Si production solar cells.

| Wafer | Before | | | | After SiOX Coating | | | |
|---|---|---|---|---|---|---|---|---|
|  | Voc | Isc | Pmax | FF | Voc | Isc | Pmax | FF |
| 1 | 516 | 4.01 | 1.41 | 68.2 | 525 | 5.93 | 2.08 | 66.8 |
| 2 | 517 | 3.98 | 1.38 | 66.9 | 521 | 5.83 | 2.04 | 67.0 |
| 3 | 514 | 3.99 | 1.34 | 65.0 | 520 | 5.96 | 2.02 | 65.2 |
| 4 | 516 | 3.95 | 1.40 | 68.8 | 522 | 5.78 | 2.07 | 68.5 |
| 5 | 514 | 4.02 | 1.41 | 68.1 | 525 | 5.71 | 2.06 | 68.7 |
| 6 | 514 | 4.00 | 1.38 | 67.2 | 517 | 5.67 | 1.98 | 67.5 |
| 7 | 513 | 3.95 | 1.35 | 66.6 | 526 | 5.76 | 2.08 | 68.9 |
| 8 | 516 | 4.06 | 1.38 | 65.9 | 523 | 5.76 | 2.02 | 67.2 |
| 9 | 518 | 4.03 | 1.39 | 66.6 | 520 | 5.63 | 2.03 | 69.3 |
| Avg | 515 | 4.00 | 1.38 | 67.0 | 522 | 5.78 | 2.04 | 67.7 |
| % Increase |  |  |  |  | 1.33% | 44.57% | 47.71% | 0.93% |

TABLE 10

Prior to and after SiOx coating AM0, 25° C. I-V data of selected low efficiency poly-Si production solar cells.

| Cell # | Description | Isc (A) | Voc (mV) | FF (%) | Eff (%) |
|---|---|---|---|---|---|
| P-33 | Bare | 1.72 | 498 | 56.3 | 3.25 |
|  | 65 sec Full Immersion | 2.71 | 510.8 | 54.3 | 5.07 |
|  | Increase | 57.6% | 2.6% | −3.6% | 56.0% |
| P-37 | Bare | 1.69 | 500.5 | 57.9 | 3.3 |
|  | 60 sec Full Immersion | 2.74 | 516.7 | 60.5 | 5.78 |
|  | Increase | 62.1% | 3.2% | 4.5% | 75.2% |
| P-45 | Bare | 1.53 | 505.3 | 62 | 3.23 |
|  | 65 sec Full Immersion | 2.9 | 517.8 | 62.9 | 6.38 |
|  | Increase | 89.5% | 2.5% | 1.5% | 97.5% |

Very recently, a lot of 18 large area (243.5 cm$^2$) cast mc-Si n+/p solar cells were produced by Equity Solar, Inc. The I-V data was measured by a specialized independent lab before and after the RTWCG SiOx growth. On average the AM 1.5 efficiency was ~44.14%, Voc 603.5 mV, the FF 78.9%, and the average Jsc was at ~29.7 mA/cm$^2$. It is noteworthy that post SiOx coating the FF of three cells was near or above 82%, namely at 81.95%, 82.22%, and 83.56%. The 83.56% FF value is closed to the ideal theoretical limit range of 85%-86% for silicon cells operating in low injection conditions. To our knowledge, this FF value is the highest FF ever reported for large area screen printed metallization mc-Si solar cells and the highest FF reported for any large area crystalline silicon solar cells.

The above RTWCG SiOx films were grown using two ultra-low cost RTWCG SiOx solution formulations such as in Example 1. The growth time for the 140-150 nm-thick SiOx film was approximately 30 seconds, and the emitter's non-metalized surface was etched back by ~0.20 μm. Unfortunately, the film grew on less than 85% of the emitter surface. It was found that during the plasma etch edge isolation, the n+ emitter was accidentally removed from an estimated 15% of the active cell area. The SiOx growth solutions' inability to grow SiOx on the emitter-less portions of the cells is due to an art effect of the differential SiOx growth rate on heavily doped versus lightly doped silicon surfaces. Obviously, if the above portions of the emitter had not been inadvertently removed, the average AM 1.5 efficiency of the above non-optimized cast me-Si solar cells would have been higher than 16.2%.

It is noteworthy that the average shunt resistance (Rsh) value more than doubled for the above me-Si lot after SiOx coating. The average series resistance (Rs) of the 11 cells which utilized the first growth solution decreased after the SiOx coating by about 30%, i.e. from 7.75 μΩ to 5.41 μΩ. The remaining 7 cells which utilized the second SiOx growth solution had an average Rs decrease of 20%, from 6.95EμΩ to 5.59 μΩ. The high FF values obtained on these RTWCG SiOx ARC/SE cells are consistent with the large Rsh increases and large Rs decreases. Increases of as much as 500% in Rsh can occur in thick emitter cells due to the elimination of certain short circuiting paths from the bare cells. Decreases of as much as 60% in Rs occur in practically all deep junction cells but are difficult to fully explain since a relatively large, 0.20 μm, thickness of the non-metalized emitter surface is etched back during the RTWCG SiOx ARC/SE cell structure formation and up to 0.30 μm during the RTWCG SiOx ARC/SE/TO cell structure formation.

Figure 25B:
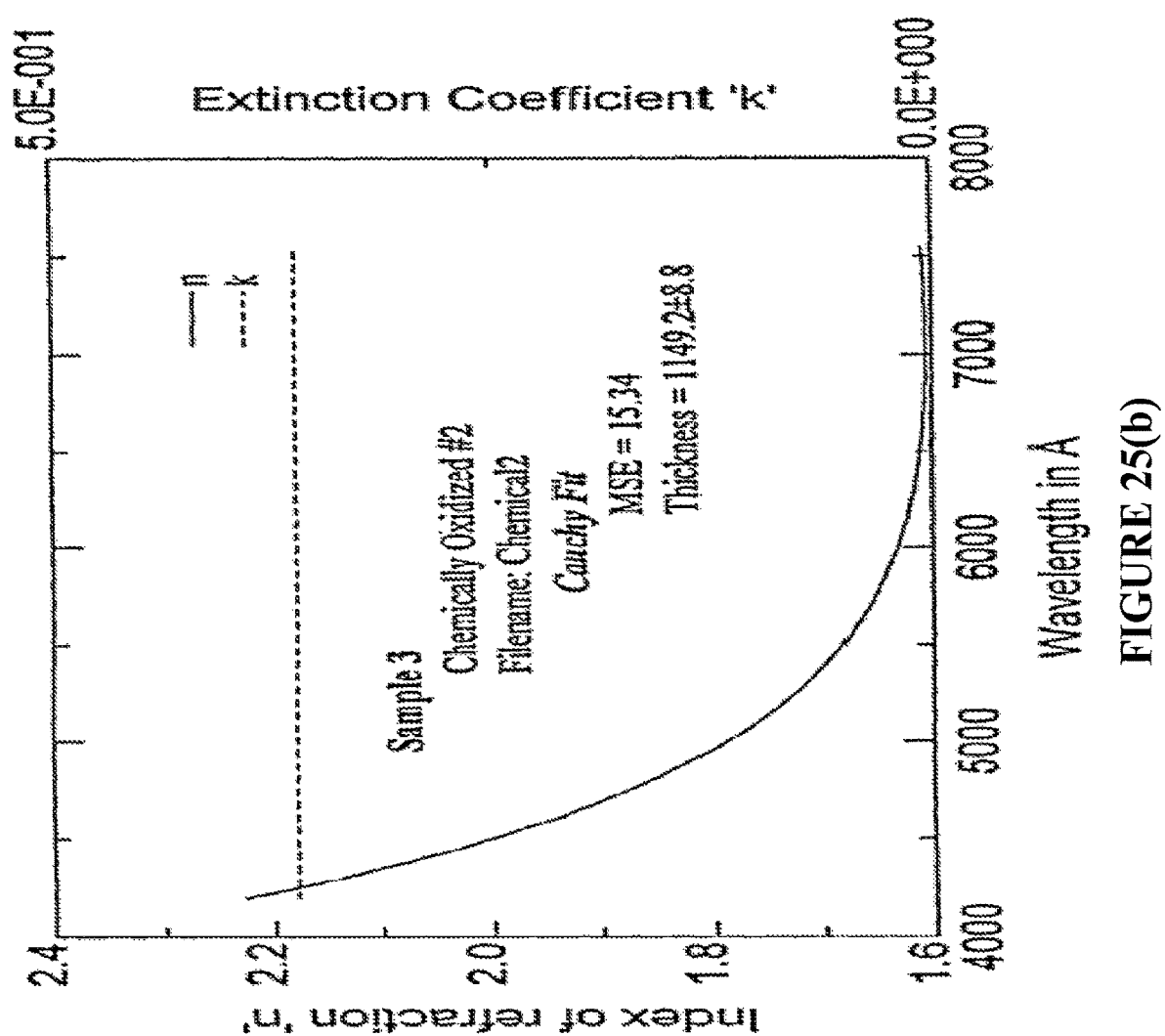
FIG. 25(b) Index of refraction and extinction coefficient vs wavelength for a silicon-rich SiOx film.

The overall performance gains that are offered to solar grade c-Si, me-Si, and other crystalline silicon solar cells, by the low-cost SiOx ARC/SE/(TO) process are conclusively larger than what can be achieved by any other known state-of-the-art ARC/SE scheme. But, the advantages of using the RTWCG SiOx processing do not stop at the cell level; it has the ability to:

i. control the index of refraction at the top of the SiOx film (see FIGS. 25(a), 25(b));
ii. produce a graded index of refraction (see FIG. 9 to FIG. 15);
iii. texture the top of the SiOx film (see FIG. 28).

The RTWCG SiOx process can create SiOx film with a 3% AM 1.5 average weighted reflectance (AWR) (FIG. 24) that is a very good match for creating good glass-EVA-SiOx-Si structures.

Figure 34:
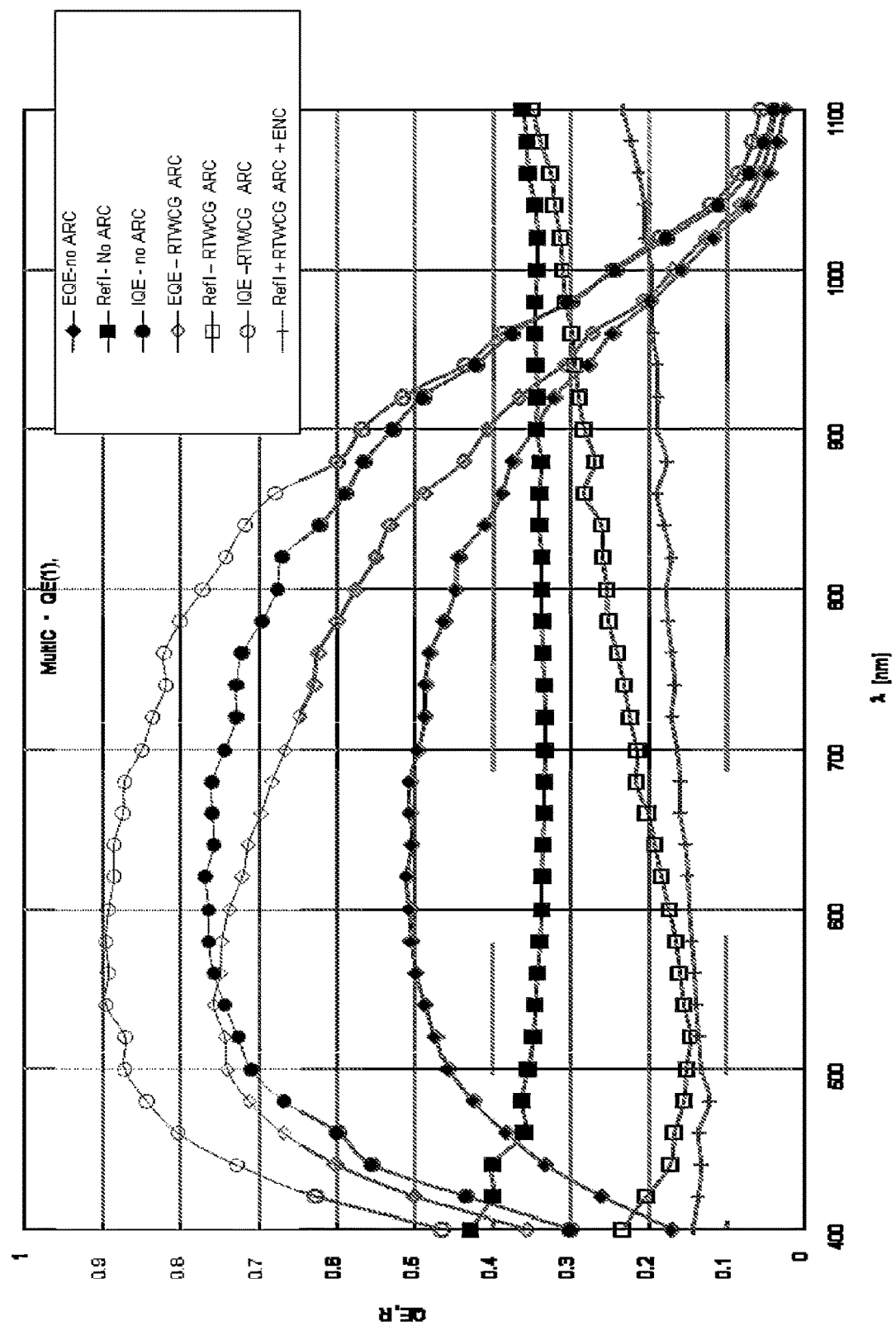
FIG. 34. External and internal quantum efficiency and reflectance plots on large area (6") production-type mc-Si solar cells prior to and after the RTWCG SiOx ARC/SE, as well as the reflectance plot of a SiOx-coated cell after a standard EVA encapsulation into a mini-module.

FIG. 34 shows the external and internal quantum efficiency and reflectance plots of large area, 6", production-type me-Si solar cells prior to and after the RTWCG SiOx ARC/SE process and after a standard EVA encapsulation into a mini-module. The internal and external quantum efficiency plots clearly show that the blue response gain, ~61% at 500 nm, is responsible for the large post-SiOx growth gains in cell performances. Although this is by no means the largest possible blue response gain that is achievable by near-optimal RTWCG SiOx ARC/SE/(TO) cells, this example was chosen because it clearly shows the decrease in the AM 1.5 AWR of a RTWCG SiOx coated cell after encapsulation. Prior to encapsulation the cell's AM 1.5 AWR was 23.1% which fell to 16.7% after encapsulation. Please note that these reflectance plots include the reflectance of the grid and buss bars.

While the relatively large gains of RTWCG SiOx-coated solar cells in cell performances are important, the cell efficiency is what makes any new cell fabrication technology truly meaningful. Below are the expected performances of near-optimal RTWCG SiOx ARC/SE/(TO) c-Si and me-Si solar cells which are based on comparative data gathered from a large number of n+/p Si cells. The calculated performances assume that the good quality 200 μm-thick c-Si and me-Si solar grade substrates have a smooth emitter with a near optimal kink-and-tail diffusion profile that has a net majority donor concentration between 6E+20 $cm^{-3}$ and 8E+20 $cm^{-3}$ at the emitter's surface and a kink at about 0.1 μm below the emitter's surface. The junction depth should be between 0.5 μm and 0.55 μm. After the growth solution etches back 0.2 μm from the non-metalized emitter surface, the remaining active emitter's surface concentration should be between 8E+18 $cm^{-3}$ and 1E+19 $cm^{-3}$, and the remaining sheet resistance should be between 110 Ω/sq and 120 Ω/sq. Under these conditions, the low cost RTWCG SiOx growth solutions will produce a highly transparent, low reflectance ARC layer, an excellent quality SE, and a Voc increase of 30 mV to 50 mV.

Our comparative data shows that for RTWCG SiOx ARC/SE c-Si cells the expected average Voc should be above 640 mV, the average Isc above 37 mA/$cm^2$, a 80% FF, and a calculated AM 1.5 efficiency of ~18.9%. For near optimal RTWCG SiOx ARC/SE good quality solar grade n+/p c-Si cell structures, the expected achievable average performances are: Voc of 650 mV, Isc of 38 mA/$cm^2$, FF of 82%, and an AM 1.5 average efficiency of 20.25%. For good quality solar grade cast mc-Si substrates, the average post SiOx coated RTWCG SiOx ARC/SE mc-Si cell structures should produce a Voc of about 625 mV, a current density in excess of 34.5 mA/$cm^2$, a FF of about 80%, and an AM 1.5 average efficiency of over 17.25%. For near optimal RTWCG SiOx ARC/SE good quality me-Si cell structures, the expected average performances are: Voc of 635 mV, Isc of 36 mA/$cm^2$, and FF of 0.815, which will increase the AM 1.5 average efficiency to about 18.6%.

It is estimated that the average AM 1.5 efficiency would be above 21% for n+/p c-Si and 19% for cast mc-Si solar cells by using: near optimal RTWCG SiOx ARC/SE/TO cell structures, good quality solar grade substrates, better quality front and back surface screen printing metallization pastes, and an optimized front grid design. By replacing the n+/p RTWCG SiOx ARC/SE/TO cell structures in the examples above with n+/p/p+ or p+/n/n+ RTWCG SiOx ARC/SE/TO silicon solar cell structures in Examples 10 and 11, it is estimated that the achievable AM 1.5 average efficiency of c-Si solar cells is about 22.5%, and that of cast me-Si solar cells is slightly in excess of 20%.

Example 9—RTWCG SiOX Coated VMJ Si Concentrator Cell

It is imperative that dielectric layers, such as ARC thin films, passivate the surface well if they are to be deposited, or grown, directly on a Si surface. This is problematic for most known in the art deposition techniques of present art conventional ARC, DLARC, or TLARC antireflection coatings.

The RTWCG SiOX thin film dielectrics are chemically grown at room temperature and result in well-defined non-crystalline layers with short-range order. These chemically stable SiOx coatings passivate the Si surface well and the RTWCG SiOx process does not require post-growth annealing. The SiOx film's chemical stability and surface passivation depend on the film's composition and by extension, the growth solution's composition. Due to a smaller metallic impurity concentration and a graded index of refraction, state-of-the-art SiOx thin films (see FIGS. 9 to 15) have superior passivation properties to previous SiOX films (see FIG. 7 and FIG. 8).

Due to their low Isc values, which in case of other concentrator cell designs limit the concentration level at which they can operate, Vertical MultiJunction (VMJ) Si solar cells (U.S. Pat. No. 4,332,973 and #4,409,422 and #4,516,314) show promise for use as high intensity concentrator solar cells. The biggest contributor to efficiency loss in the Si VMJ cell structure is the fact that its illuminated surface, the back surface, and two non-metalized edge surfaces are high recombination surfaces with exposed junctions that are difficult to passivate by any traditional means. Traditional ARC's, such as thermal $SiO_2$, with known good passivation properties, cannot be utilized on these cells because of temperature constraints.

Some early Vertical Multi-Junction (VMJ) Si solar cells [9] were provided to SPECMAT, Inc. by PhotoVolt, Inc., on which the RTWCG process grew SiOX coatings simultaneously on all non-metalized surfaces. The performances on both sides of a Si VMJ cell in Table 11 were measured by PhotoVolt, Inc. after cleaning and etching the bare "PV4-14-x" cell. The performances were then measured after growing a relatively low growth rate SiOx coating such as in FIG. 5. The only post-growth treatment the cell received prior to testing was a DI water rinse and nitrogen drying.

TABLE 11

One Sun performance parameters of a bare and RTWCG Si-0-C-N coated VMJ Si concentrator cell (PV4-14-x). PhotoVolt, Inc. performed the initial etching and surface cleaning of the bare cell surfaces, as well as the performance parameter measurements.

|  | Etched and Cleaned | After SiOx Growth | Gain |
|---|---|---|---|
| Front Side | | | |
| Voc (V) | 8.786 | 9.883 | 12.5% |
| Isc (mA) | 0.17 | 0.34 | 100.0% |
| FF | 53.7% | 60.7% | 13.2% |
| Pmax (mW) | 0.779 | 2.022 | 159.6% |
| Back Side | | | |
| Voc (V) | 8.699 | 9.672 | 11.2% |
| Isc (mA) | 0.15 | 0.30 | 100.0% |
| FF | 51.4% | 59.3% | 15.5% |
| Pmax (mW) | 0.672 | 1.741 | 159.1% |

Note that the Voc and FF values for the VMJ cell significantly increased after the RTWCG SiOX coating.

These values, and especially the large increase in Isc, after coating, cannot be explained simply by a reduction in optical-type losses. They offer a clear indication that surface passivation plays an essential role in the Pmax which increased as much as three fold over the bare cell.

Example 10—Enhanced Efficiency n+/p or p+/n Crystalline RTWCG SiOx ARC/SE/(TO) Silicon Solar Cells Fabrication Technology During the junction formation of n+/p (P,B) cell structures, phosphorus not only diffuses into the desired front wafer surface but also the edge and rear side surfaces. In industrial practice, after removing the phosphorus silica glass (PSG) usually no attempt is made to remove the rear junction, and in some cases edge isolation is not performed. The firing of the rear Al contact mitigates this art effect, but often with only limited success that may result in a weak back surface field and low red response.

Based on our experimental data, RTWCG solution formulations can remove the PSG while forming a SiOx passivation film in one single step. This can be utilized for various electronics/microelectronics applications since the SiOx growth only starts when the solution comes into contact with a clean silicon surface. For solar cell applications, this would be utilized on the rear of the cell since the front side requires the front grid to act as a mask for the formation of the selective emitter.

In a standard n+/p RTWCG SiOx ARC/SE/(TO) crystalline silicon solar cells fabrication technology, discussed herein, the PSG is removed and standard screen printed contacts are deposited and fired. Lastly, the RTWCG growth solution is applied to the bare cells to grow a thin SiOx film on all non-metalized surfaces while at the same time etching back a certain thickness of the diffused layer from those surfaces. A quality ARC and SE are thus created on the front of the cell, and some of the junction from the edges is removed. Unfortunately, the n+ diffused layer from below the Al back contact remains intact, potentially causing a weak back surface field and a high degree of recombination.

In one embodiment according to one or more embodiments, after the PSG is removed, the rear side is floated onto RTWCG solution or the solution is delivered exclusively to the rear side through any other appropriate method. Regardless of the delivery system, the RTWCG solution must not react with the front side since the formation of a good quality SE depends on the presence of the front grid lines which act as a mask. The RTWCG solution thus reacts with the rear side and wafer edges and removes most of the n+ junction from these surfaces while growing a passivation SiOx thin film layer on said surfaces. After the front and back contacts are deposited and fired, the front of the cells are floated onto the RTWCG solution, or the RTWCG solution is applied to the front of the cell through any other method, to create the SiOx ARC and SE, with further diminution of any junction still present on the edges of the cell. The rear metallization sintering time and temperature must be chosen so that the entire Al film area penetrates through the back side SiOx passivation layer to produce a good Ohmic back contact and a strong back surface field.

It is known in the art that a single step HF based solution alone does not completely remove the PSG. Cell manufacturers may use a two or three step wet chemical sequence in order to achieve a clean silicon surface. For the standard RTWCG SiOx based silicon solar cell fabrication discussed above, the fact that some PSG remains on the front surface is not a critical problem since the surface is in situ cleaned by the RTWCG solution concomitantly with the SiOx ARC passivation layer and SE formation. However, the back side of the cell requires a PSG-free surface under the Al metallization, and preferably a thin film RTWCG SiOx layer containing a p-type dopant, for back surface passivation, which could form a thin p+ layer during contact sintering.

In a preferred embodiment according to one or more embodiments, a slightly modified RTWCG formulation can be used to produce a boron containing SiOx:B passivating film on the rear of the cell. An embodiment according to one or more embodiments utilizes 1 to 5 volumetric parts of a Boron-saturated aqueous solution added to 5 to 10 volumetric parts of fast RTWCG formulations discussed herein. The boron source may include but is not limited to ACS or better purity $H_3BO_4$, $B_2O_3$, and $BI_3$. In a preferred example of realization 0.5 g-2 g of either $B_2O_3$ or $BI_3$ are dissolved directly into 1 L of any of the fast growth solutions in Example 1.

Example 10-1

In one example of realization, small dots of boron-containing metallization is created on the rear surface. The fast growth RTWCG SiOx:B solution is then applied to grow on the rear surface a boron-containing SiOx:B passivation thin film. Concomitant to the thin film growth, the RTWCG SiOx:B solution removes any remaining PSG as well as most of the n+ junction from the rear surface and the wafer's edges. The front grid lines are next deposited and are sintered along with the back surface dots at a high temperature (800° C.-920° C.) which creates good Ohmic contact with the underlying surfaces and the formation of a shallow p+ junction on the rear non-metalized surface. Next, the cells are floated front side down onto a fast RTWCG solution, such as in Example 1. This creates on the non-metalized portions of the front side of the cell the AR coating SiOx passivation film and good quality SE. Lastly, an Al back contact is created over the entire rear side, as well as the Ag-based buss bars and sintered at a low temperature of around 400° C.

Example 10-2

In a second example of realization, after a standard PSG removal, the RTWCG SiOx:B passivation layer is grown using solution formulations as per above. In this single step the solution concomitantly cleans any remaining PSG, etches back the n+ diffusion layer from the whole back surface and edges and grows the SiOx:B passivation layer. Me:B dots are then deposited on the rear and Ag-based grid lines on the front. Next the cell undergoes high temperature sintering (800° C.-920° C.) to create Ohmic contacts while creating a shallow p+ layer on the rear surface of the cell covered by the SiOx:B thin film. Next, the RTWCG SiOx ARC/SE passivation layer is created on the front of the cell which further contributes to edge isolation. Finally, the whole rear side is screen printed with Al, the bus bars are deposited, and sintered at a low (~400° C.) temperature.

It will be understood by anyone skillful in the solar cell fabrication art that the above description of the enhanced efficiency n+/p RTWCG SiOx ARC/SE/(TO) crystalline silicon solar cell structures, can be applied with the adequate modification of the back contact structure and the use of any n-doped SiOx film, i.e. SiOx:P for fabricating enhanced efficiency p+/n RTWCG SiOx ARC/SE/(TO) crystalline silicon solar cell structures. The enhanced efficiency of both the above n+/p or p+/n RTWCG SiOx ARC/SE/(TO) crystalline silicon solar cell structures are due to the use of the RTWCG process to remove the diffused layer from, passivate the solar cell front and back surface, producing a strong front surface field, and enhancing the strength of the back surface field, while at the same time producing a good edge isolation.

Example 11—Emitter and Rear Passivated n+pp+ or p+nn+ c-Si, mc-Si, or Poly-Si RTWCG SiOx ARC/SE/TO Bifacial Solar Cells The RTWCG SiOx ARC/SE/(TO) process can in principle be applied to most state of the art high efficiency solar cell designs that frequently use expensive high lifetime float zone (FZ) c-Si substrates. However, the inherently economical efficiency enhancement features of the RTWCG SiOx ARC/SE/(TO) technology can create relatively high efficiency crystalline bifacial silicon solar cells on less expensive solar grade Czochralski (Cz) c-Si substrates, lower grade mc-Si substrates, or ribbon poly-Si substrates.

The cross sectional view in FIG. 2 is a good example of realization for high efficiency, low-cost, RTWCG bifacial solar cells. The simple, highly efficient, and low cost bifacial n+pp+ or p+nn+ c-Si or mc-Si RTWCG SiOx ARC/SE/(TO) solar cell fabrication technology steps comprise of:
i. any diluted etchants sequence, such as the MoPiranha and MoRCA described herein, that preserves the smooth wafer surface while removing the surface saw damage from the lightly doped starting p-type or n-type c-Si or mc-Si wafers;
ii. using diluted liquid diffusion sources, and procedures that protect the edges against n++ and p++ diffusion, to produce either n++pp++ or p++nn++ diffused structures, preferably in a belt furnace, by forming n++ and p++ heavy doped layers simultaneously on both sides of the wafer;
iii. diffusion glass removal with a diluted HF(aq) etch solution;
iv. screen printing the front and back grid lines using state of the art screen printing pastes;
v. co-firing the front and back metallization in a belt furnace at temperatures and times which are known in the art to produce low contact resistance;
vi. simultaneously growing the RTWCG SiOx film on both sides of the diffused wafer, which creates a low reflectance ARC while etching back a certain thickness of the non-metalized portions of the n++ and p++ heavily diffused layers and etches away the unwanted diffused layer present on the wafer's edges thus eliminating the need for a conventional edge isolation process step;
vii. SiOx surface texturing that is either created as the byproduct of a fast SiOx growth solution in step vi, or is created in a separate step that utilizes a diluted $HF_{(aq)}$ solution.

Using the RTWCG SiOx ARC/SE/TO n++pp++ or p++nn++ bifacial solar cells design, large absolute power gains can be achieved at a cost that is comparable to conventional mono-facial solar cell designs. This is so since:
i. the higher diffusion temperature and shorter diffusion time produce strong front and back surface fields;
ii. the smooth front surface with a lapped back surface in principle produces an ideality factor that is closer to unity than for cell designs which use textured emitter surfaces;
iii. the surface concentration under the metallization is high enough to assure a low contact resistance;
iv. the deeper emitter prevents the metallization from short-circuiting the junction during the firing step;
v. the smooth emitter surface with a textured SiOx ARC cell design minimizes grid shading loses by allowing the grid lines to be spaced farther apart since the large lateral resistive power losses, created by the textured emitter surfaces of conventional cell designs, are absent;
vi. the lightly doped front and back non-metalized surfaces, and good surface passivation, minimize recombination losses;
vii. the RTWCG SiOx/ARC/TO films can lower the AM 1.5 AWR from 35% to as low as 3%;
viii. the visible spectra absorption in the SiOx films is noticeably smaller than in conventional ARC's, especially when compared to that of low transparency double or triple layer ARC designs.

As is well known in the art, a good passivation of p+Si surfaces is one of the central issues to be dealt with for p+/n Si solar cells using a boron diffused emitter, and n++pp++ or p++nn++ bifacial solar cells designs. This is so because several passivation experiments have shown that SiNx thin passivating layers not only do not passivate the p+ silicon surfaces as well as the n+ silicon surfaces, but on highly p-doped silicon surfaces SiNx even shows a slight depassivating behavior. RTWCG SiOx on the other hand has shown good passivation properties on both p+ and n+ silicon surfaces.

Example 12—Emitter and Rear RTWCG SiOx Passivated and Localized Back Surface Metallization n+pp+ or p+nn+c-Si, mc-Si or Poly-Si RTWCG SiOx ARC/SE/TO Solar Cells The so called passivated emitter with rear locally (PERL) diffused cell design is well known in the art. It has produced cells with record high efficiency approaching 25% under the standard AM 1.5 spectrum. To passivate the emitter of these high efficiency PERL cells, a thin film of thermal $SiO_2$ is used to lower the carrier recombination at the surface. The rear surface of the cell is locally diffused only at the metal contacts to minimize recombination at the rear while maintaining good electrical contact.

The use of a diffused back surface to enhance the back surface field (BSF) is well known in the art. As a standard procedure, n+pp+ diffused structures have been using phosphorus doping to form the n+ emitter layer and boron doping to form the BSF. This approach offers advantages over conventional n+/p cell structures by producing potentially higher efficiency cells on thinner wafers with less bow.

Figure 36:
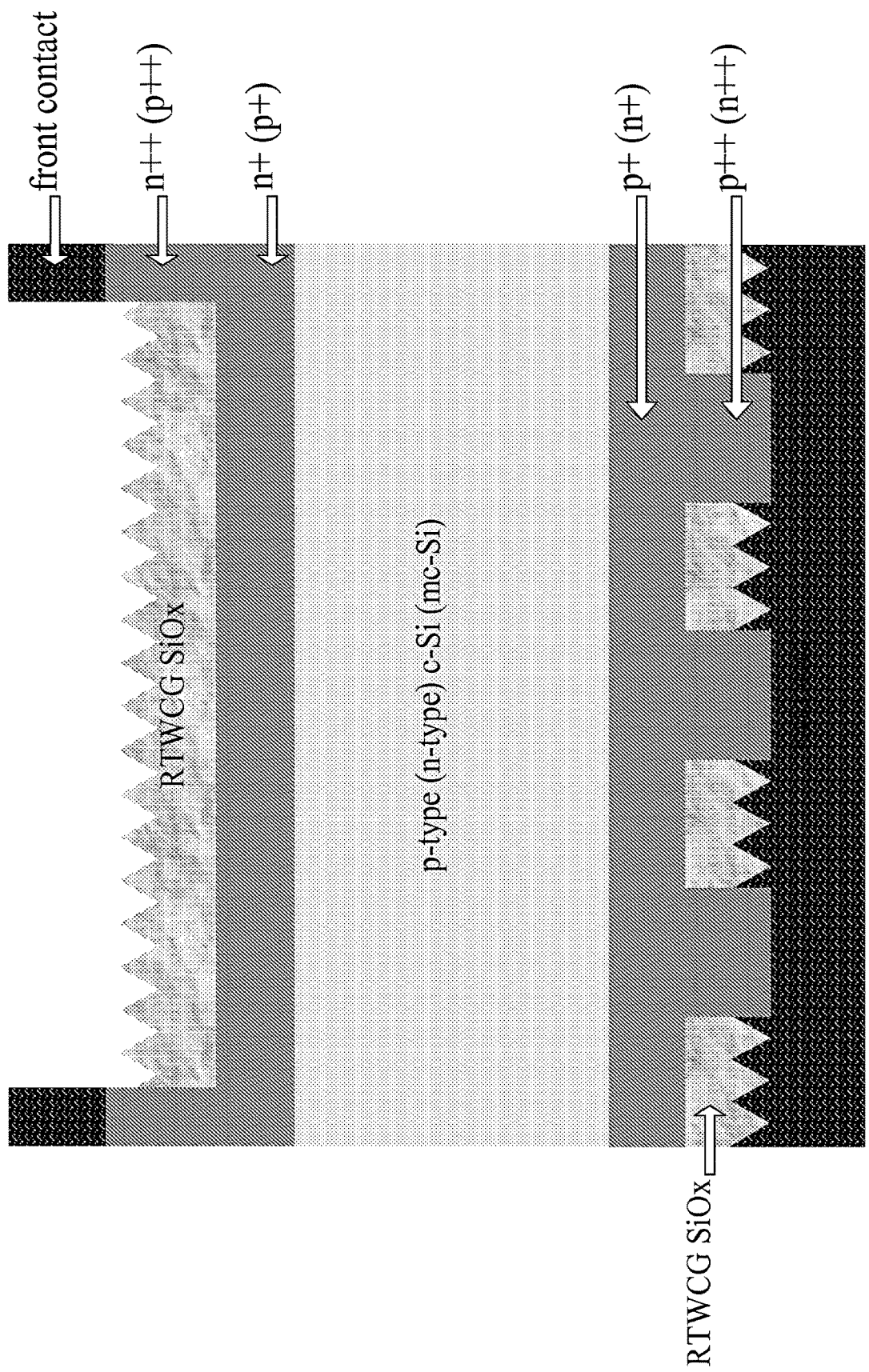
FIG. 36. A cross-sectional view of a RT\VCG SiOx ARC/SE/TO n++pp++ or p++nn++ front and back side passivation and localized back contact c-Si, me-Si, or poly-Si solar cells design.

The RTWCG SiOx ARC/SE/TO technology can create emitter and rear SiOx passivated n+pp+ or p+nn+ c-Si or mc-Si solar cell structures such as in FIG. 36. By using deep junction kink-and-tail diffusion profiles and standard screenprinted and alloyed contact metallization it produces efficiency enhancement features that include: (i) low reflectance and absorption in the useful AM 1.5 light spectra, (ii) front and back surface passivation, and (iii) strong front and back surface fields.

Within the scope according to one or more embodiments is a method for minimizing recombination on the back of the cell while creating a good back contact. In this scheme, SiOx is used to isolate the back layer from metallization everywhere except for where small dots of SiOx-free back layer are present. These dots of heavily doped p+(n+) diffused back layer will have a surface dopant concentration around two orders of magnitude higher than that of the SiOx-covered back layer.

Figure 35:
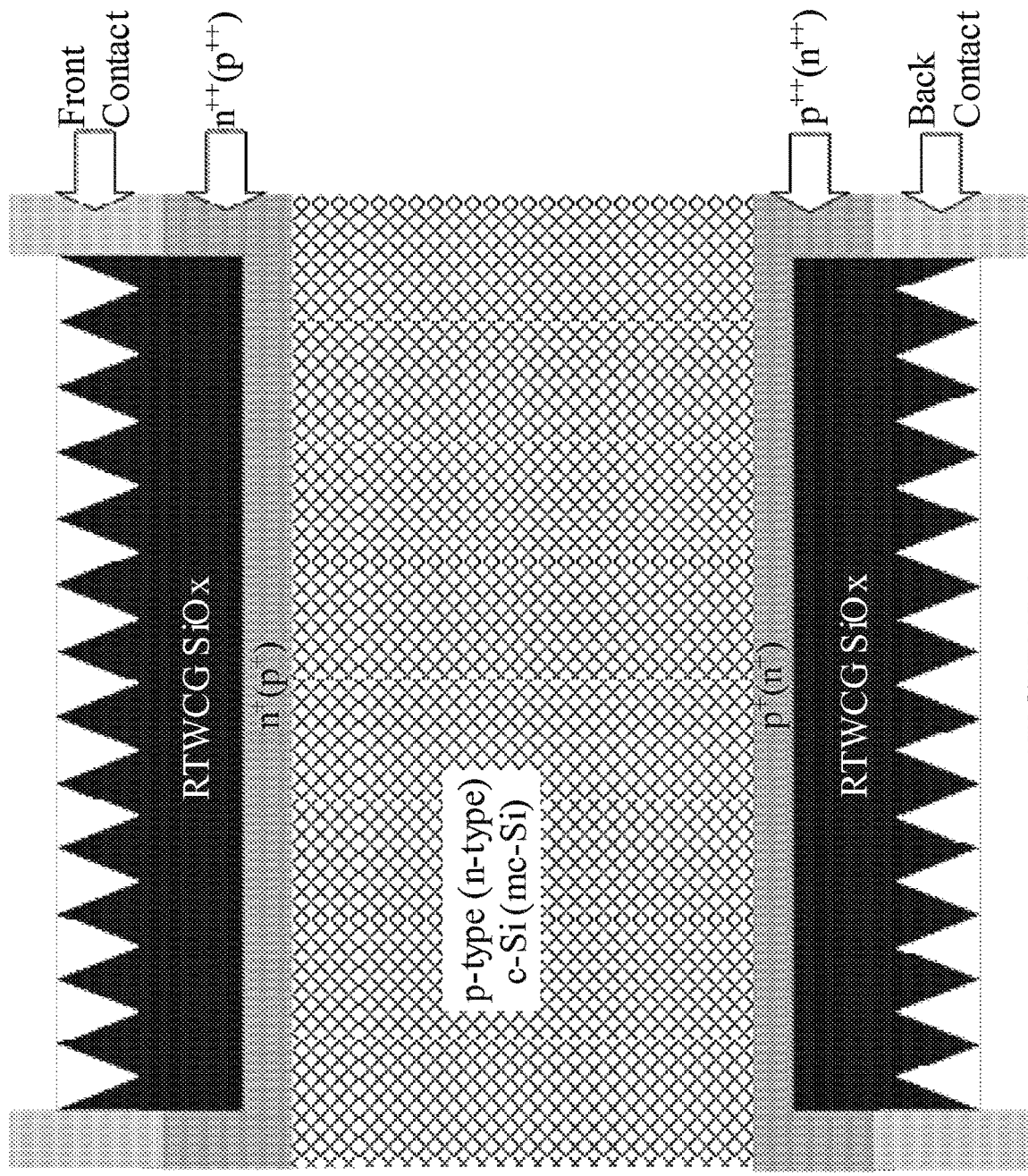
FIG. 35. A cross section view of a RTWCG SiOx ARC/SE/TO n++pp++ or p++nn++ bifacial c-Si, mc-Si, or poly-Si solar cells design.

In order to produce the cell structures in FIG. 35, the front grid lines must be screen printed on the n+(or p+) diffused layers of Example 11. Next, a photolithography step can be used to define small dotted areas on the back surface. A RTWCG SiOx thin film can then be grown simultaneously on the front non-metalized surface and the photoresist-free back surfaces. During the SiOx growth, a certain thickness is etched back from the emitter's non-metalized front surface, and from the back photoresist-free surface. After removing the photoresist from the back surface, screen printing will create the back contact which will only directly contact the heavily doped areas, formerly masked by photoresist. The remaining back silicon surface will have a lower doping concentration, good passivation, and will be insulated from the metallization by a layer of SiOx film.

Alternatively, the front grid lines are created and on the back surface small dots of rear metallization are screen printed. After co-firing the front and back metallization, the RTWCG SiOx film is grown simultaneously on the front and back non-metalized surfaces. Lastly, a whole area rear metallization is screen printed over the SiOx oxide and previously screen printed dots and fired at a low, <500° C., temperature. Since the metallization is not covered by the SiOx film, the whole area back contact metallization makes good Ohmic contact with the previously metalized dots which sit on top of the heavily diffused p++(n++) Si surface. The rest of the Si surface is separated from the whole area back contact metallization by the textured (TO) SiOx film that has good passivation.

As high efficiency crystalline silicon solar cells are fabricated on wafers which are progressively thinner the cells will be more transparent to the red portion of the spectrum, which lowers efficiency. Utilizing the textured back surface metallization, as described in FIG. 36, the path of the reflected light is longer which increases the cell's red response.

Example 13—Low Cost RTWCG SiOM Transparent Conducting Coatings for Low Cost Enhanced Efficiency a-Si Thin Film Solar Cells Transparent conductive oxides (TCO), are well known in the art, and play an essential role in a-Si and other thin film solar cells. Other applications include flat panel displays, and many other electronics (optoelectronics) applications. Conventional TCO films include $In_2O_3$:Sn (ITO), $SnO_2$:F (FTO), $SnO_2$:Sb (ATO), and conductive polymers. For low-cost, high-efficiency, a-Si solar cells and other electronics and optoelectronics applications, conventional TCO films are not fully compatible due to:
  i. relatively high deposition temperature;
  ii. relative low transparency;
  iii. relative high reflectance;
  iv. high defect density at the TCO/a-Si interface;
  v. a relative high contact resistance with the underlying a-Si layer;
  vi. relative high cost.

Various metallic nitrides that include but are not restricted to Bi, Ti, Co, and Cu based nitrides when used as components of the RTWCG solutions, as shown herein, create SiOx films with a higher Si—O-M content. Some of the Si—O-M films such as Si—O—Cu and Si—Bi were produced and measurements have shown them to be conductive. Preliminary results show that low cost, high growth rate, RTWCG SiOM films, where M is a metallic component including but not limited to Cu or Bi, could offer a good replacement alternative to state of the art TCO films for thin film solar cells, and various other applications.

The main advantages of the RTWCG SiOM over state of the art TCO films are:
  i. the room temperature process allows temperature sensitive substrates to be utilized;
  ii. SiOM's superior a-Si surface passivation stemming from an improved lattice match to the underlying a-Si layer;
  iii. SiOM TCO's are more transparent at over 95% transparency in the visible spectra;
  iv. the SiOM's graded index of refraction and better refractive index matching to the underlying a-Si layer results in a AM 1.5 AWR that is under 10%;
  v. the electrical conductivity of SiOM films can be tailored to specific applications as evidenced by several SiOCu and SiOBi SiOM films, grown in less than 1 minute on c-Si silicon substrates, whose resistivity was tailored from 1E-03 Ω-cm to 1E-01 Ω-cm;
  vi. light trapping is easily achieved since the RTWCG SiOM surface can be easily textured;
  vii. more stable to environmental factors such as UV radiation, temperature variation, and humidity;
  viii. SiOM TCO in-line production systems are simple and low cost.

The cross section of a preferred a-Si RTWCG SiOM TCO/ARC/SE cell structure uses a n/i/p standard design, except that:
  i. a sacrificial n+ front layer is preferred so as to minimize the silver or copper based front contact resistance of the preferred, plastic/screen printed front grid metallization/n+/n/i/p/Al/plastic, low cost a-Si cell;
  ii. whereas the n+ layer only makes contact with the said screen printed front grid, and is etched back from the portions of the non-metalized front cell surface to form a good quality SE;
  iii. along with the SE, the other inherent efficiency enhancement features are higher transparency, lower reflectance, increased collection efficiency, and a likely high fill factor increase that will markedly improve the efficiency of RTWCG SiOM a-Si thin film solar cells;
  iv. higher environmental stability as compared to standard, known in the art, a-Si cells from the same basic design class.

Example 14. RTWCG SiOX on GaAs Substrates

To a large degree, the research effort was focused on growing SiOx films on Si substrates and the characterization of the resulting films. However, the RTWCG process was also utilized to create various thin film dielectric coatings on non-Si substrates including GaAs, GaP, AlGaAs, and $CuInSe_2$ thin films.

Figure 37:
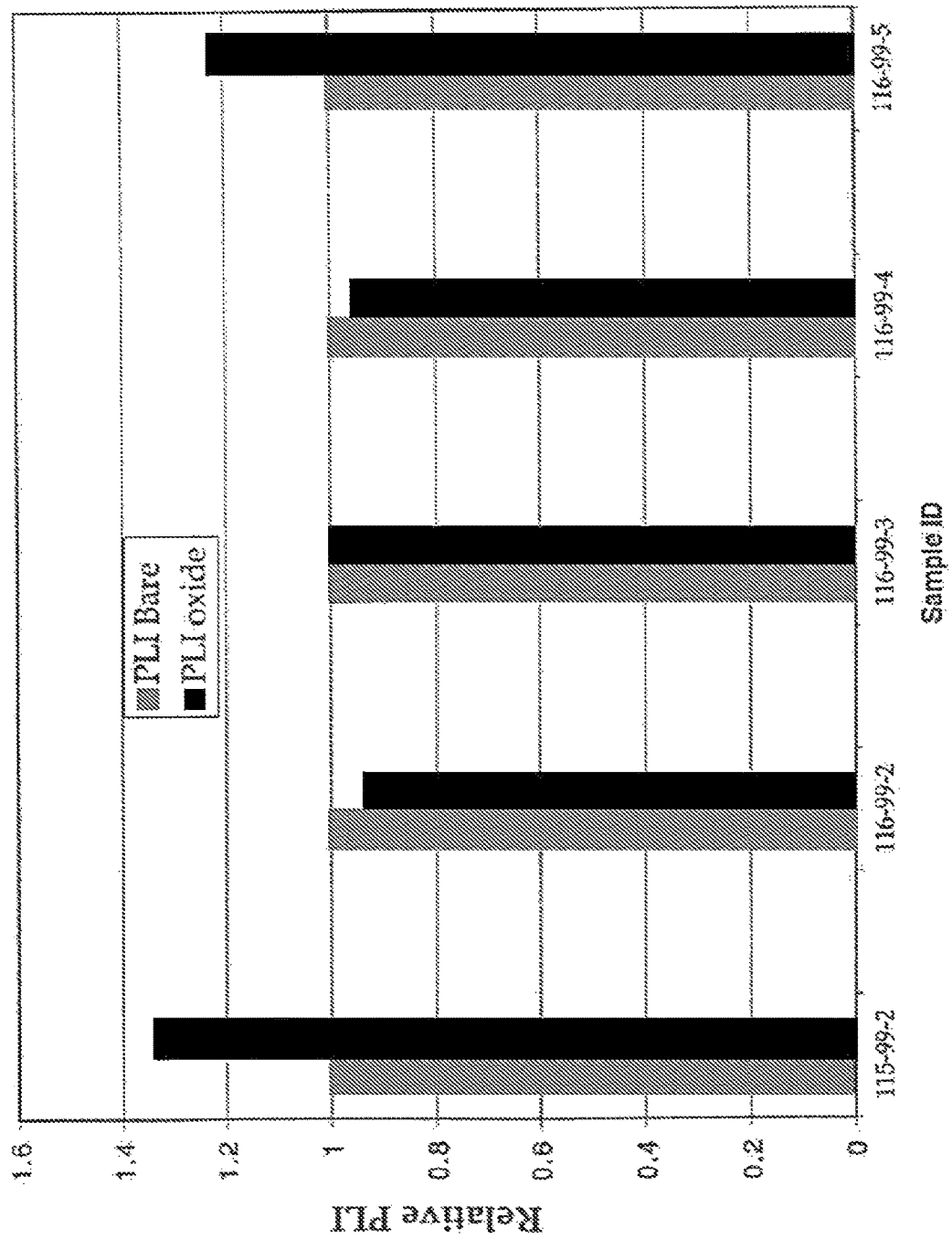
FIG. 37. Relative photoluminescence intensity data on several n-GaAs samples prior to and after RTWCG Ga—As—O.

For example, very uniform RTWCG coatings have been grown on n-type and p-type GaAs substrates in several chemical systems. In order to show the potential of these as-grown coatings on GaAs substrates, herein we present preliminary room temperature photoluminescence intensity (PLI) data acquired at NASA GRC on a number of several n-GaAs samples. The PLI data of the uncoated substrates were compared to the PLI data of the same substrates after RTWCG coatings were grown; the peak intensities of the PL spectra are shown in FIG. 37.

The coatings were grown in five different chemical systems, designed for the RTWCG SiOx thin films on silicon. For consistency, the growth time, which was between 2 and 4 minutes, was adjusted to grow similar, ~100 nm, oxide thicknesses on each of the five samples. The data for two of the coatings, 115-99-2 and 116-99-5, show that the PLI increases noticeably compared to the uncoated surfaces. This experimental data shows that the room temperature oxide can be grown without damaging the GaAs surface. The 115-99-2 and 116-99-5 coatings showed promising electronic surface passivation of the GaAs surface. The two coatings may be suitable for a host of applications including passivation/first layer ARC for space solar cells, as well as many other electronics and microelectronics applications such as gate oxide for integrated GaAs based CMOS devices.

As was mentioned above, the RTWCG of dielectric coatings on GaAs has not been as intensely studied as the RTWCG of SiOx films on silicon substrates has. Our preliminary work has mostly used outdated 2-inch GaAs substrates, and some small area GaAs solar cells. Additionally, the RTWCG chemical systems formulations for Ga—As—O based thin film dielectrics on GaAs (see FIG. 36), were the same ones used to grow RTWCG SiOx thin films on silicon substrates. More recently however, various GaAs-specific additives have been discovered including, but not limited to, various As and Ga precursors such as $As_2O_3$, $As_2O_5$, $AsCl_3$, and $Ga_2O_3$. These state of the art RTWCG-for-GaAs growth solutions increased the uniformity, growth rate, and the adherence of the resulting films. It is noteworthy that when As-based additives were used, not only did the growth rates of the As-rich Ga—As—O oxide increased to up to 120 nm/min, but the film's thermal stability increased significantly. No observable change in thickness occurred when the RTWCG oxide coated GaAs samples were heated to 500° C.

In a preferred embodiment according to one or more embodiments, for solar cell applications, a low cost growth solution is made of 2-5 g of $AsI_3$ dissolved in 10% $HF_{(aq)}$. Within one minute, a highly uniform film can be grown with good n+-GaAs passivation capability, as is suggested by the 42 mV increase in the Voc of a small area n+/p GaAs homojunction cell that also gave a Pmax increase of as much as 62.5% after the coating.

The following references are incorporated by reference in their entirety:

Sang M. Han and Eray S. Aydil "Reason for lower dielectric constant of fluorinated $SiO_2$ films" Journal of Applied Physics, Vol. 83, No 4, 15 Feb. 1998 pp. 2172-2178;

C. F. Yeh, S. S. Lin and T. Y. Hong, "Low-Temperature Processed MOSFET's with Liquid Phase Deposited $SiO_{2-x}F_x$ as Gate Insulator," IEEE Electron Device Letters, 16(7), 316 (1995)

Chien-Jung Huang, Quality Optimization of Liquid Phase Deposition $SiO_2$ Films on Silicon, Jpn. J. Appl. Phys. 41 (2002) pp. 4622-4625;

Faur et al, "Room Temperature Wet Chemical Growth Process of SiO-Based Oxides on Silicon," U.S. Pat. No. 6,080,683, July, 2000;

Faur et al, "Method of Making Thin Film Dielectrics Using a Process for Room Temperature Wet Chemical Growth of SiO Based Oxides on a Substrate," U.S. Pat. No. 6,593,077, Jul. 15, 2003;

Faur et al, "Low metallic Impurity SiO Thin Film Dielectrics on Semiconductor Substrates Using a Room Temperature Wet Chemical Growth Process, Method and Applications Thereof, U.S. Pat. No. 6,613,697, September 2003;

E. Y. Wang, F. T. S. Yu, V. L. Sims, E. W. Brandhorst and J. D. Broder, "Optimum Design of Anti-reflection coating for silicon solar cells", *Conference Record*, 10th IEEE Photovoltaic Specialists Conference, 1973, pp. 168-171;

Daniel N. Wright, Erik S. Marstein and Arve Holt, Double Layer Anti-Reflective Coatings for Silicon Solar Cells, 0-7803-8707-4/05/$20.00 ©2005 IEEE, pp 1237-1240;

D. Bauhaus, A. Moussi, A. Chikouche, J. M. Ruiz, "Design and simulation of antireflection coating systems for optoelectronic devices: Application to silicon solar cells", *Solar Energy Materials and Solar Cells*, 52, 1998, pp. 79-93;

M. Cid, N. Stem, C. Brunetti, A. F. Beloto, C. A. S. Ramos, "Improvements in anti-reflection coatings for high efficiency silicon solar cells", *Surface and Coatings Technology*, 106, 1998, pp. 117-120;

B. S. Richards, "Single-material $TiO_2$ double-layer antireflection coatings", *Solar Energy Materials & Solar Cells*, 79, 2003, pp. 369-390;

B. S. Richards, S. F. Rowlands, C. B. Honsberg, J. E. Cotter, $TiO_2$ DLAR coatings for planar silicon solar cells, Progress in Photovoltaics: Research and Applications Volume 11 Issue 1, Pages 27-32, Published Online: 16 Dec. 2002;

Shui-Yang Lien, Dong-Sing Wuu, Wen-Chang Yeh, and Jun-Chin Liu, Tri-layer antireflection coatings ($SiO_2$/$SiO_2$—$TiO_2$/$TiO_2$) for silicon solar cells using a sol-gel technique, Solar Energy Materials and Solar Cells, Volume 90, Issue 16, 16 Oct. 2006, Pages 2710-2719;

K. L. Jiao, W. A. Anderson, $SiO_2$/$TiO_2$ double-layer antireflective coating deposited at room temperature for metal/insulator In-Si I p-Si solar cells, Solar Cells 22, p. 229-236 (1987);

D. J. Aiken, High performance anti-reflection coatings for broadband multi-junction solar cells, Solar Energy Materials & Solar Cells 64, p. 393-404 (2000);

M. Kuo et al., Optics Letters 33(21), 2527 (2008);

M. LIPINSKI, S. KLUSKA, H. CZTERNASTEK, P. ZIBA, *Graded SiOxNy layers as antireflection coatings for solar cells application*, Materials Science-Poland, 24(4), p 1009-1016, 2006;

Mason, N. 2009, "High efficiency crystalline silicon PV cell manufacture: status and prospects", PVSAT-5, Glyndwr, Wales;

Mai, L. et al 2006, "New emitter design and metal contact for screen printed solar cell front surfaces", $4^{th}$ *IEEE World Conj. on Photovoltaic Energy Conversion*, Hawaii, USA;

Tjahjono, B. et al 2008, "High efficiency solar cell structures through the use of laser doping", 23rd *EUPVSEC*, Valencia, Spain;

Hirshman, W. 2008, "Banking on selective research", *Photon International*, Ed. 3, p. 91;

Book, F. et al 2008, "Two diffusion step selective emitter: comparison of mask opening by laser or etching paste", 23rd *EUPVSEC*, Valencia, Spain;

N. B. Mason, T. M. Bruton, and M. A. Balbuena, PV in Europe—Prom PV Technology to Energy Solutions, Rome, Italy (2002) 227;

W. P. Mulligan, D. H. Rose, M. J. Cudzinovic et al., Proceedings of the 19th European Photovoltaic Solar Energy Conference, *Paris, France* (2004) 387;

M. Tanaka, S. Okamoto, S. Tsuge et al., Proceedings of the 3rd World Conference on Photovoltaic Energy Conversion, Osaka, Japan (2003) 955;

U.S. Pat. Nos. 4,332,973 and 4,409,422 and 4,516,314;

Maria Faur, Mircea Faur, S. G. Bailey, D. J. Flood, D. J. Brinker, H. M. Faur, S. A. Alterovitz, D. R. Wheeler, and D. L. Boyd, "Room Temperature Wet Chemical Growth of Passivating/Antireflection Coatings for Si-Based Solar Cells," Proceedings at the 2nd World Conference and Exhibition on Photovoltaic Energy Conversion, 2000, Vienna, Austria, p. 1574;

B. L. Sater, "Recent Results on High Intensity Silicon VMJ Cell," Proc. at the American Solar Energy Conference, Minnesota, Jul. 15-20, 1995;

J. Libal et al., n-type multicrystalline silicon solar cells, BBr3 diffusion and passivation of p+ diffused silicon surfaces, 20th EU-PVSEC, Barcelona 2005, pp. 793-796.

Upon review of the description and embodiments of the present invention, those skilled in the art will understand that modifications and equivalent substitutions may be performed in carrying out the invention without departing from the essence of the invention. Thus, the invention is not meant to be limiting by the embodiments described explicitly above, and is limited only by the claims which follow.

What is claimed is:

1. A composition for growing an oxide layer on a substrate, the composition comprising: a fluoride source selected from HF; an inorganic oxidant containing iodine, or a combination of both iodine and silver, to promote an oxidation reaction at a surface of the substrate and thereby facilitate growing of the oxide layer on the substrate based at least in part on consumed substrate resulting from the etching of the substrate; and a non-invasive additive to control a balance between a first rate of the etching of the substrate and a second rate of the growing of the oxide layer, wherein the composition is substantially free of silicon, wherein the inorganic oxidant contains at least one iodine compound selected from $HIO_3$, $I_2O_4$, $I_2O_5$ and $I_2O_9$ at a concentration of between about 0.026 weight percent and about 0.19 weight percent, and wherein the pH of the composition is sufficient to wet etch a substrate and achieve oxide layer growth due to the presence of HF at a concentration of between 10 weight percent and 50 weight percent.

2. The composition of claim 1, wherein the composition is substantially free of organic components.

3. The composition of claim 1, wherein the inorganic oxidation system is selected from $HIO_3$.

4. The composition of claim 3, wherein the non-invasive additive is HCl.

5. The composition of claim 1, wherein the non-invasive additive is selected from $NH_4F$, HF, HCl, $H_2O$, $HNO_3$ and $H_2O_2$.

6. The composition of claim 1, wherein the non-invasive additive is HCl.

7. The composition of claim 1, further comprising water.

8. The composition of claim 1, further comprising an acid.

9. The composition of claim 8, wherein the acid is selected from $H_2SiF_6$, HCl, HF, $HNO_3$, and $H_2SO_4$.

10. A composition for room temperature wet chemical growth of an oxide-based layer on a substrate, the composition consisting essentially of HF, HCl, and an iodine-containing inorganic oxidation system and water, wherein the composition is substantially free of silicon and the iodine-containing inorganic oxidation system is selected from $HIO_3$, $I_2O_4$, $I_2O_5$ and $I_2O_9$ at a concentration of between about 0.026 weight percent and about 0.19 weight percent, and wherein the pH of the composition is sufficient to wet etch a substrate and achieve oxide layer growth due to the presence of HF at a concentration of between 10 weight percent and 50 weight percent.

11. The composition of claim 10, wherein the composition is substantially free of organic components.

12. The composition of claim 10, wherein the inorganic oxidation system is selected from $HIO_3$.

13. The composition of claim 10, wherein the substrate comprises one or more of silicon, germanium, and gallium arsenide, and wherein the HF facilitates etching of the one or more of silicon, germanium, and gallium arsenide.

14. The composition of claim 10, wherein the substrate comprises single crystal silicon or polycrystalline silicon, and wherein the HF facilitates etching of the single crystal silicon or the polycrystalline silicon.

15. A composition to facilitate fabrication of a solar cell on a substrate by substantially simultaneously accomplishing (i) wet chemical etching of the substrate and (ii) growing, at substantially room temperature, an oxide layer on the substrate, the oxide layer forming at least one of an antireflective coating for the solar cell, a layer in an anti-reflective coating stack for the solar cell, a passivation layer for the solar cell, and a mask for the fabrication of the solar cell, the oxide layer having:

a formulation $Si_xO_yX_z$, wherein X, when present, is selected from at least one of fluorine (F), carbon (C), hydrogen (H), iodine (I), vanadium (V), cobalt (Co), lead (Pb), silver (Ag) and nitrogen (N); and a thickness of less than or equal to 500 nanometers, the composition comprising:

a fluoride source selected from HF at a concentration of between 10 weight percent and 50 weight percent to facilitate the etching of the substrate;

an inorganic oxidant containing iodine, or a combination of both iodine and silver, to promote an oxidation reaction at a surface of the substrate and thereby facilitate the growing of the oxide layer on the substrate based at least in part on consumed substrate resulting from the etching of the substrate; and a non-invasive inorganic additive to control a balance between a first rate of the etching of the substrate and a second rate of the growing of the oxide layer, wherein the composition is substantially free of silicon, and wherein the inorganic oxidant contains at least one iodine compound selected from $HIO_3$, $I_2O_4$, $I_2O_5$ and $I_2O_9$ at a concentration of between about 0.026 weight percent and about 0.19 weight percent.

16. The composition of claim 15, wherein:

the substrate includes a diffused region constituting an emitter of the solar cell;

the composition facilitates fabrication by substantially simultaneously accomplishing (i) wet chemical etching of the diffused region of the substrate constituting the emitter of the solar cell and (ii) growing, at substantially room temperature, the oxide layer on the diffused region;

the fluoride source facilitates the etching of the diffused region of the substrate constituting the emitter of the solar cell;

the inorganic oxidant promotes the oxidation reaction at the surface of the diffused region and thereby facilitates growth of the oxide layer on the diffused region based at least in part on the consumed substrate resulting from the etching of the diffused region; and the non-invasive inorganic additive controls the balance between the first rate of the etching of the diffused region and the second rate of the growing of the oxide layer.

17. A composition for growing an oxide layer on a substrate, the composition comprising: a fluoride source; an inorganic oxidant, containing at least one source of iodine, or at least one source of iodine in combination with at least one source of silver, to promote an oxidation reaction at a surface of the substrate and thereby facilitate growing of the oxide layer on the substrate based at least in part on consumed substrate resulting from the etching of the substrate; and a non-invasive additive to control a balance between a first rate of the etching of the substrate and a second rate of the growing of the oxide layer, wherein the composition is substantially free of silicon, wherein the inorganic oxidant contains at least one source of iodine selected from $HIO_3$, $I_2O_4$, $I_2O_5$ and $I_2O_9$ at a concentration of between about 0.026 weight percent and about 0.19 weight percent, and wherein the pH of the composition is sufficient to wet etch a substrate and achieve oxide layer growth due to the presence of HF at a concentration of between 10 weight percent and 50 weight percent.

* * * * *